US008786181B2

(12) United States Patent
Eberle et al.

(10) Patent No.: US 8,786,181 B2
(45) Date of Patent: Jul. 22, 2014

(54) MATERIALS FOR ORGANIC ELECTROLUMINESCENT DEVICES

(75) Inventors: Thomas Eberle, Landau (DE); Rémi Manouk Anémian, Seoul (KR); Manuel Thesen, Berlin (DE); Hartmut Krueger, Berlin (DE); Armin Wedel, Teltow (DE); Beatrice Salert, St. Augustin (DE); Stefanie Kreissl, Milower Land OT Jerche (DE)

(73) Assignees: Merck Patent GmbH (DE); Fraunhofer-Gesellschaft Forschung E.V. (DE)

(*) Notice: Subject to any disclaimer, the term of this patent is extended or adjusted under 35 U.S.C. 154(b) by 0 days.

(21) Appl. No.: 13/879,081

(22) PCT Filed: Oct. 14, 2011

(86) PCT No.: PCT/EP2011/005179
§ 371 (c)(1),
(2), (4) Date: Apr. 12, 2013

(87) PCT Pub. No.: WO2012/048900
PCT Pub. Date: Apr. 19, 2012

(65) Prior Publication Data
US 2013/0207095 A1    Aug. 15, 2013

(30) Foreign Application Priority Data

Oct. 14, 2010  (DE) .................. 10 2010 048 498

(51) Int. Cl.
*H01J 1/63* (2006.01)
*H01L 51/56* (2006.01)
(52) U.S. Cl.
USPC ........... 313/504; 313/483; 313/506; 313/509; 252/301.16; 252/301.35; 252/500; 252/519.21; 257/40; 257/791; 257/792; 257/E27.119; 257/E51.026; 257/E51.027; 257/E51.044; 430/58.7; 430/58.75; 430/58.85; 549/43; 549/265; 549/330

(58) Field of Classification Search
USPC ............ 313/483, 504, 506, 509; 252/301.16, 252/301.35, 500, 519.21; 257/40, 791, 792, 257/E27.119, E51.026, E51.027, E51.044; 430/58.7, 58.75, 58.85; 549/43, 265, 549/330
See application file for complete search history.

(56) References Cited

U.S. PATENT DOCUMENTS

| 2007/0176147 | A1  | 8/2007  | Buesing et al. |
| 2010/0171418 | A1* | 7/2010  | Kinoshita et al. ............ 313/504 |
| 2011/0127516 | A1* | 6/2011  | Nakatani et al. ............ 257/40 |
| 2012/0025698 | A1* | 2/2012  | Thompson et al. .......... 313/504 |
| 2012/0085994 | A1* | 4/2012  | Pillow et al. ................ 257/40 |
| 2012/0248423 | A1* | 10/2012 | Nakatani et al. ............ 257/40 |
| 2013/0228767 | A1* | 9/2013  | Ludemann et al. .......... 257/40 |

OTHER PUBLICATIONS

International Search Report for PCT/EP2011/005179 mailed Nov. 29, 2011.
Gong, Xiong, et al., "Electrophosphorescence from a Polymer Guest-Host System with an Iridium Complex as Guest: Förster Energy Transfer", Adv. Funct. Mater., vol. 13, No. 6, (2003), pp. 439-444.
Gong, Xiong, et al., "High-Efficiency Polymer-Based Electrophosphorescent Devices", Adv. Mater., vol. 14, No. 8, (2002), p. 581-585.
Oh, Se Young, et al., "Characteristics of Polymer Light Emitting Diode Using a Phosphorescent Terpolymer Containing Perylene, Triazine and Ir(ppy)₃ Moieties in the Polymer Side Chain", Mol. Cryst. Liq. Cryst., vol. 458, (2006), pp. 227-235.
Behl, Marc. et al., "Block Copolymers Build-Up of Electron and Hole Transport Materials", Macromol. Chem. Phys., vol. 205, (2004), pp. 1633-1643.

* cited by examiner

*Primary Examiner* — Dao H Nguyen
(74) *Attorney, Agent, or Firm* — Drinker Biddle & Reath LLP

(57) ABSTRACT

The present invention relates to a blend comprising; a) at least one polymer or copolymer or a mixture of a plurality of polymers and/or copolymers which contain a main chain and a side chain, where at least one side chain contains a structural unit of the following formula (I), the symbols and indices used here are as defined below; b) at least one host molecule which has electron- or hole-transporting functionality, and c) at least one emitter molecule.

28 Claims, No Drawings

MATERIALS FOR ORGANIC ELECTROLUMINESCENT DEVICES

CROSS-REFERENCE TO RELATED APPLICATIONS

This application is a national stage application (under 35 U.S.C. §371) of PCT/EP2011/005179, filed Oct. 14, 2011, which claims benefit of German application 10 2010 048 498.9, filed Oct. 14, 2010 which are both incorporated by reference.

The present invention relates to a blend comprising
a) at least one polymer or copolymer or a mixture of a plurality of polymers and/or copolymers which contain a main chain and a side chain, where at least one side chain contains a structural unit of the following formula (I)

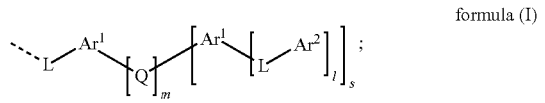

formula (I)

the symbols and indices used here are as defined below;
b) at least one host molecule which has electron- or hole-transporting functionality, and
c) at least one emitter molecule.

The invention is furthermore directed to formulations comprising the above-mentioned blends, uses thereof, polymerisable compounds from which the polymers or copolymers of the blend according to the invention can be prepared, and electronic devices or components, in particular organic electroluminescent devices, which comprise the blend according to the invention.

The structure of organic electroluminescent devices (OLEDs) in which organic semiconductors are employed as functional materials is described, for example, in U.S. Pat. No. 4,539,507, U.S. Pat. No. 5,151,629, EP 0 676 461 and WO 98/27136. A development in the area of organic electroluminescent devices are phosphorescent OLEDs. These have significant advantages owing to the higher achievable efficiency compared with fluorescent OLEDs.

However, there is still a need for improvement in the case of phosphorescent OLEDs. This applies, in particular, to the efficiency and the lifetime of the device.

In accordance with the prior art, electron-conducting materials, inter alia ketones (for example in accordance with WO 04/093207) or triazine derivatives (for example in accordance with the unpublished application DE 100 2008 036 982), are used as matrix materials for phosphorescent emitters. In particular with ketones, low operating voltages and long lifetimes are achieved, which makes this class of compound a very interesting matrix material. However, there is still a need for improvement, in particular with respect to the efficiency and the lifetime of the device, in the case of the use of these matrix materials, as in the case of other matrix materials.

The prior art furthermore discloses organic electroluminescent devices which comprise a phosphorescent emitter doped into a mixture of two matrix materials.

US 2007/0252516 discloses phosphorescent organic electroluminescent devices which comprise a mixture of a hole-conducting matrix material and an electron-conducting matrix material. Improved efficiency is disclosed for these OLEDs. No effect on the lifetime is evident.

US 2007/0099026 discloses white-emitting organic electroluminescent devices, where the green- or red-emitting layer comprises a phosphorescent emitter and a mixture of a hole-conducting matrix material and an electron-conducting matrix material. Hole-conducting materials indicated are, inter alia, triarylamine and carbazole derivatives. Electron-conducting materials indicated are, inter alia, aluminium and zinc compounds, oxadiazole compounds and triazine or triazole compounds. Further improvements are also still desirable for these OLEDs.

WO 2008/086851 A1 discloses carbazole compounds and the use thereof in organic electroluminescent devices, in particular as matrix material in phosphorescent devices, where ketone compounds may likewise be present.

WO 2005/040302 A1 discloses organic semiconductors comprising a polymer, compounds containing L=X structural units and triplet emitter compounds. The compounds mentioned therein have good solubility and are readily accessible synthetically.

Nevertheless, there continues to be a need for improvement with respect to solubility for solution-processable systems and with respect to lifetime and efficiency.

The technical object on which the invention is based was therefore the provision of a mixture which can be processed simply from solution and results in a very long lifetime and good efficiency in an organic electroluminescent device.

The object is achieved in accordance with the invention by a blend comprising
a) at least one polymer or copolymer or a mixture of a plurality of polymers and/or copolymers, where the at least one polymer or copolymer contains at least one structural unit of the following formula (I) in the side chains

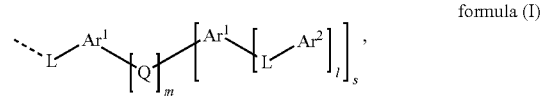

formula (I)

where the dashed line represents the connection to the polymer or copolymer backbone, and the other symbols and indices used have the following meanings:

L is on each occurrence, identically or differently, a single covalent bond or a straight-chain alkylene group having 1 to 20 C atoms or a branched or cyclic alkylene group having 3 to 20 C atoms, each of which may be substituted by one or more radicals $R^1$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, $SO$, $SO_2$, $NR^2$, $O$, $S$ or $CONR^2$ and where one or more H atoms may be replaced by F, Cl, Br, I, CN or $NO_2$, preferably a single covalent bond;

$Ar^1$ is on each occurrence, identically or differently, a divalent, mono- or polycyclic, aromatic or heteroaromatic ring system having 5 to 60 aromatic ring atoms, which may be substituted by one or more radicals $R^1$;

$Ar^2$ is on each occurrence, identically or differently, a mono- or polycyclic, aromatic or heteroaromatic ring system having 5 to 60 aromatic ring atoms, which may be substituted by one or more radicals $R^1$;

Q is a unit selected from the group consisting of a group —X(=A)-, where A=O, S, Se or Te, and mono- or polycyclic aromatic ring systems having 6 to 60 aromatic carbon atoms or mono- or polycyclic heteroaromatic ring systems having 2 to 50 aromatic carbon atoms;

m is 0, 1, 2 or 3, preferably 0 or 1;

l is 0, 1, 2 or 3;

s is 1 in the case of Q=—X(=A)-; is 1 to 5, preferably 1 to 3, in the case where Q is selected from the group consisting of mono- or polycyclic aromatic ring systems having 6 to 60 aromatic carbon atoms or mono- or polycyclic heteroaromatic ring systems having 2 to 50 aromatic carbon atoms; and is 1 or 2 in the case m=0;

$R^1$ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, —$CR^2$=$CR^2$ ($Ar^3$), a mono- or polycyclic, aromatic or heteroaromatic ring system having 5 to 60 aromatic ring atoms, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C$=$CR^2$, C≡C, $Si(R^2)_2$, $Ge(R^2)_2$, $Sn(R^2)_2$, C=O, C=S, C=Se, C=$NR^2$, $P(=O)(R^2)$, SO, $SO_2$, $NR^2$, O, S or $CONR^2$ and where one or more H atoms may be replaced by F, Cl, Br, I, CN or $NO_2$, or a combination of these systems; where two or more adjacent substituents $R^1$ may also be linked to one another via a single covalent bond or a divalent group Z;

X is selected from the group consisting of C, $P(Ar^4)$, S and SO, preferably C or P(Ph);

$R^2$ is on each occurrence, identically or differently, a straight-chain alkyl group having 1 to 20 C atoms or a branched or cyclic alkyl group having 3 to 20 C atoms, where one or more non-adjacent $CH_2$ groups may be replaced by NH, O or S and where one or more H atoms may be replaced by F, or a mono- or polycylic, aromatic or heteroaromatic ring system having 5 to 20 aromatic ring atoms, which may in each case be substituted by one or more radicals $R^3$; where two or more substituents $R^2$ may also be linked to one another via a single covalent bond or a divalent group Z;

$R^3$ is on each occurrence, identically or differently, a straight-chain alkyl group having 1 to 20 C atoms or a branched or cyclic alkyl group having 3 to 20 C atoms, where one or more non-adjacent $CH_2$ groups may be replaced by NH, O or S and where one or more H atoms may be replaced by F; where two or more substituents $R^3$ may also be linked to one another via a single covalent bond or a divalent group Z;

$Ar^3$ and $Ar^4$ are on each occurrence, identically or differently, a mono- or polycyclic, aromatic or heteroaromatic ring system having 5 to 60 aromatic ring atoms, which may be substituted by one or more radicals $R^3$;

Z represents a divalent group —$(CR^4_2)_q$—;

q is equal to 1, 2, 3, 4 or 5;

$R^4$ is on each occurrence, identically or differently, a straight-chain alkyl group having 1 to 20 C atoms or a branched or cyclic alkyl group having 3 to 20 C atoms, where one or more non-adjacent $CH_2$ groups may be replaced by NH, O or S and where one or more H atoms may be replaced by F.

b) at least one host molecule which has electron- or hole-transporting functionality, and c) at least one emitter molecule.

An aromatic ring system in the sense of this invention contains 6 to 60 C atoms in the ring system. A heteroaromatic ring system in the sense of this invention contains 1 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, an $sp^3$-hybridised C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group.

An aromatic or heteroaromatic ring system having 5-60 aromatic ring atoms, which may also in each case be substituted by the above-mentioned radicals R and which may be linked to the aromatic or heteroaromatic ring system via any desired positions, are taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In the case where L represents a single covalent bond, the radicals $Ar^1$ and $Ar^2$ in the formula I are, for example, connected directly to one another. Alternatively or in addition, in the case where L represents a single covalent bond, the radical $Ar^1$ in the formula I may also be bonded directly to the polymer backbone. In the case where m=0, the two groups $Ar^1$ in the formula I are likewise covalently linked directly.

Surprisingly, significant increases in performance, such as, for example, current efficiency, and lifetime can be achieved with the novel blends of the polymers or copolymers with electron- or hole-transport structure bonded as side group and the corresponding, soluble small molecules having hole- or electron-transport properties compared with pure polymer blends of side-group polystyrenes containing a preferably electron-transporting or hole-transporting side group, which represent the prior art. The said matrix materials here are each doped with an emitter consisting of a transition-metal complex. Compared with pure blends of hole- and electron-transporting small molecules, significant advantages are achieved with respect to significantly improved film formation. Furthermore, the blend of polymer and small molecule results in the transition-metal complex being arranged in a favourable morphology, preferably in a component of the blend, so that quenching processes can be considerably suppressed and the light yield of the device can thus be increased. By mixing small molecules into, for example, a polystyrene side-group polymer, the crystallisation tendency of the former is reliably suppressed.

The structural unit of the formula (I) is preferably an electron- or hole-transporting unit.

In the present application, the term polymer or copolymer is taken to mean both polymeric compounds, oligomeric compounds and dendrimers. The polymeric compounds according to the invention preferably have 10 to 10000, particularly preferably 20 to 5000 and in particular 50 to 2000 structural units. The oligomeric compounds according to the invention preferably have 3 to 9 structural units. The branching factor of the polymers here is between 0 (linear polymer, no branching points) and 1 (fully branched dendrimer).

The term "dendrimer" in the present application is intended to be taken to mean a highly branched compound which is built up from a multifunctional centre (core), to which branched monomers are bonded in a regular structure, so that a tree-like structure is obtained. Both the centre and the monomers can adopt any desired branched structures here which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

An electronic component, in particular an organic electroluminescent device, is taken to mean a device which comprises anode, cathode and at least one emitting layer which is arranged between the anode and the cathode, where at least one layer between the anode and the cathode comprises at least one organic or organometallic compound. The emitting layer here preferably comprises at least one polymer according to the invention which comprises at least one structural unit of the formula (I) in the side chains, either as matrix material or, if the polymer also has emitting units, as emitting material. An organic electroluminescent device does not necessarily have to comprise only layers which are built up from organic or organometallic materials. Thus, it is also possible for one or more layers to comprise inorganic materials or to be built up entirely from inorganic materials.

A fluorescent compound in the sense of the present application is a compound which exhibits luminescence from an excited singlet state at room temperature. For the purposes of the present application, all luminescent compounds which contain no heavy atoms, i.e. no atoms having an atomic number greater than 36, are, in particular, intended to be regarded as fluorescent compounds.

A phosphorescent compound in the sense of the present invention is a compound which exhibits luminescence from an excited state having relatively high spin multiplicity, i.e. from a state having a spin quantum number S greater than or equal to 1, at room temperature. A phosphorescent compound in the sense of the present invention is preferably taken to mean a compound which emits light and/or radiation from an excited triplet (S=1, (2S+1)=3) and/or from an excited quintet (S=2, (2S+1)=5) state, very preferably from an excited triplet state. For the purposes of the present application, all luminescent compounds which contain a transition metal, preferably compounds containing Cu or other transition metals having an atomic number greater than 36 and particularly preferably compounds containing Cu, Pt or Ir, are, in particular, intended to be regarded as phosphorescent compounds.

For the purposes of the present application, a straight-chain, branched or cyclic alkyl group is taken to mean an alkyl, alkenyl and alkynyl groups preferably having 1 to 40 C atoms, particularly preferably 1 to 20 C atoms, or 3 to 40 C atoms, in particular 3 to 20 C atoms. Cyclic alkyl groups can be mono-, bi- or polycyclic alkyl groups. Individual —CH— or —CH$_2$— groups may be replaced by N, NH, O or S. Preference is given to the radicals methyl, ethyl, n-propyl, i-propyl, n-butyl, i-butyl, s-butyl, t-butyl, 2-methylbutyl, n-pentyl, s-pentyl, t-pentyl, cyclopentyl, n-hexyl, cyclohexyl, n-heptyl, cyclo-heptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl and octynyl.

An alkylene group in the present application is taken to mean an alkyl group as defined above in which two hydrogen radicals are not present and have been replaced by the further bond.

Preferred aromatic ring systems are, for example, benzene, biphenyl, terphenyl, naphthalene, anthracene, binaphthyl, phenanthrene, benzanthracene, dihydrophenanthrene, pyrene, dihydropyrene, chrysene, perylene, tetracene, pentacene, benzopyrene, fluorene, spirobifluorene and indene.

A mono- or polycyclic, heteroaromatic ring system in the sense of this invention is preferably taken to mean a heteroaromatic ring system having 5 to 40 ring atoms, particularly preferably 5 to 30, in particular 5 to 14 ring atoms. The heteroaromatic ring system contains at least one heteroatom selected from N, O and S (the remaining atoms are carbon). A heteroaromatic ring system is in addition intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, sp$^3$-hybridised C, O, N, etc., or a CO group. These heteroaromatic ring systems can be monocyclic or polycyclic, i.e. they may contain one ring (for example pyridyl) or two or more rings, which may also be condensed or covalently bonded, or contain a combination of condensed and linked rings.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b] thiophene, dithienothiophene, isobenzothiophene, dibenzothiophene, benzothiadiazothiophene, or combinations of these groups. Particular preference is given to imidazole, benzimidazole and pyridine.

A divalent mono- or polycyclic, aromatic or heteroaromatic ring system is taken to mean a mono- or polycyclic, aromatic or heteroaromatic ring system as described above in which one hydrogen radical is not present and has been replaced by the further bond.

An aryloxy or heteroaryloxy group having 5 to 60 aromatic ring atoms is taken to mean a group which carries a mono- or polycyclic, aromatic or heteroaromatic ring system having 5 to 60 aromatic ring atoms as described above via an O atom.

In a further embodiment of the present invention, L in the structural unit of the formula (I) is preferably a single covalent bond in the sense of the definition indicated above.

In a preferred embodiment of the present invention, Q is selected from the group consisting of —X(=O)—; 1,3,5-triazylene and/or radicals derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, where the 1,3,5-triazylene or the radicals may each be substituted at any desired position by one or more radicals $R^1$, $R^2$ and/or $R^3$ and/or may be linked to the aromatic or heteroaromatic ring system via any desired position; and s is 1 in the case where Q=—X(=O)—; is 1 or 2 in the case Q=1,3,5-triazylene; or is 1, 2, 3, 4 or 5 in the case where Q is selected from the radicals indicated above.

Particularly preferred radicals Q here are —C(=O)— and 1,3,5-triacylene or the radicals mentioned above.

In a further preferred embodiment of the present invention, $Ar^1$ or $Ar^2$ or $Ar^1$ and $Ar^2$ are selected on each occurrence, independently of one another, from the group consisting of benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotrux-ene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, each of which may be substituted at any desired position by one or more radicals $R^1$, $R^2$ and/or $R^3$ and/or may be linked to the aromatic or heteroaromatic ring system via any desired position.

The radicals $Ar^1$ here each have two single bonds to the structural elements shown adjacent in the formula I, i.e L and/or Q; the radical $Ar^2$ is connected to the group L by a single bond. The single bonds can emanate from $Ar^1$ and/or $Ar^2$ from any desired position.

In a further embodiment of the present invention, m in the structural unit of the formula (I) is preferably equal to 0 or 1.

In a further preferred embodiment, X in the structural unit of the formula (I) is, in the case where m=1, likewise equal to C or P(Ph) (Ph=phenyl), particularly preferably C.

Preferred structural units of the formula (I) are depicted below:

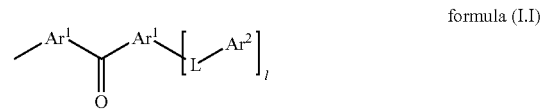

formula (I.I)

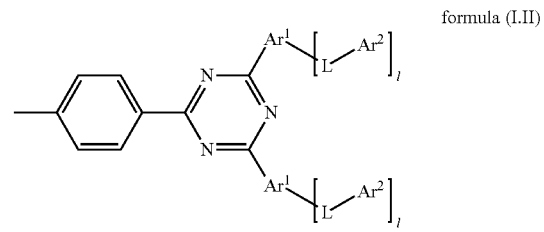

formula (I.II)

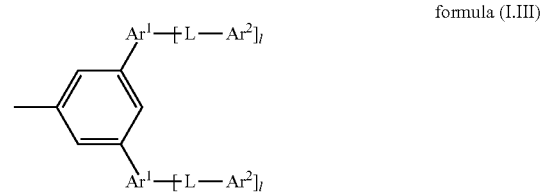

formula (I.III)

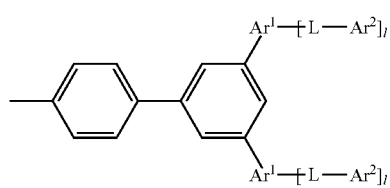
formula (I.IV)
Particularly preferred structural units of the formula (I) are depicted below:
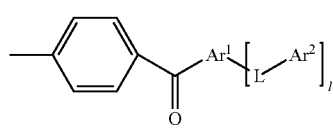
formula (I.Ia)
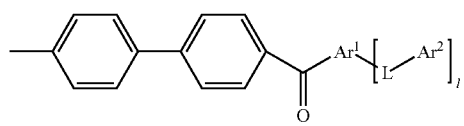
formula (I.Ib)
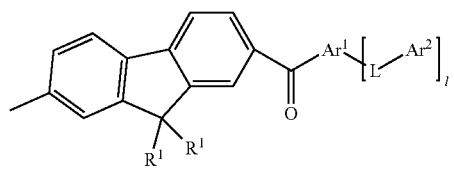
formula (I.Ic)
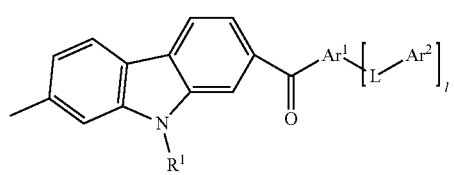
formula (I.Id)
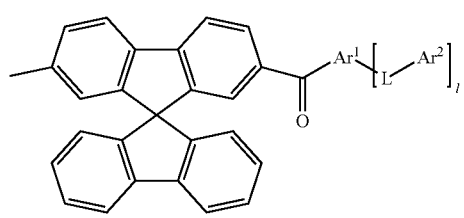
formula (I.Ie)
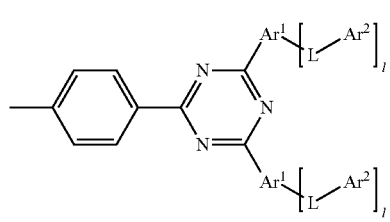
formula (I.IIa)
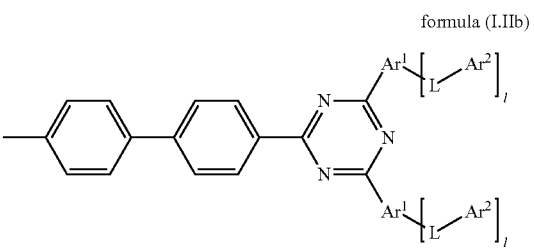
formula (I.IIb)
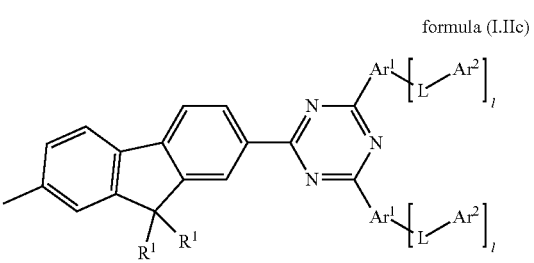
formula (I.IIc)
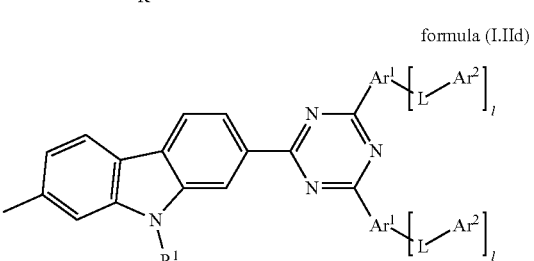
formula (I.IId)
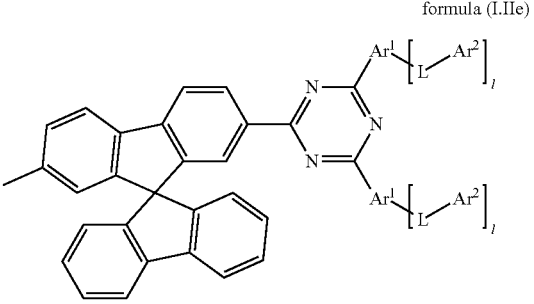
formula (I.IIe)
Especially preferred structural units of the formula (I) are depicted below:
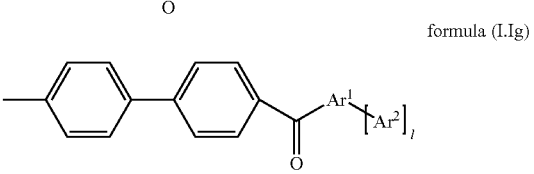
formula (I.If)
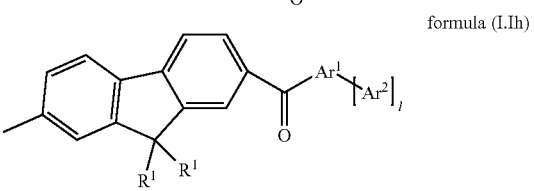
formula (I.Ig)
formula (I.Ih)

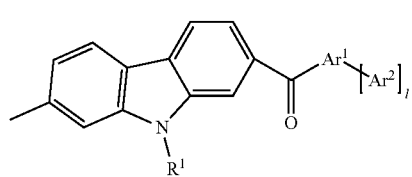
formula (I.Ii)

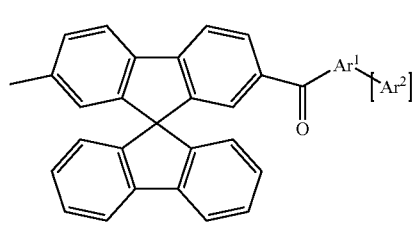
formula (I.Ij)

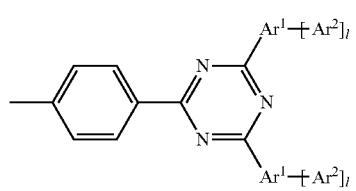
formula (I.IIf)

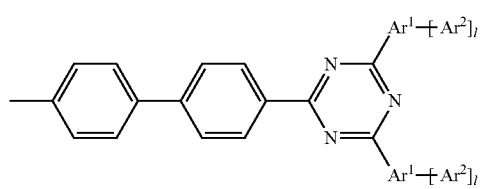
formula (I.IIg)

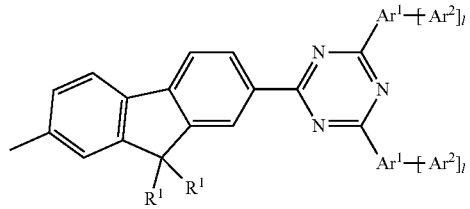
formula (I.IIh)

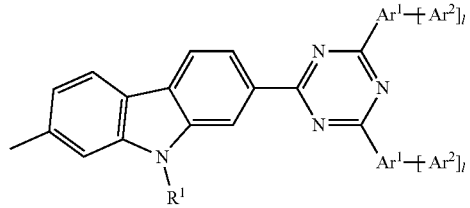
formula (I.IIi)

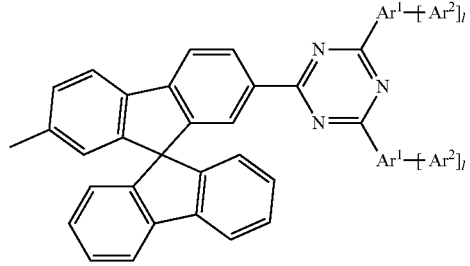
formula (I.IIj)

In the preferred, particularly preferred and especially preferred structural units depicted above, the other aromatic and heteroaromatic ring systems besides the groups $Ar^1$ and $Ar^2$ may also be substituted by one or more radicals $R^1$.

In particular, it is preferred for the structural unit of the formula (I) to be selected from the group consisting of a) structural units having electron-transporting substituents, of the following general formulae (II) and/or (III)

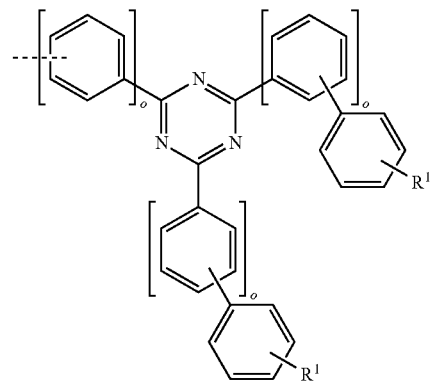
formula (II)

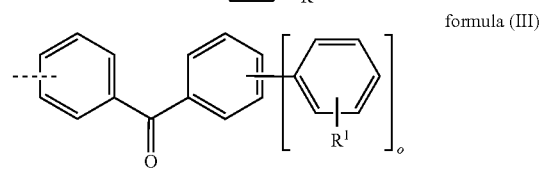
formula (III)

b) and/or structural units having hole-transporting substituents, of the general formulae (IV) and/or (V)

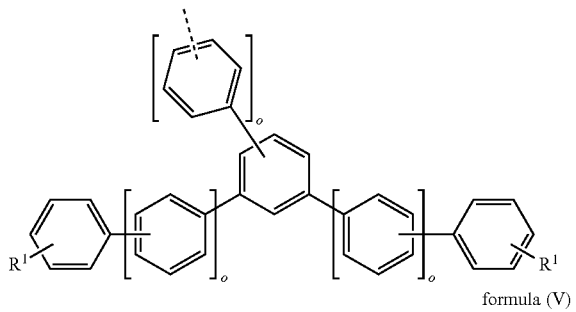
formula (IV)

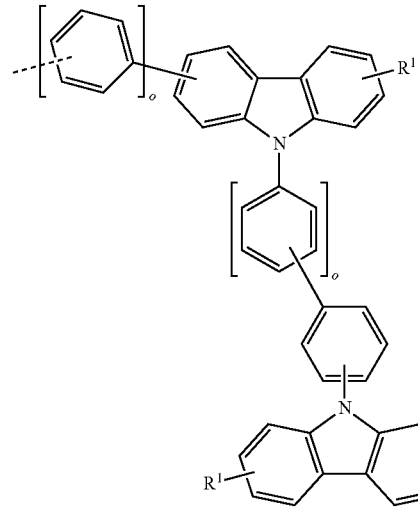
formula (V)

where the dashed line represents the connection to the polymer or copolymer backbone, $R^1$ has the meaning given above, and in each case, independently of one another, o=0 or 1 to 10.

Particularly preferred structural units having electron-transporting substituents here are selected from the group consisting of the following structural units:

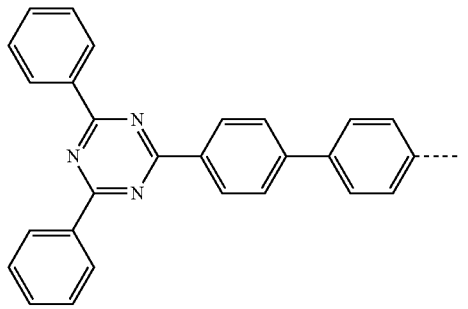

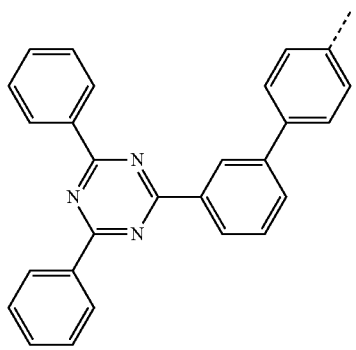

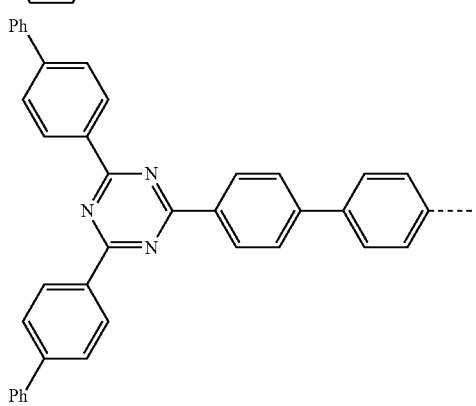

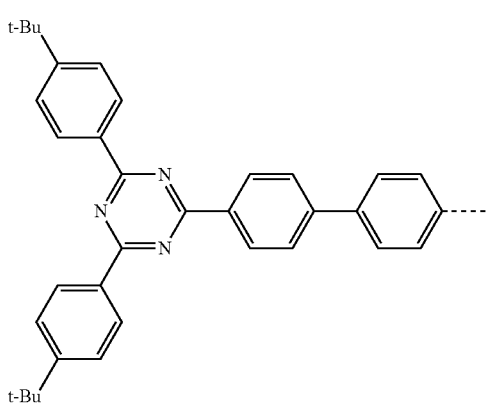

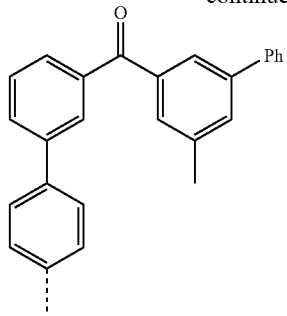

Particularly preferred structural units having hole-transporting substituents here are selected from the group consisting of the following structural units:

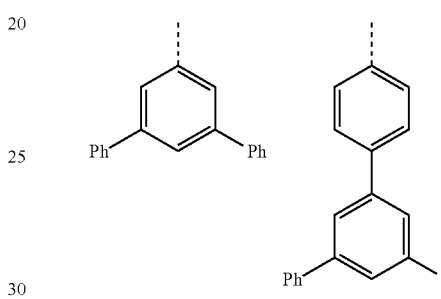

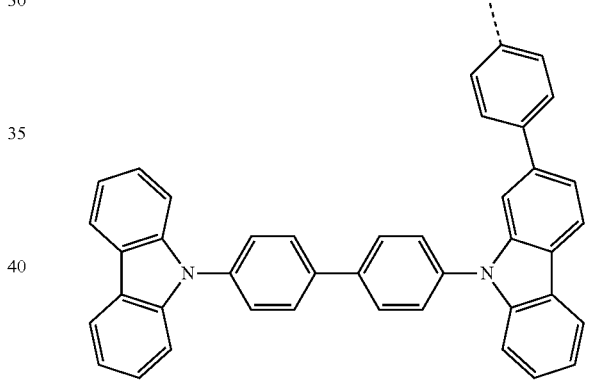

where the dashed line in each case represents the connection to the polymer or copolymer backbone.

Besides the side chains containing the structural units of the formula (I), the polymers according to the invention may include one or more further side chains which contain at least one further structural unit.

For the purposes of the present invention, it is also conceivable for the polymers according to the invention to include, besides the structural units of the formula (I), a plurality of further side chains which contain various further structural unit(s). This (these) further structural unit(s) are preferably selected from the group consisting of electron-transporting units, hole-transporting units, charge-neutral units and emitting units.

In a further embodiment of the present invention, the polymers according to the invention preferably also contain, besides one or more structural units of the general formula I, at least one further structural unit which is different from the structural unit of the formula I. These are, inter alia, those as disclosed and extensively listed in WO 02/077060 A1 and in WO 2005/014689 A2. These are regarded as part of the present invention by way of reference. The further structural units can originate, for example, from the following classes:

Group 1: units which influence the hole-injection and/or hole-transport properties of the polymers;
Group 2: units which influence the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film morphology and/or the rheological properties of the resultant polymers.

Preferred polymers according to the invention are those in which at least one structural unit has charge-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

A structural unit from group 1, which may be in the form of a side chain in the polymer according to the invention, is a unit of the following formula (VI)

formula (VI)

where the dashed line represents the connection to the polymer backbone, and the symbol L has the same meanings as in relation to formula (I), and the other symbols used have the following meanings:

Y is a trivalent unit which is selected from the group consisting of N, B, Si(Ar$^4$), SiR$^5$, Ge(Ar$^4$), GeR$^5$, P and As;
Ar$^5$ is a divalent mono- or polycyclic, aromatic or heteroaromatic ring system having 5 to 60 aromatic ring atoms, which may be substituted by one or more radicals R$^1$;
Ar$^6$ is a mono- or polycyclic, aromatic or heteroaromatic ring system having 5 to 60 aromatic ring atoms, which may be substituted by one or more radicals R$^1$;
R$^5$ is on each occurrence, identically or differently, H, D, F, Cl, Br, I, N(Ar$^3$)$_2$, CN, NO$_2$, Si(R$^2$)$_3$, B(OR$^2$)$_2$, C(=O)Ar$^3$, P(=O)(Ar$^3$)$_2$, S(=O)Ar$^3$, S(=O)$_2$Ar$^3$, —CR$^2$=CR$^2$(Ar$^3$), tosylate, triflate, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by F, Cl, Br, I, CN or NO$_2$, or an aryloxy or heteroaryloxy group having 5 to 60 aromatic ring atoms, which may be substituted by one or more radicals R$^2$, or a combination of these systems; where two or more adjacent substituents R$^5$ may also be linked to one another via a single covalent bond or a divalent group Z;

where R$^1$, R$^2$, Ar$^3$, Ar$^4$ and Z have the same meanings as defined above in relation to formula (I).

Examples of a structural unit of the formula (VI) are the following:

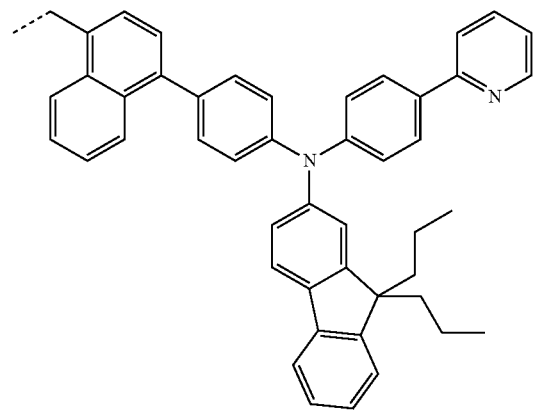

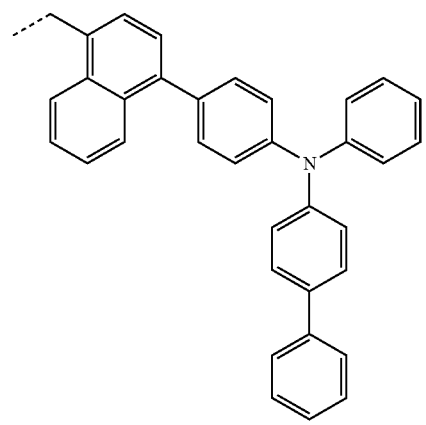

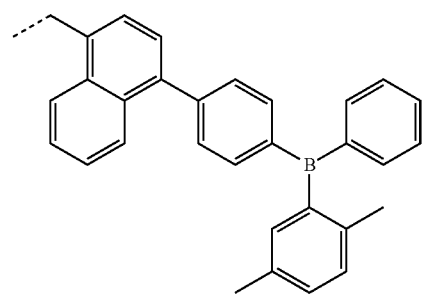

A further structural unit from group 1, which may be in the form of a side chain in the polymer according to the invention, is a unit of the following formula (VII)

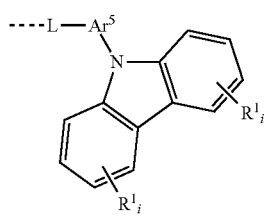

formula (VII)

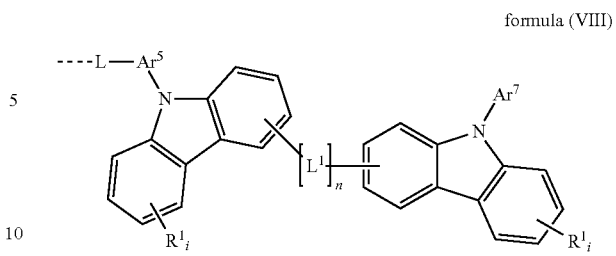

formula (VIII)

where the dashed line represents the connection to the polymer backbone, the non-specific bonds which end in the centre of the aromatic rings are intended to indicate that the radical $R^1$ may sit at each of positions 1 to 8 of the carbazole, the symbols L, $R^1$ and $Ar^5$ have the same meanings as in relation to formula (I), and the index i is equal to 0, 1, 2, 3 or 4.

An example of a structural unit of the formula (VIII) is the following:

where the dashed line represents the connection to the polymer backbone, the non-specific bonds which end in the centre of the aromatic rings are intended to indicate that the symbols $R^1$ and $L^1$ may each sit at each of the corresponding positions 1 to 8 of the carbazole, the symbols L, $R^1$ and $Ar^5$ and the index i have the same meanings as in relation to formula (I) or (VII), and the other symbols and indices used have the following meanings:

$L^1$ is on each occurrence, identically or differently, a single covalent bond or a straight-chain alkylene group having 1 to 20 C atoms or a branched or cyclic alkylene group having 3 to 20 C atoms, each of which may be substituted by one or more radicals $R^1$, where one or more non-adjacent $CH_2$ groups may be replaced by $R^2C{=}CR^2$, $C{\equiv}C$, $Si(R^2)_2$, $Ge(R^2)_2$, $Sn(R^2)_2$, $C{=}O$, $C{=}S$, $C{=}Se$, $C{=}NR^2$, $P({=}O)(R^2)$, SO, $SO_2$, $NR^2$, O, S or $CONR^2$ and where one or more H atoms may be replaced by F, Cl, Br, I, CN or $NO_2$;

n is equal to 0, 1, 2 or 3, with the proviso that, if n>1, a maximum of one $L^1$ may be an aromatic or heteroaromatic ring system;

$Ar^7$ is a mono- or polycyclic, aromatic or heteroaromatic ring system having 5 to 60 aromatic ring atoms, which may be substituted by one or more radicals $R^1$.

An example of a structural unit of the formula (VIII) is the following:

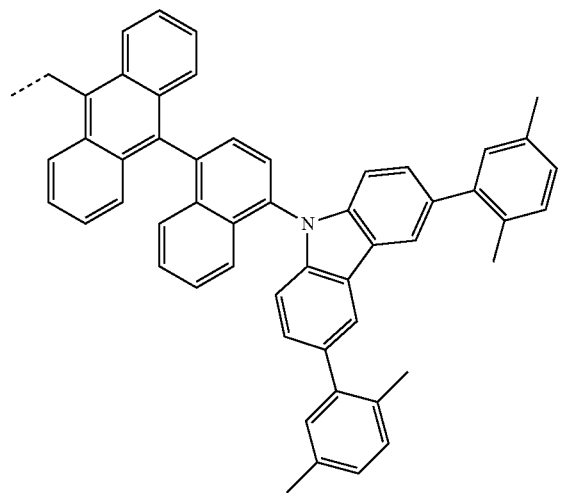

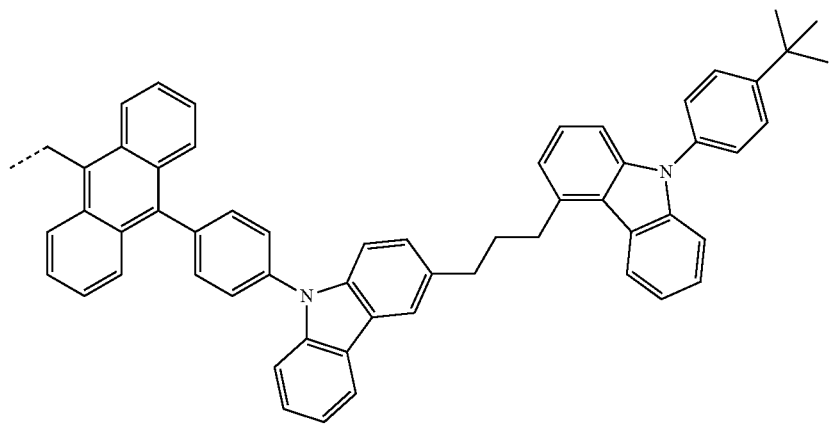

A further structural unit from group 1, which may be in the form of a side chain in the polymer according to the invention, is a unit of the following formula (VIII)

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −2.5 eV (against vacuum level), particularly preferably less than −2.7 eV.

It may be preferred for the polymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1 239 526 A2 and WO 2004/026886 A2. Corresponding monomers are described in WO 02/068435 A1 and in WO 2005/042548 A1.

A structural unit from group 4 which may be in the form of a side chain in the polymer according to the invention is a unit of the following formula (IX)

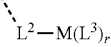

formula (IX)

where the dashed line represents the connection to the polymer backbone, and the symbols and indices used have the following meanings:
$L^2$ and $L^3$ are, independently of one another on each occurrence, identically or differently, a mono- or polydentate ligand;
M is preferably a transition metal, a main-group metal, a lanthanoid or an actinoid;
r is equal to 0, 1, 2, 3, 4, 5, 6 or 7, depending on the denticity of the ligands $L^2$ and $L^3$ and the coordination number of the metal M.

A mono- or polydentate ligand is taken to mean a compound which is able to form one or coordination bond(s) with a metal. The ligand preferably forms an organometallic compound unit with the central metal. The organometallic compound unit is preferably an organometallic coordination compound. An organometallic coordination compound is taken to mean a compound having a metal atom or ion in the centre of the compound surrounded by an organic compound as ligand. An organometallic coordination compound is additionally characterised in that a carbon atom of the ligand is bonded to the central metal via a coordination bond.

It is furthermore preferred for the organic ligand to be a chelate ligand. A chelate ligand is taken to mean a bi- or multidentate ligand, which is able to bond to the central metal correspondingly via two or more atoms.

The ligand $L^2$ and $L^3$ is preferably an organic ligand which includes a unit (referred to as ligand unit below) which is represented by the following formula (X):

formula (X)

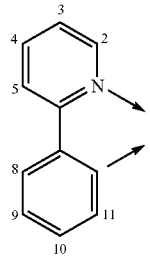

formula (VI)

where the atoms from which the arrows point away are coordinated to the metal atom, and the numerals 2 to 5 and 8 to 11 merely represent a numbering in order to distinguish the C atoms. The organic ligand unit of the formula (X) may, instead of hydrogen at positions 2, 3, 4, 5, 8, 9, 10 and 11, have, independently of one another, a substituent which is selected from the group consisting of $C_{1-6}$-alkyl, $C_{6-20}$-aryl, 5- to 14-membered heteroaryl and further substituents.

The expression "$C_{1-6}$-alkyl" used herein denotes a linear or branched alkyl group having 1 to 6 carbon atoms. Examples of such carbon atoms are methyl, ethyl, n-propyl, isopropyl, n-butyl, isobutyl, secbutyl (1-methylpropyl), tert-butyl, isopentyl, n-pentyl, tert-pentyl (1,1-dimethylpropyl), 1,2-dimethylpropyl, 2,2-dimethylpropyl (neopentyl), 1-ethylpropyl, 2-methylbutyl, n-hexyl, isohexyl, 1,2-dimethylbutyl, 1-ethyl-1-methylpropyl, 1-ethyl-2-methylpropyl, 1,1,2-trimethylpropyl, 1,2,2-trimethylpropyl, 1-ethylbutyl, 1-methylbutyl, 1,1-dimethylbutyl, 2,2-dimethylbutyl, 1,3-dimethylbutyl, 2,3-dimethylbutyl, 3,3-dimethylbutyl, 2-ethylbutyl, 1-methylpentyl, 2-methylpentyl, 3-methylpentyl and the like, where methyl and ethyl are preferred.

The expression "$C_{6-20}$-aryl" denotes an aromatic ring system having 6 to 20 carbon atoms. An aromatic or heteroaromatic ring system in the sense of the present invention is intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, $sp^3$-hybridised C, O, N, etc.

Aromatic groups may be monocyclic or polycyclic, i.e. they may contain one ring (for example phenyl) or two or more rings, which may also be condensed (for example naphthyl) or covalently linked (for example biphenyl), or contain a combination of condensed and linked rings. Preference is given to fully conjugated aromatic groups.

Preferred aromatic ring systems are, for example, phenyl, biphenyl, triphenyl, naphthyl, anthracene, binaphthyl, phenanthrene, dihydrophenanthrene, pyrene, dihydropyrene, chrysene, perylene, tetracene, benzopyrene, fluorene, indene, indenofluorene and spirobifluorene.

"5- to 14-membered heteroaryl" is taken to mean an aromatic group in which one or more carbon atom(s) has (have) been replaced by an N, O or S. Examples thereof include the following: 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno-[2,3b]thiophene, thieno[3,2b]thiophene, dithienothiophene, isobenzothiophene, dibenzothiophene, benzothiadiazothiophene or combinations of these groups. The heteroaryl groups may also be substituted by alkyl, alkoxy, thioalkyl, fluorine, fluoroalkyl or further aryl or heteroaryl groups.

Further possible substituents on the ligand unit of the formula (X) are preferably selected from the group consisting of silyl, sulfo, sulfonyl, formyl, amine, imine, nitrile, mercapto, nitro, halogen, hydroxyl or combinations of these groups. Preferred substituents are, for example, solubility-promoting groups, such as alkyl or alkoxy, electron-withdrawing groups, such as fluorine, nitro or nitrile, or substituents for increasing the glass transition temperature (Tg) in the polymer. Particularly preferred substituents are, for example, F, Cl, Br, I, —CN, —NO$_2$, —NCO, —NCS, —OCN, —SCN, —C(=O)N(R)$_2$, —C(=O)R, —C(=O)R and —N(R)$_2$, in which R is a hydrogen, alkyl or aryl, optionally substituted silyl, aryl having 4 to 40, preferably 6 to 20, C atoms, and straight-chain or branched alkyl, alkoxy, alkylcarbonyl, alkoxycarbonyl, alkylcarbonyloxy or alkoxycarbonyloxy having 1 to 22 C atoms, in which one or more H atoms may optionally be replaced by F or Cl.

It is furthermore preferred for two adjacent carbon atoms on the phenyl ring or pyridyl ring of the ligand unit of the formula (X) to be bridged via a —CH=CH—CH=CH— group, where a naphthyl unit forms in the case of the phenyl ring and an azanaphthyl unit forms in the case of the pyridyl ring. These may in turn carry via a further —CH=CH—CH=CH— group bridging via two adjacent carbon atoms. In a further preferred embodiment, the carbon atoms at positions 5 and 8 are bridged via a —CH=CH— group. Further bridges between phenyl units of the ligand unit can be divalent (CH$_3$)C— units, which are preferably linked in such a way that a further 6-membered ring forms.

Preferred examples of the ligands of the formula (X) are the following compounds (X-1) to (X-10):

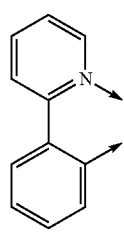
(X-1)

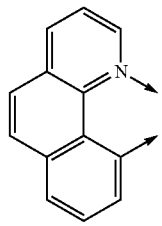
(X-2)

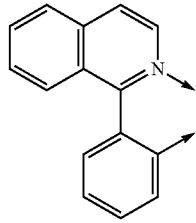
(X-3)

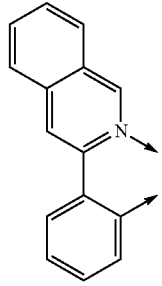
(X-4)

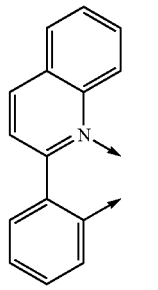
(X-5)

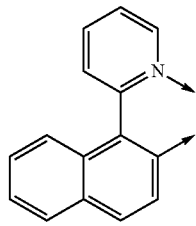
(X-6)

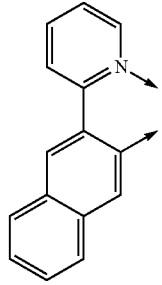
(X-7)

-continued

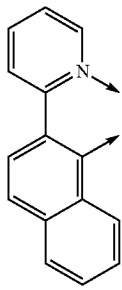
(X-8)

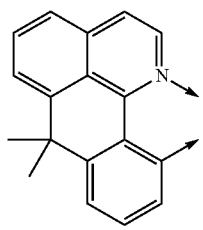
(X-9)

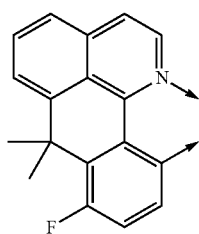
(X-10)

Particular preference is given for the purposes of the present invention to compounds (X-1), (X-3) and (X-10).

Furthermore, the ligand $L^2$ is preferably bonded to the polymer backbone via a C atom in the 2-, 3-, 4-, 5-, 8-, 9-, 10- or 11-position. The ligand is particularly preferably bonded to the polymer backbone via position 9 or 11, in particular via position 9.

Besides the above-mentioned ligand unit $L^2$, which is bonded to the polymer backbone, the coordination compound may comprise further ligands $L^3$ which are not bonded to the polymer backbone. These further ligands are likewise defined like the above-mentioned ligand $L^2$, with the difference that none of the H atoms has been replaced by a bond to the polymer. In other words, this ligand preferably contains a hydrogen radical instead of the bond to the polymer at the corresponding site. Preferred examples of the further ligand are the same as mentioned above. Particularly preferred examples are ligands of the above-mentioned formulae (X-1) to (X-10). The further ligand is particularly preferably a ligand of the formulae (X-1), (X-3) and (X-10).

The metal of the metal-ligand coordination compound is preferably a transition metal, a main-group metal, a lanthanoid or an actinoid. If the metal is a main-group metal, it is then preferably a metal from the third, fourth or fifth main group, in particular tin. If the metal is a transition metal, it is then preferably Ir, Ru, Os, Pt, Zn, Mo, W, Rh or Pd, in particular Ir and Pt. Eu is preferred as lanthanoid.

Preference is given to metal-ligand coordination compounds in which the metal is a transition metal, in particular a tetracoordinated, pentacoordinated or hexacoordinated transition metal, particularly preferably selected from the group consisting of chromium, molybdenum, tungsten, rhenium, ruthenium, osmium, rhodium, iridium, nickel, palladium, platinum, copper, silver and gold, in particular molybdenum, tungsten, rhenium, ruthenium, osmium, iridium, platinum, copper and gold. Very particular preference is given to iridium and platinum. The metals here can be in various oxidation states. The above-mentioned metals here are preferably in the oxidation states Cr(0), Cr(II), Cr(III), Cr(IV), Cr(VI), Mo(0), Mo(II), Mo(III), Mo(IV), Mo(VI), W(0), W(II), W(III), W(IV), W(VI), Re(I), Re(II), Re(III), Re(IV), Ru(II), Ru(III), Os(II), Os(III), Os(IV), Rh(I), Rh(III), Ir(I), Ir(III), Ir(IV), Ni(0), Ni(II), Ni(IV), Pd(II), Pt(II), Pt(IV), Cu(I), Cu(II), Cu(III), Ag(I), Ag(II), Au(I), Au(III) and Au(V); very particular preference is given to Mo(0), W(0), Re(I), Ru(II), Os(II), Rh(III), Ir(III), Pt(II) and Cu(I), in particular Ir(III) and Pt(II).

In a preferred embodiment of the invention, the metal is a tetracoordinated metal having one, two, three or four ligands. In this way, the ligands may be mono-, bi-, tri- or tetradentate ligands. If the metal is coordinated to one ligand, it is a tetradentate ligand. If the metal is coordinated to two ligands, either both ligands are bidentate ligands, or one is a tridentate ligand and one is a monodentate ligand. If the metal is coordinated to three ligands, one ligand is a bidentate ligand and two are a monodentate ligand. If the metal is coordinated to four ligands, all ligands are monodentate.

In a further preferred embodiment of the invention, the metal is a hexacoordinated metal having one, two, three, four, five or six ligands. In this way, the ligands may be mono-, bi-, tri-, tetra-, penta- or hexadentate ligands. If the metal is coordinated to one ligand, it is a hexadentate ligand. If the metal is coordinated to two ligands, either both are tridentate ligands or one is a bidentate ligand and one is a tetradentate ligand or one is a monodentate ligand and one is a pentadentate ligand. If the metal is coordinated to three ligands, either all three ligands are bidentate ligands or one is a tridentate ligand, one is a bidentate ligand and one is a monodentate ligand or one is a tetradentate ligand and two are monodentate ligands. If the metal is coordinated to four ligands, one ligand is a tridentate ligand and three are a monodentate ligand or two are bidentate ligands and two are monodentate ligands. If the metal is coordinated to five ligands, one is a bidentate ligand and four are monodentate ligands. If the metal is coordinated to six ligands, all ligands are monodentate.

The metal centre of the organic coordination compound is preferably a metal atom in oxidation state 0 and the metal-ligand coordination compound is preferably a charge-neutral compound.

In a very particularly preferred embodiment, the metal centre is Pt or Ir. If the metal centre is Pt, it preferably has the coordination number 4. In the case of Ir as metal centre, the coordination number is preferably 6.

Furthermore, it is preferred for Pt to be coordinated by two ligand units of the formula (X) and Ir to be coordinated by three ligand units of the formula (X) in the manner indicated above.

Consequently, r is preferably 1 if the coordination number of the metal is 4 and the ligands $L^2$ and $L^3$ are each bidentate, and r is preferably 2 if the coordination number of the metal is 6 and the ligands $L^2$ and $L^3$ are each bidentate.

Examples of a structural unit of the formula (IX) are the following:

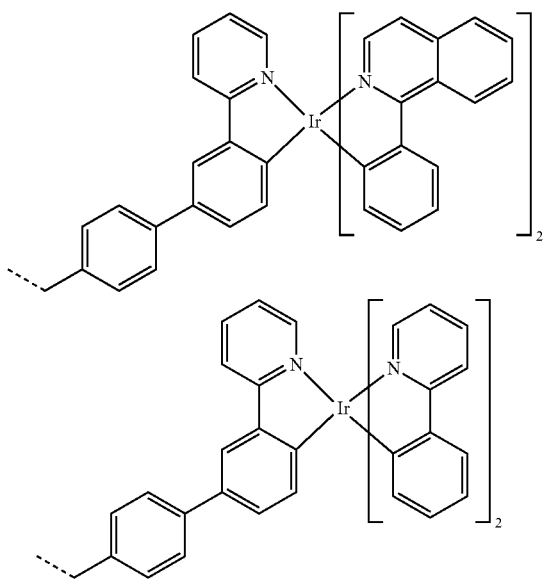

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film morphology and/or rheological properties of the polymers, such as, for example, siloxanes, long alkyl chains or fluorinated groups, but also particularly rigid or flexible units, such as, for example, liquid crystal-forming units or crosslinkable groups.

A further structural unit which may be in the form of a side chain in the polymer according to the invention is a unit of the following formula (XI)

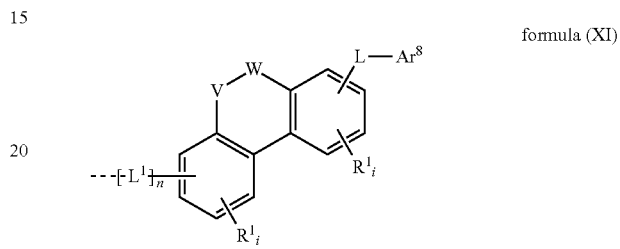

formula (XI)

where the dashed line represents the connection to the polymer backbone, the non-specific bonds which end in the centre of the aromatic rings are intended to indicate that the symbols $R^1$, L and $L^1$ may each sit at each of the free positions of the aromatic rings, the symbols $R^1$, L and $L^1$ and the indices i and n have the same meanings as in relation to formula (I) or (VI), and the other symbols used have the following meanings:

V and W are selected, independently of one another, from the group consisting of $C(Ar^3)_2$, $C(R^5)_2$, $Si(Ar^3)_2$, $Si(R^5)_2$, $Ge(Ar^3)_2$, $Ge(R^5)_2$, C=O, O, S, Se, $N(Ar^4)$, $N(R^5)$, $P(Ar^4)$, $P(R^5)$, $P=O(Ar^3)$, $P=O(R^5)$, B and $(R^5)_2CO$;

$Ar^8$ is a mono- or polycyclic, aromatic or heteroaromatic ring system having 5 to 60 aromatic ring atoms, which may be substituted by one or more radicals $R^1$;

where the symbols $R^5$, $Ar^3$ and $Ar^4$ have the same meanings as defined above.

Depending on the meaning of the radicals V and W in the structural unit of the formula (XI), the structural unit can be one from group 1, 2, 5, 6 or 8.

Examples of a structural unit of the formula (XI) are the following:

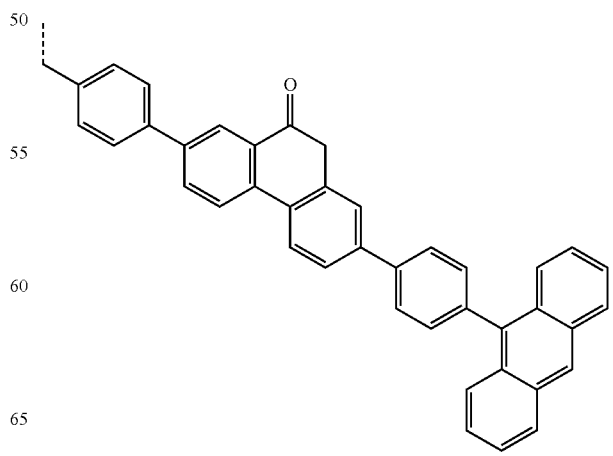

-continued

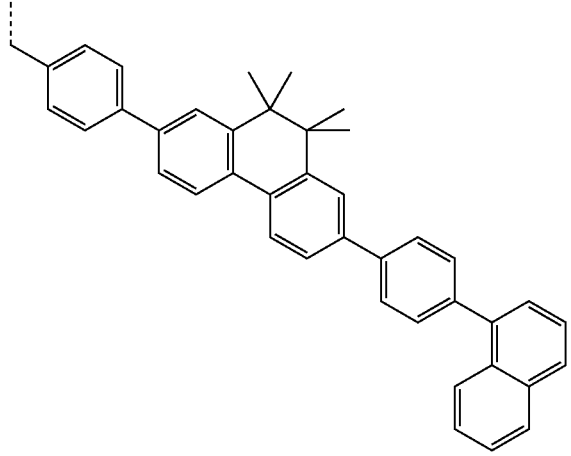

Preference is given to polymers according to the invention which, besides structural units of the formula (I), simultaneously additionally comprise one or more units selected from groups 1 to 8. It may likewise be preferred for more than one further structural unit from a group to be present at the same time.

Preference is given here to polymers according to the invention which, besides at least one structural unit of the formula (I), also contain units from group 7, particularly preferably at least 50 mol % of these units, based on the total number of structural units in the polymer.

It is likewise preferred for the polymers according to the invention to contain units which improve the charge transport or charge injection, i.e. units from group 1 and/or 2; a proportion of 0.5 to 30 mol % of these units is particularly preferred; a proportion of 1 to 10 mol % of these units is very particularly preferred, based on the entire recurring unit on which the functional side chain hangs. A recurring unit includes all atoms which are incorporated into the polymer by polymerisation of a monomer.

It is furthermore particularly preferred for the polymers according to the invention to contain structural units from group 7 and units from group 1 and/or 2, in particular at least 50 mol % of units from group 7 and 0.5 to 30 mol % of units from group 1 and/or 2.

The polymers according to the invention are either homopolymers or copolymers. The polymers according to the invention may be linear or branched. Besides one or more structural units of the formula (I), copolymers according to the invention may potentially have one or more structures from the above-mentioned groups 1 to 8.

The copolymers according to the invention can have random, alternating or block-like structures or also a plurality of these structures in an alternating manner. The copolymers according to the invention particularly preferably have random or block-like structures. The copolymers are particularly preferably random or block-like copolymers. The way in which copolymers having block-like structures can be obtained and what further structural elements are particularly preferred for this purpose is described in detail, for example, in WO 2005/014688 A2. This is incorporated into the present application by way of reference. It should likewise again be emphasised at this point that the polymer may also have dendritic structures.

It may additionally be preferred for the polymers according to the invention not to be used as pure substance, but instead as a mixture (blend) together with further polymeric, oligomeric, dendritic or low-molecular-weight substances of any desired type. These may, for example, improve the electronic properties or themselves emit. Above and below, a mixture comprising at least one polymeric component according to the invention is referred to as "mixture" or "blend".

The present invention thus furthermore relates to a polymer mixture (blend) which comprises one or more polymers according to the invention, and one or more further polymeric, oligomeric, dendritic or low-molecular-weight substances.

A preferred low-molecular-weight substance in the mixture according to the invention is an emitting compound. The emitting compound is preferably a compound of the following formula (XII)

$$M(L^3)_k \qquad \text{formula (XII)}$$

where M and $L^3$ have the same meanings as above in relation to formula (IX), and k is equal to 1, 2, 3, 4, 5, 6, 7 or 8, depending on the denticity of the ligand $L^3$ and the coordination number of the metal M.

The invention furthermore relates to solutions and formulations comprising one or more polymers or mixtures according to the invention in one or more solvent(s). The way in which such solutions can be prepared is known to the person skilled in the art and is described, for example, in WO 02/072714 A1, WO 03/019694 A2 and the literature cited therein.

These solutions can be used in order to produce thin polymer layers, for example by area-coating methods (for example spin coating) or by printing processes (for example ink-jet printing). Suitable and preferred solvents are, for example, toluene, anisole, xylene, methyl benzoate, dimethylanisole, mesitylene, tetralin, veratrol and tetrahydrofuran, and mixtures thereof.

The present invention additionally relates to processes for the preparation of the polymers according to the invention, which are characterised in that the polymers are prepared by cationic or anionic, ring-opening, free-radical or catalytic polymerisation.

Monomers of the following formulae (Ia) and VIa) to (XIa) can be linked to one another here either to form a homopolymer or to form a copolymer.

The present invention thus also relates to a compound of the following formula (Ia)

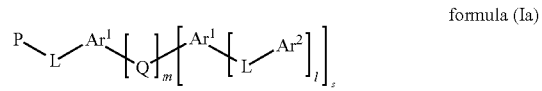

formula (Ia)

in which the symbols and indices used have the same meanings as in relation to formula (I), and the symbol P is a polymerisable group.

The polymerisable group is preferably a group which has been reacted with further polymerisable groups by ionic, ring-opening, free-radical and/or catalytic polymerisation to form a polymer.

The polymerisable group preferably comprises a double covalent bond or an oxirane ring. The following polymerisable groups can be employed here:
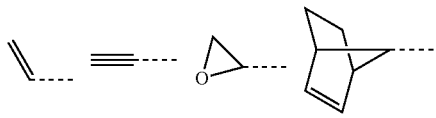 
where the dashed line represents the connection to the symbol L.
Compounds of the formula (Ia) which are preferred in accordance with the invention are the following:
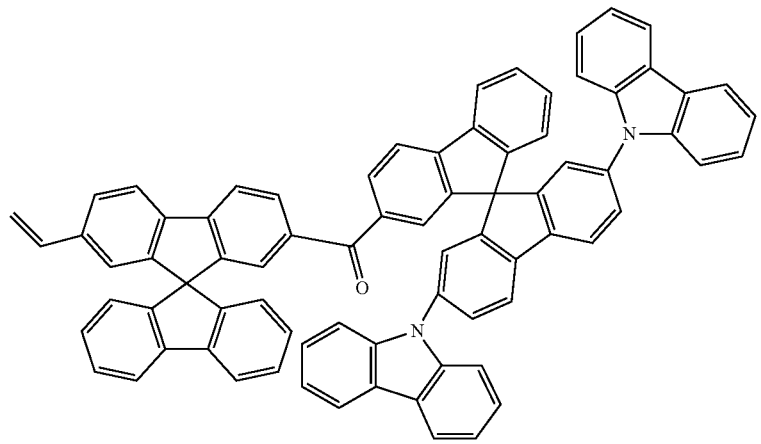
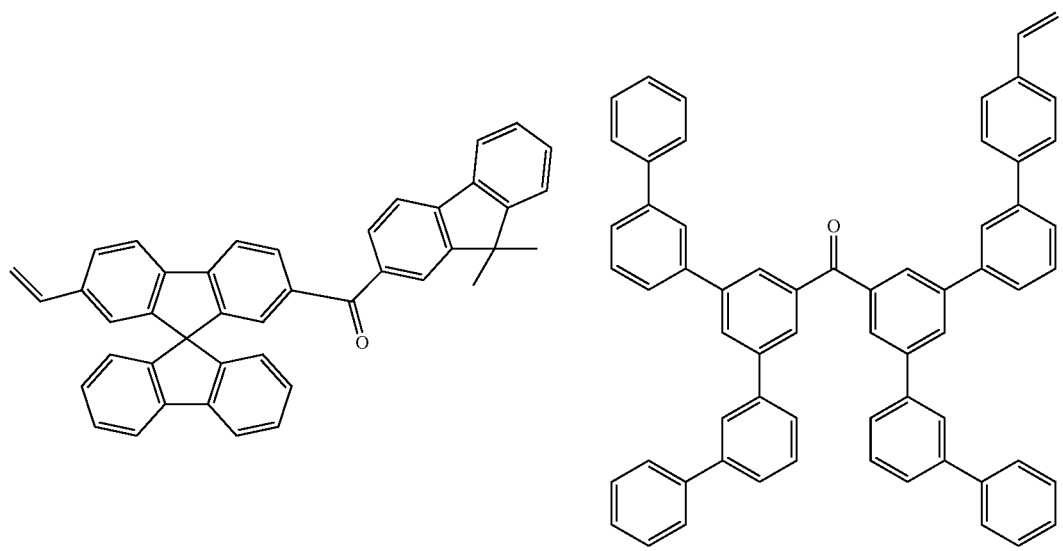
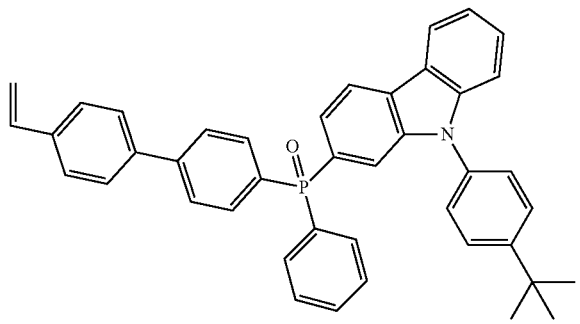

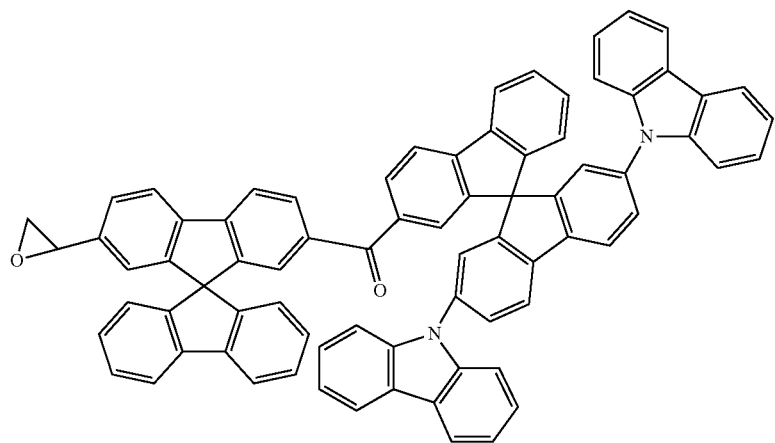
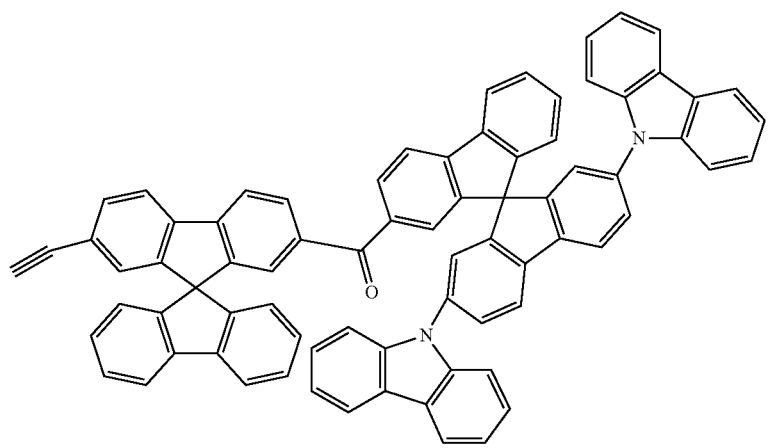
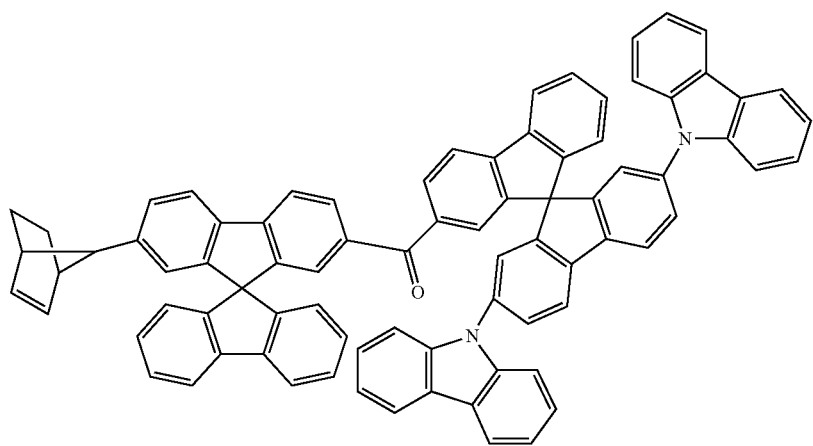

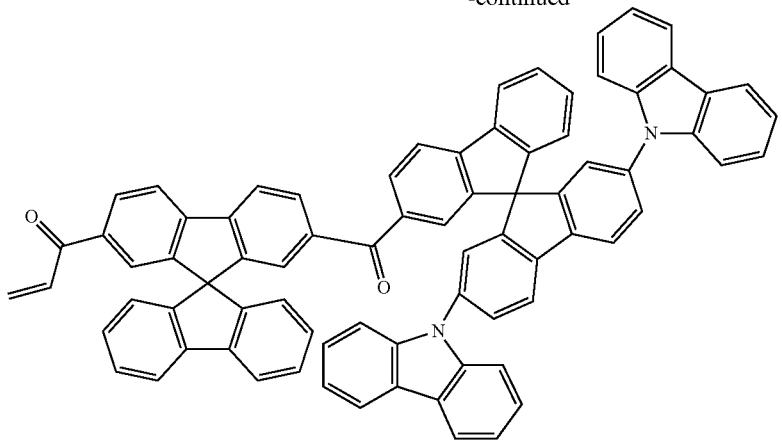

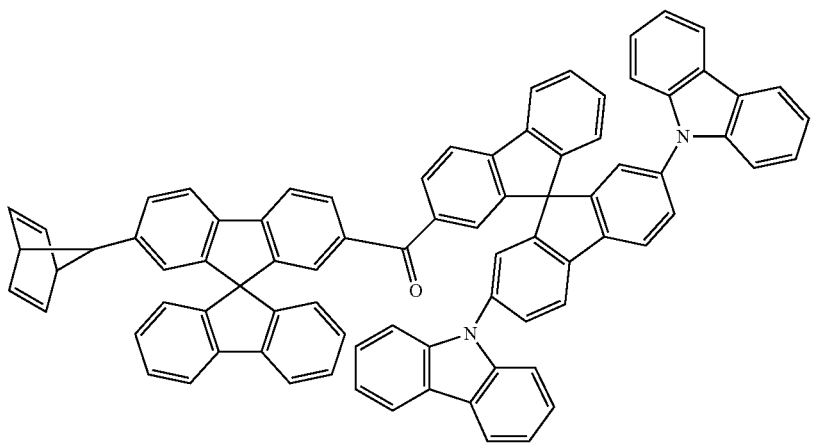 [SMILES: O=C(c1ccc2c(c1)C1(c3ccccc3-c3ccccc31)c1cc(C3C4C=CC3C=C4)ccc1-2)c1ccc2c(c1)C1(c3ccccc3-2)c2cc(-n3c4ccccc4c4ccccc43)ccc2-c2ccc(-n3c4ccccc4c4ccccc43)cc21]

The invention furthermore relates to a composition which comprises a compound of the formula (Ia). Besides the compound of the formula (Ia), the composition according to the invention may also comprise one or more further polymerisable compound(s). The one or more further polymerisable compound(s) here are preferably selected from the group consisting of the following compounds:

formula (VIa)

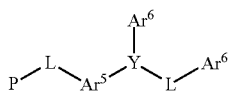

formula (VIIa)

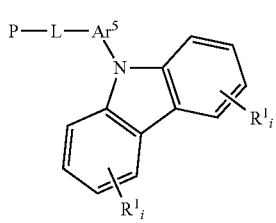

formula (VIIIa)

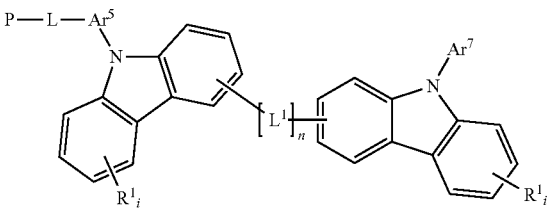

formula (IXa)

P—L²—M(L³)$_r$, formula (XIa)

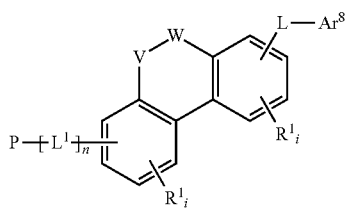

in which the symbols and indices used have the same meanings as defined above.

Preferred compounds of the formulae (IIa) and (VIa) to (XIa) are the following:
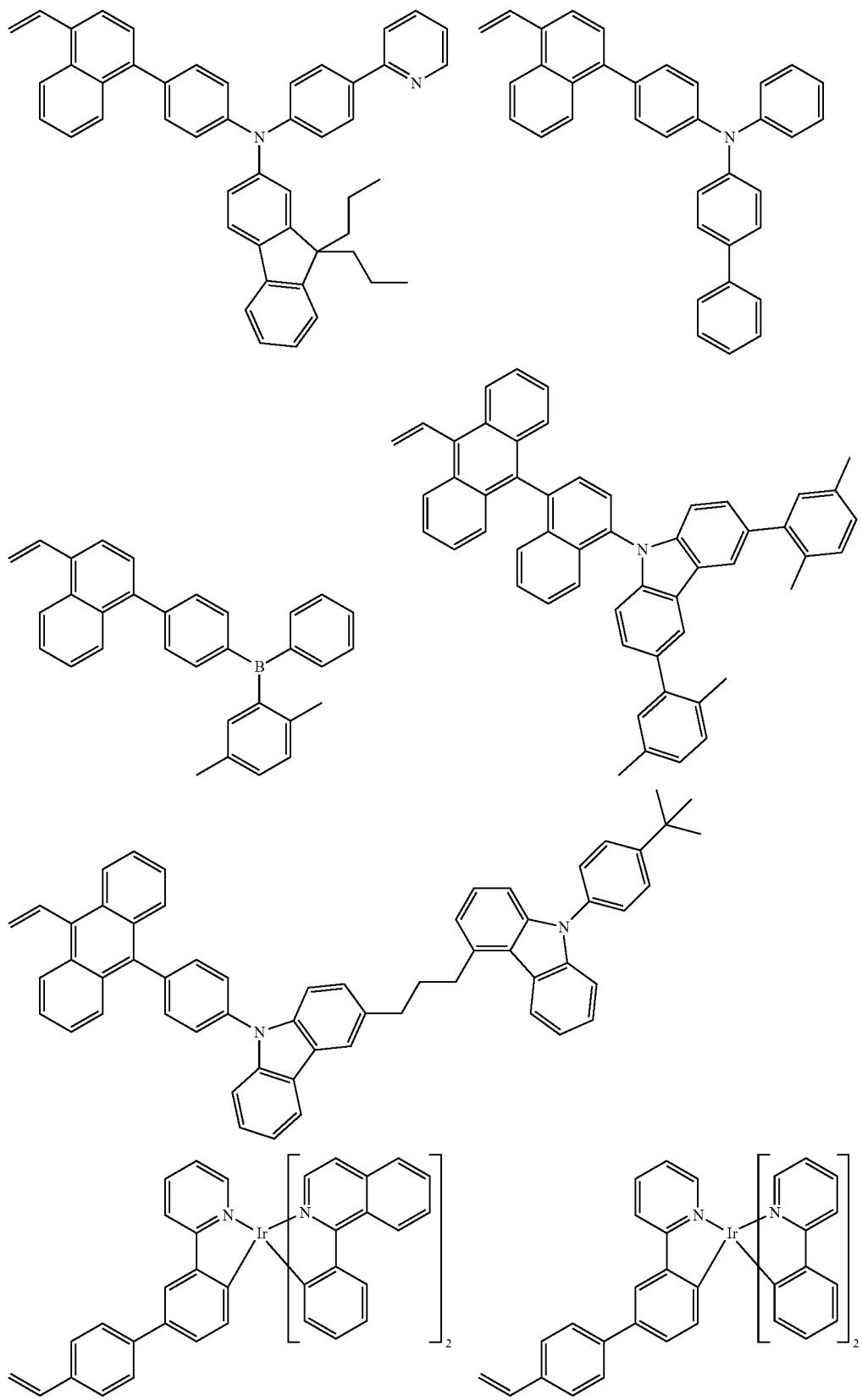

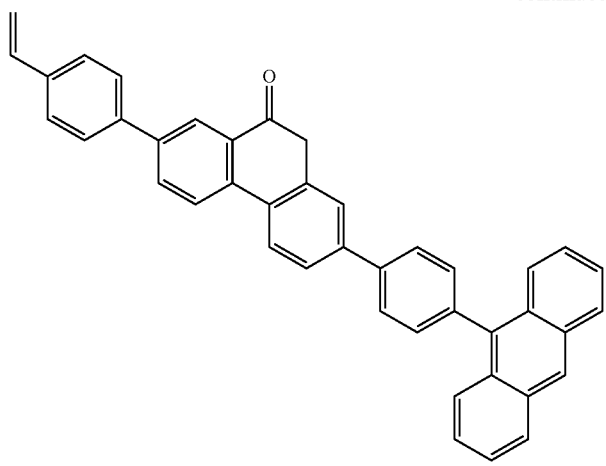
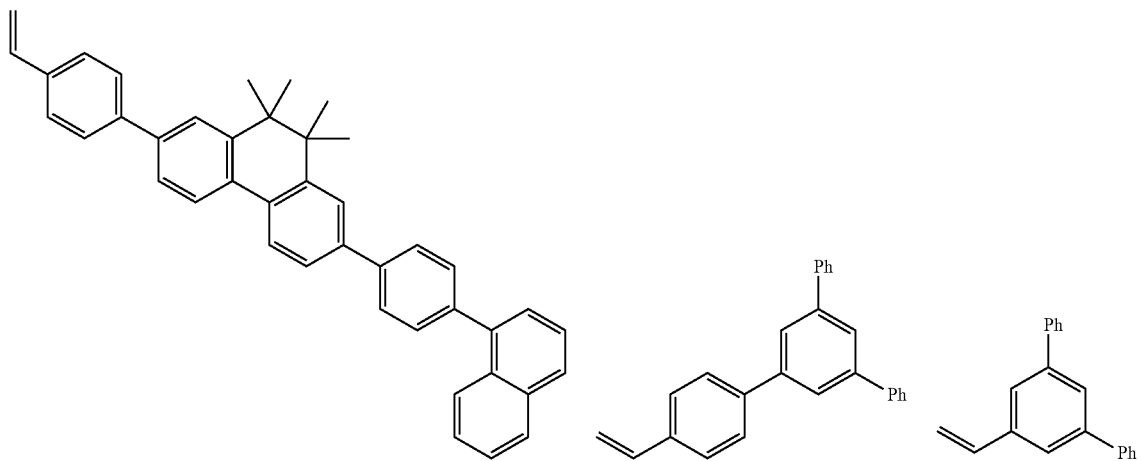
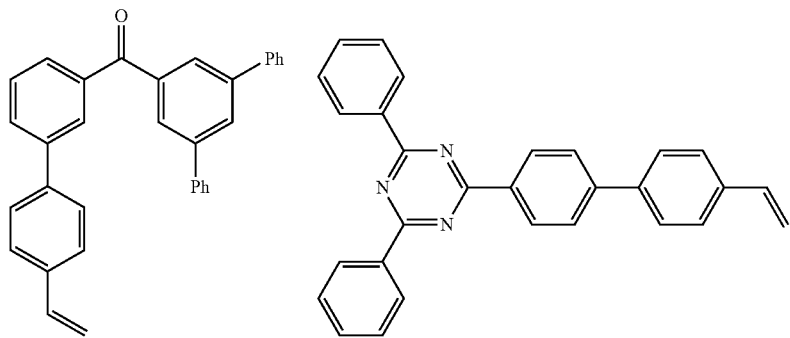
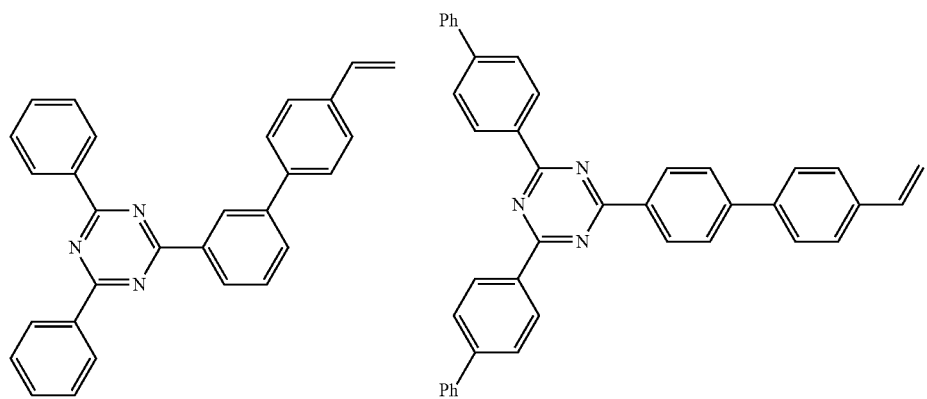

-continued

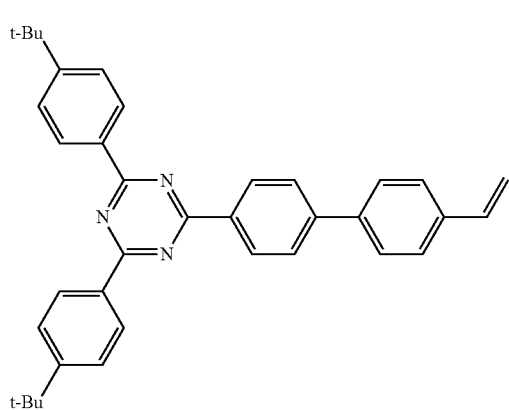
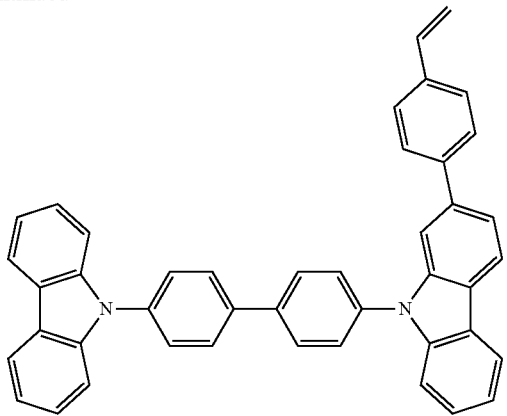

The composition according to the invention may preferably also comprise a solvent or solvent mixture.

The composition may furthermore comprise further assistants, such as stabilisers, substances which support film formation, sensitisers and the like.

The composition according to the invention can be used for the preparation of a polymer. The preparation of the polymer is preferably carried out by cationic, anionic, free-radical, ring-opening or coordinative polymerisation.

The polymer may in turn be dissolved in a solvent or solvent mixture, giving a formulation which is suitable for the production of electronic devices.

In a preferred embodiment of the blend according to the invention, the host molecule is selected from carbazole compounds of the formula (XIII)

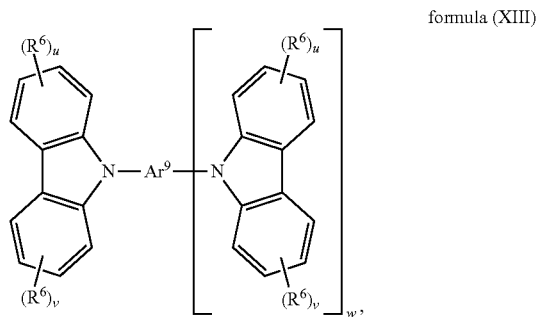

formula (XIII)

where the following applies to the symbols and indices used:

$Ar^g$ is on each occurrence an aromatic or heteroaromatic ring system having 5 to 60 aromatic ring atoms, which may be substituted by one or more radicals $R^6$;

$R^6$ is on each occurrence, identically or differently, H, D, F, Cl, Br, I, $N(Ar^{10})_2$, CN, $NO_2$, $Si(R^7)_3$, $B(OR^7)_2$, C(=O)$Ar^{10}$, P(=O)$(Ar^{10})_2$, S(=O)$Ar^{10}$, S(=O)$_2Ar^{10}$, —$CR^7$=$CR^7(Ar^{10})$, $OSO_2R^7$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^7$, where one or more non-adjacent $CH_2$ groups may be replaced by $R^7C$=$CR^7$, C≡C, $Si(R^7)_2$, $Ge(R^7)_2$, $Sn(R^7)_2$, C=O, C=S, C=Se, C=$NR^7$, P(=O)$(R^7)$, SO, $SO_2$, $NR^7$, O, S or $CONR^7$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^7$, or an aryloxy or heteroaryloxy group having 5 to 60 aromatic ring atoms, which may be substituted by one or more radicals $R^7$, or a combination of these systems; two or more substituents $R^6$ and/or $R^7$ here may also form a mono- or polycyclic, aliphatic or aromatic ring system with one another;

$Ar^{10}$ is on each occurrence, identically or differently, an aromatic or heteroaromatic ring system having 5 to 60 aromatic ring atoms, which may be substituted by one or more radicals $R^7$;

$R^7$ is on each occurrence, identically or differently, H, D or an aliphatic, aromatic and/or heteroaromatic hydrocarbon radical having 1 to 20 C atoms; or an aromatic or heteroaromatic ring system having 5 to 60 aromatic ring atoms, which may be substituted by one or more radicals R aliphatic, aromatic and/or heteroaromatic hydrocarbon radical having 1 to 20 C atoms; two or more substituents $R^7$ here may also form a mono- or polycyclic, aliphatic, aromatic or heteroaromatic ring system with one another;

R is on each occurrence, identically or differently, an H, D, $N(Ar^{10})_2$, a straight-chain alkyl group having 1 to 5 C atoms or branched alkyl group having 3 to 5 C atoms, where in each case one or more non-adjacent $CH_2$ groups may be replaced by —$R^8C$=$CR^8$— or —O— and where one or more H atoms may be replaced by F, or an aryl group having 6 to 16 C atoms or heteroaryl group having 2 to 16 C atoms or a spirobifluorene group, each of which may be substituted by one or more radicals $R^7$, or a combination of two of these systems, two or more substituents $R^7$ here may also form a mono- or polycyclic, aliphatic, aromatic or heteroaromatic ring system with one another.

u is on each occurrence, identically or differently, 0, 1, 2, 3 or 4;

v is on each occurrence, identically or differently, 0, 1, 2, 3 or 4; and w is 1, 2, 3, 4 or 5;

If the index w is equal to 1, this means that $Ar^9$ in compounds of the formula (III) represents a divalent group. If the index w is greater than 1, this means that in total three or more carbazole groups are bonded to the aromatic ring system $Ar^9$ in compounds of the formula (III). In compounds of the formula (III), $Ar^9$ is a trivalent group for w=2 and a correspondingly polyvalent group for w>2. The index w is preferably 1 or 2, particularly preferably w=1.

The carbazole compounds of the formula (III) employed in accordance with the invention preferably have a glass-transition temperature $T_g$ of greater than 120° C., particularly preferably greater than 140° C.

For the purposes of the present invention, the carbazole compound of the formula (III) serves principally as matrix material and/or as hole-transport material. A hole-transporting material in the sense of the present application is characterised by an HOMO of preferably greater than −5.4 eV. An electron-transporting material in the sense of the present application is characterised by an LUMO of preferably less than −2.4 eV. The HOMO and LUMO positions and the energy gap are preferably determined by cyclic voltammetry.

In a preferred embodiment of the present invention, the indices u in compounds of the formula (III) are on each occurrence, identically or differently, 0 or 1. The indices u are particularly preferably 0.

In an embodiment, the index v in the compound of the formula (III) is preferably, identically or differently on each occurrence, 0, 1 or 2, particularly preferably 0 or 1. If the index v is equal to 1, the substituent $R^6$ is preferably bonded in the 5-position or in the 7-position of the carbazole, particularly preferably in the 5-position. If the index v is equal to 2, the substituents $R^6$ are preferably bonded in the 5- and 7-position of the carbazole.

For the purposes of clarity, the numbering of the positions of the carbazole is depicted in the following formula:

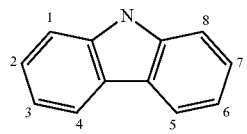

Preferred groups $Ar^9$ and $R^7$ in formula (III) contain only phenyl and/or naphthyl groups or heteroaromatic groups having not more than two condensed, aromatic or heteroaromatic rings, but no larger condensed aromatic systems. Preferred groups $Ar^9$ and $R^7$ are therefore aromatic ring systems built up from phenyl and/or naphthyl groups or linkings of these systems, such as, for example, biphenyl, fluorene and spirobifluorene.

Particularly preferred groups $Ar^9$ are selected from the group consisting of 1,2-phenylene, 1,3-phenylene, 1,4-phenylene, 1,3,5-benzene, 3,3'-biphenyl, 4,4'-biphenyl, 1,3,5-triphenylbenzene, triphenylamine, 2,7-fluorenylene, which may be substituted by one or more radicals $R^6$, 2,7-spirobifluorenylene, which may be substituted by one or more radicals $R^6$, indenofluorenylene, which may be substituted by one or more radicals $R^6$, 4,4'''-(1,1':2',1'':2'',1'''-quarter-phenyl), 4,4'-(2,2'-dimethylbiphenyl), 4,4'-(1,1'-binaphthyl), 4,4'-stilbenzyl and dihydrophenanthrenyl, which may be substituted by one or more radicals $R^6$.

Particularly preferred groups $R^7$ of the carbazole compound are selected, identically or differently, from the group consisting of phenyl, 1-naphthyl, 2-naphthyl, 2-carbazolyl, 3-carbazolyl, 9-carbazolyl, triphenylamine, naphthyldiphenylamine and dinaphthylphenylamine, each of which may be substituted by one or more radicals R. The two last-mentioned groups here may be bonded via the naphthalene in the 1- or 2-position or via the phenyl group. A 2- or 3-carbazolyl group here is preferably substituted on the nitrogen by an aromatic radical $Ar^9$.

Preference is furthermore given to compounds of the formula (III) in which the symbol R stands, identically or differently on each occurrence, for H, D, $N(Ar^{10})_2$, a straight-chain alkyl group having 1 to 5 C atoms or branched alkyl group having 3 to 5 C atoms, where in each case one or more non-adjacent $CH_2$ groups may be replaced by $-R^8C=CR^8-$ or $-O-$ and where one or more H atoms may be replaced by F, or an aryl group having 6 to 16 C atoms or heteroaryl group having 2 to 16 C atoms or a spirobifluorene group, each of which may be substituted by one or more radicals $R^7$, or a combination of two of these systems. Particularly preferred radicals R are, identically or differently on each occurrence, H, D, methyl, ethyl, isopropyl, tert-butyl, where in each case one or more H atoms may be replaced by F, or a phenyl, naphthyl or spirobifluorenyl group, which may in each case be substituted by one or more radicals R, or a combination of two of these systems. In the case of compounds which are processed from solution, linear or branched alkyl chains having up to 10 C atoms are particularly preferred. Bromine, boronic acid or boronic acid derivatives as substituents are preferred, above all, for use of this compound as intermediate compound for the preparation of further compounds according to the invention, for example polymers, oligomers or dendrimers.

Preference is furthermore given to compounds of the formula (III) in which the symbol $R^6$ is defined, identically or differently on each occurrence, correspondingly to the preferred substituent R or stands for $Ar^{10}$ or F.

Examples of further preferred compounds of the formula (III) are structures (III-1) to (III-91) depicted below.

(XIII-1)

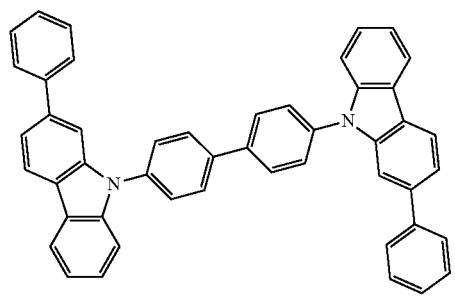

(XIII-2)

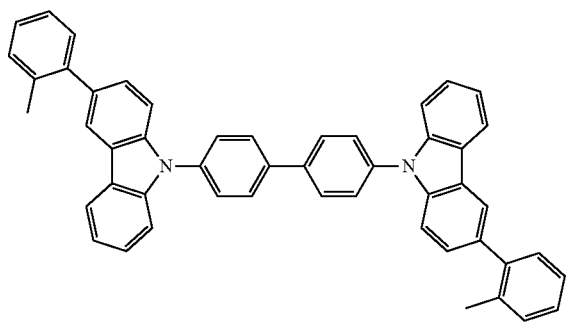

-continued
(XIII-3)
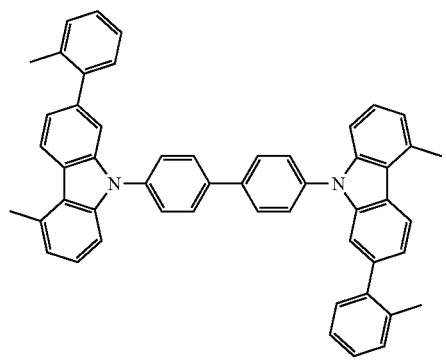
(XIII-4)
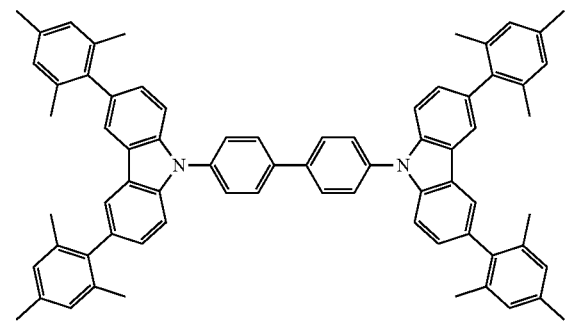
(XIII-5)
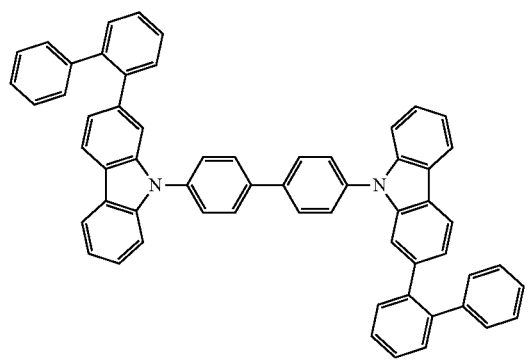
(XIII-6)
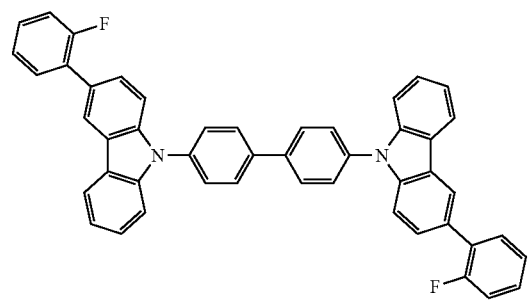
(XIII-7)
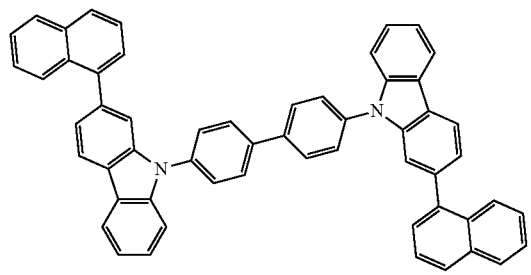
(XIII-8)
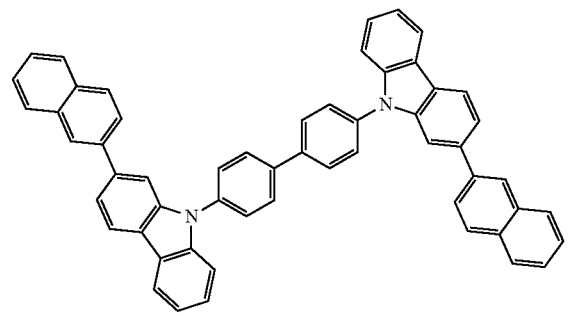
(XIII-9)
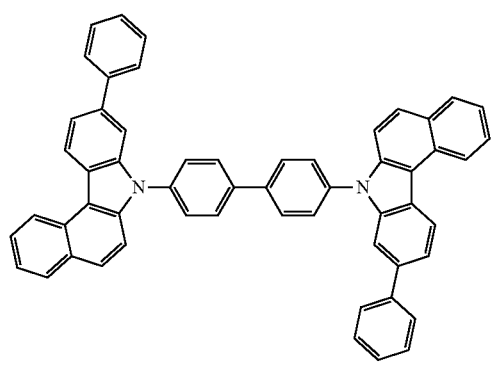
(XIII-10)
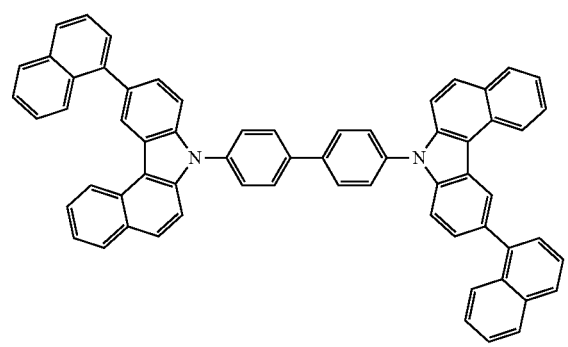

-continued
(XIII-11)
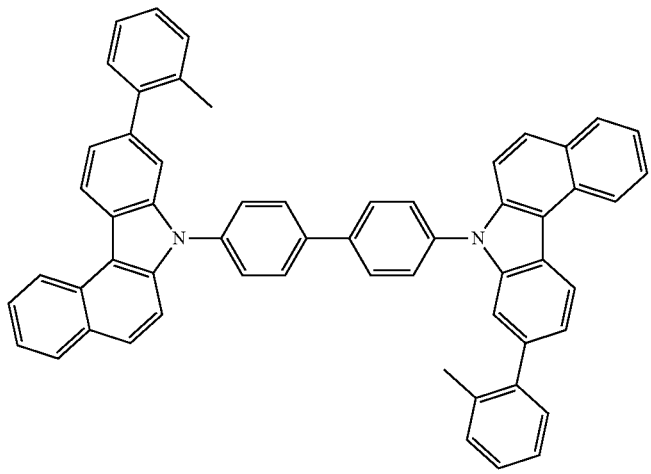
(XIII-12)
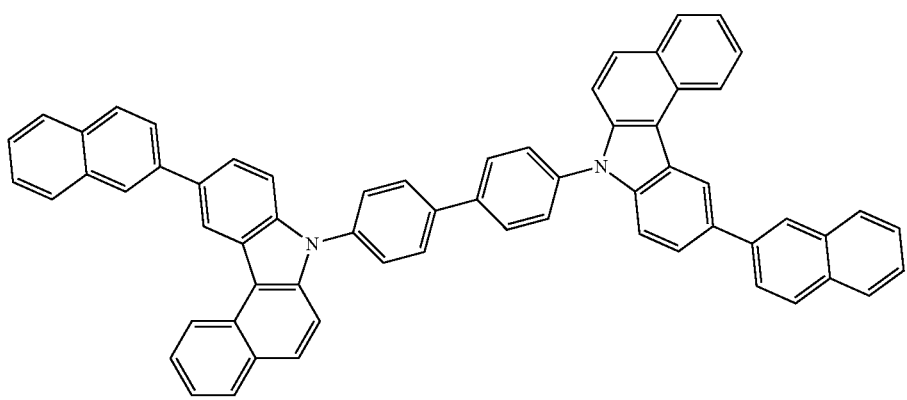
(XIII-13) (XIII-14)
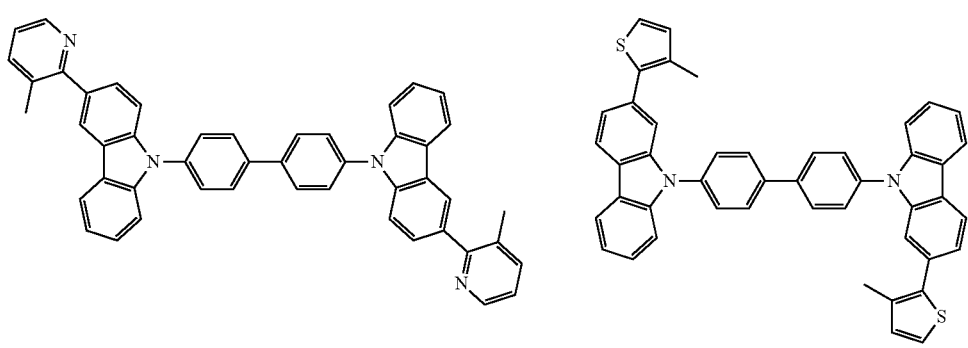
(XIII-15)
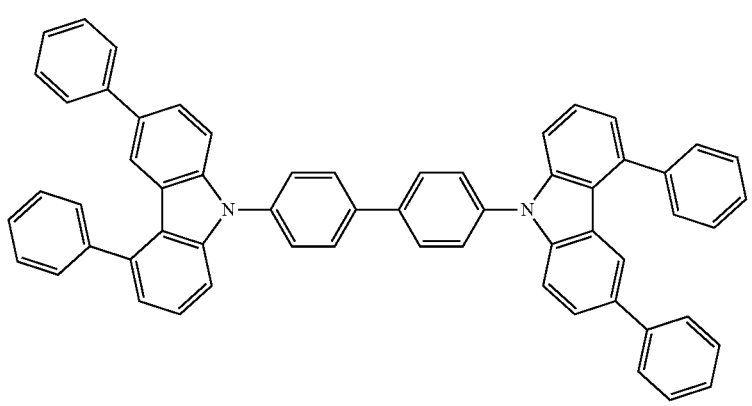

(XIII-16)
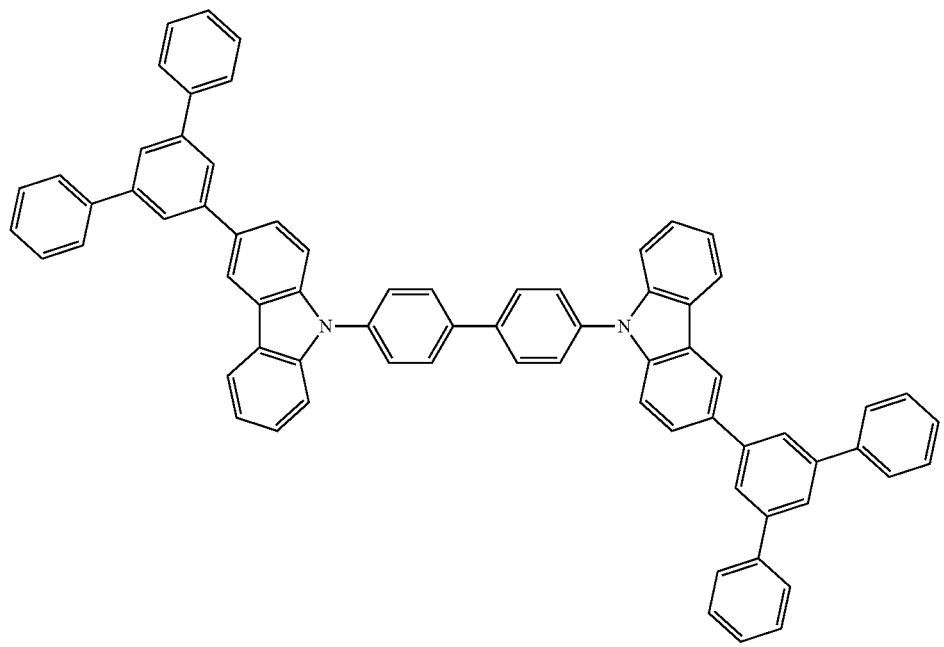
(XIII-17)
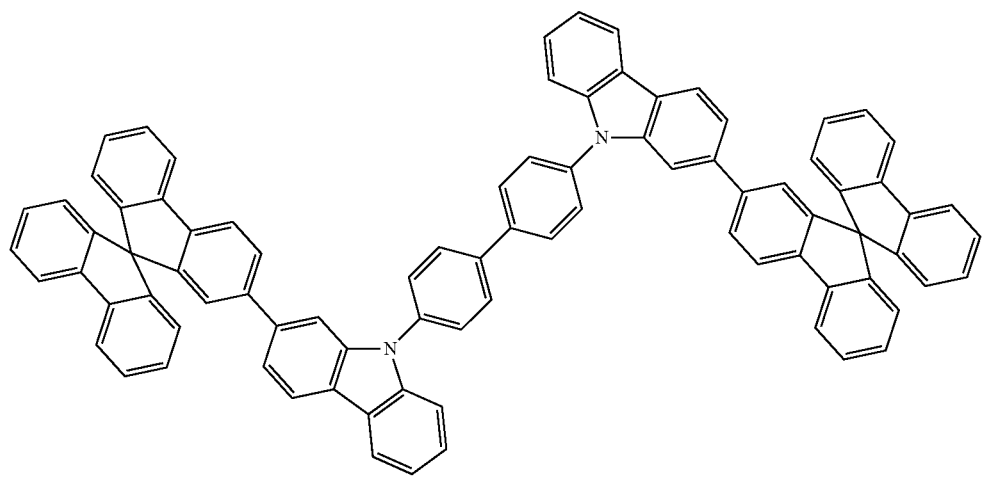
(XIII-18) (XIII-19)
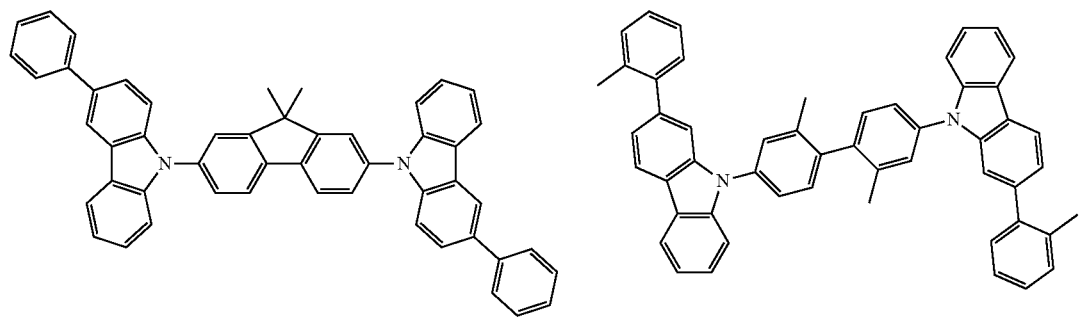

-continued
(XIII-20)
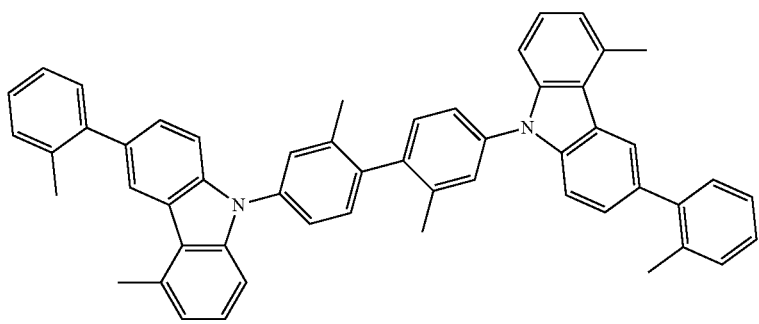
(XIII-21)
(XIII-22)
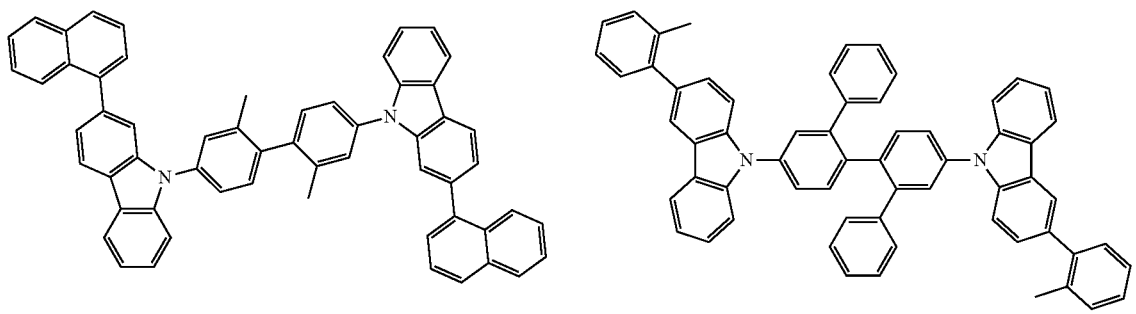
(XIII-23)
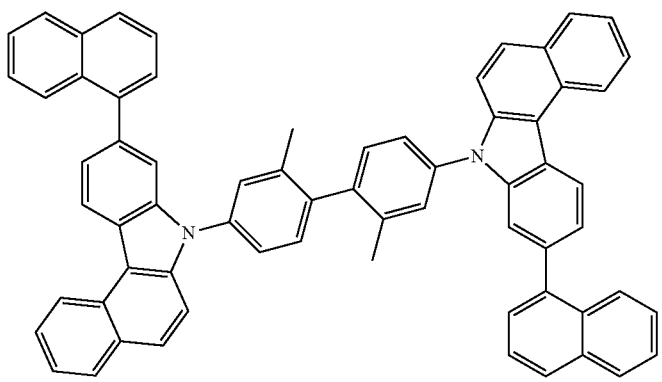
(XIII-24)
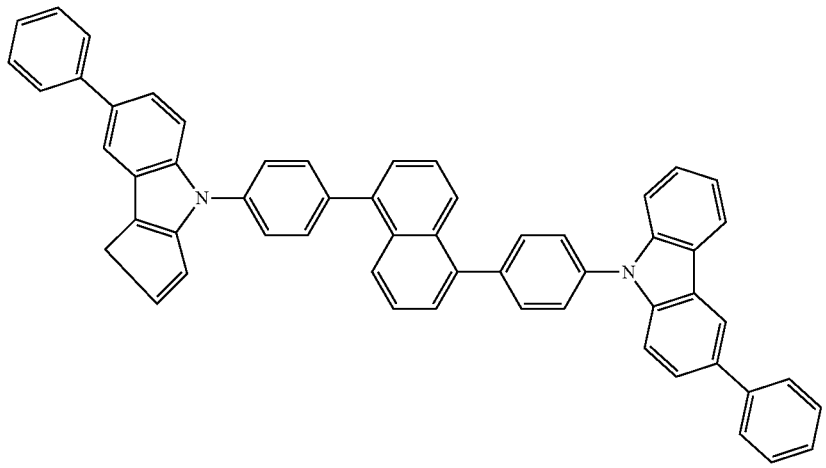

(XIII-25)
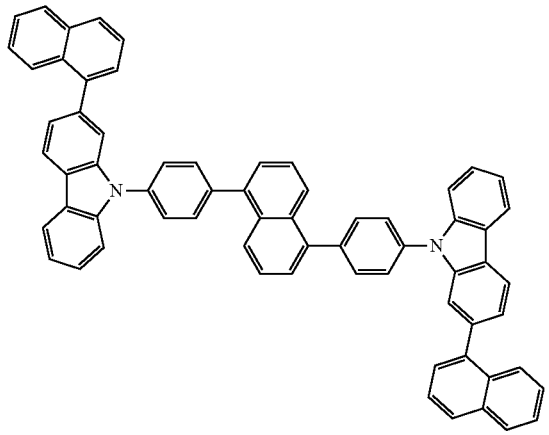
(XIII-26)
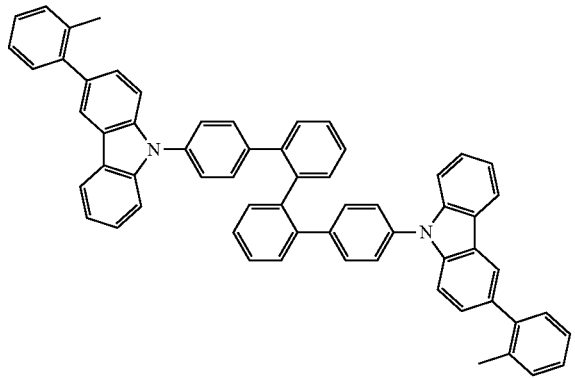
(XIII-27)
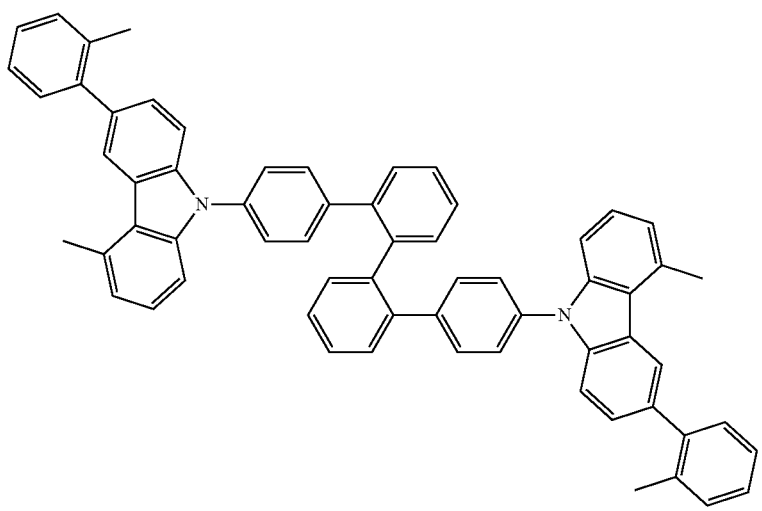
(XIII-28)
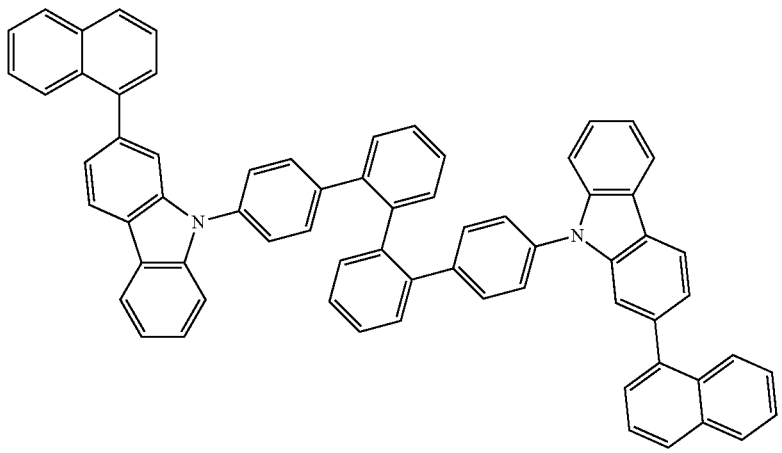

-continued
(XIII-29)
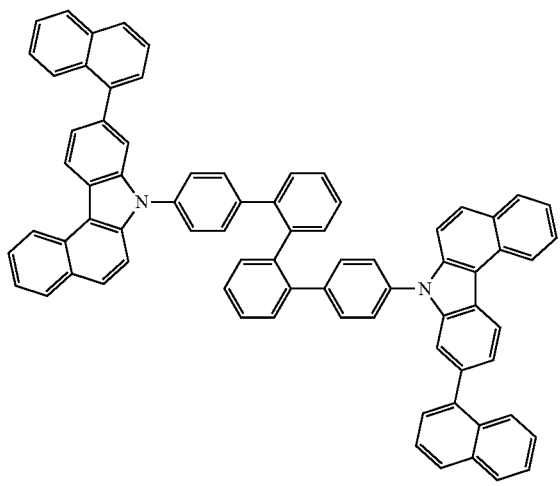
(XIII-30)
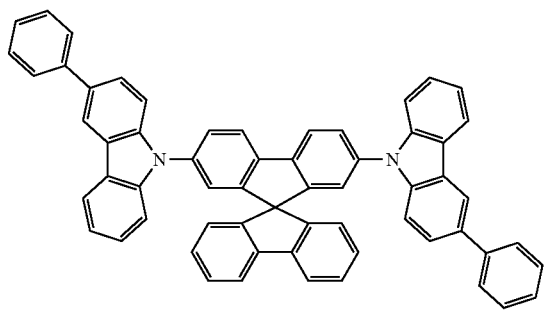
(XIII-31)
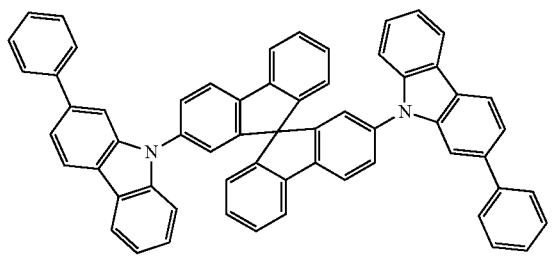
(XIII-32)
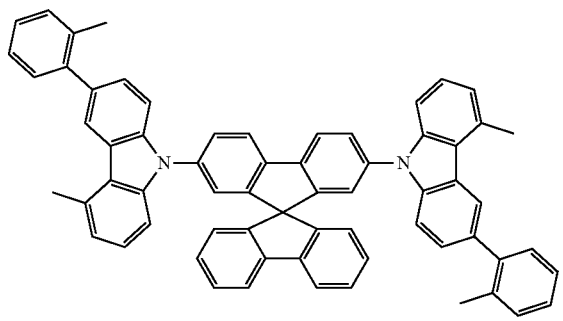
(XIII-33)
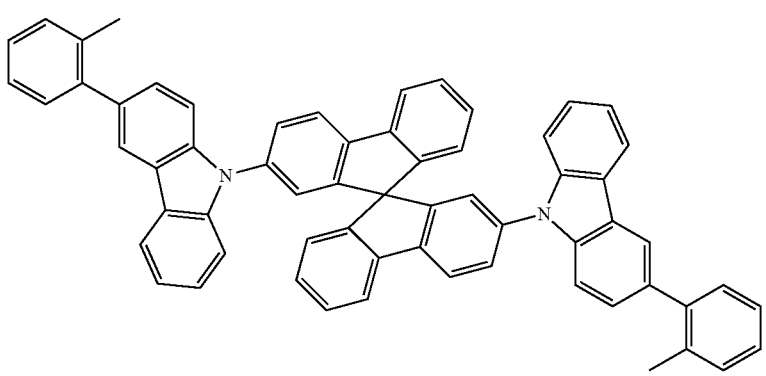
(XIII-34)
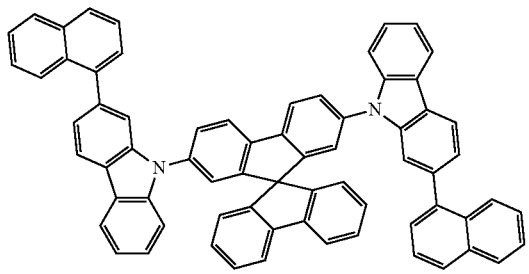
(XIII-35)
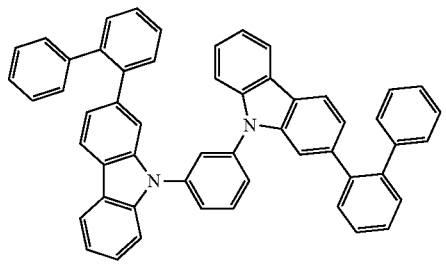

-continued
(XIII-36)
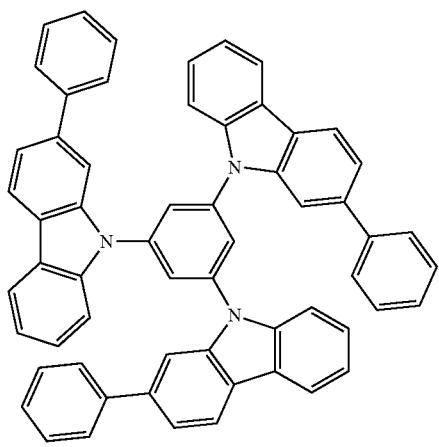
(XIII-37)
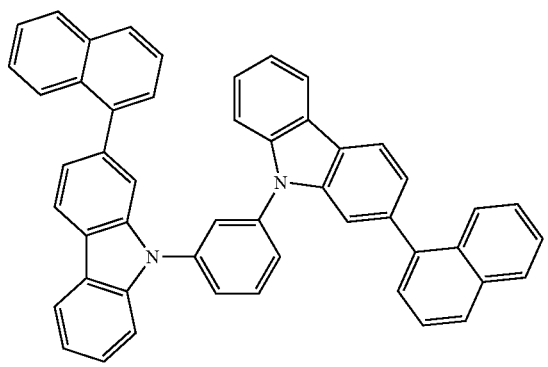
(XIII-38)
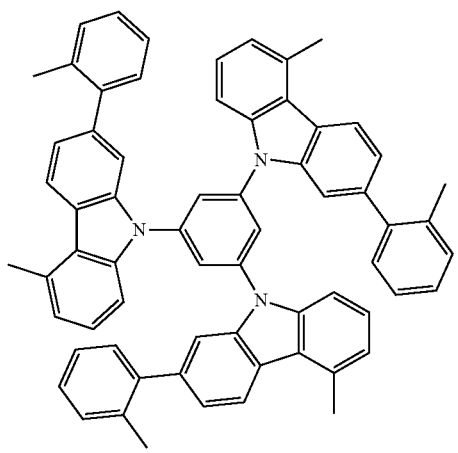
(XIII-39)
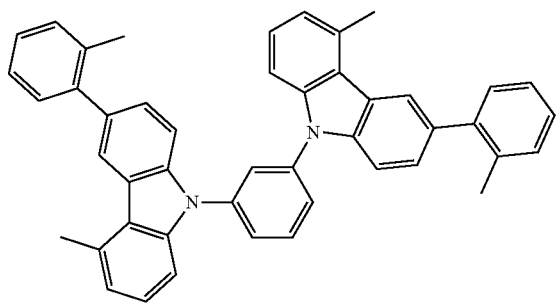
(XIII-40)
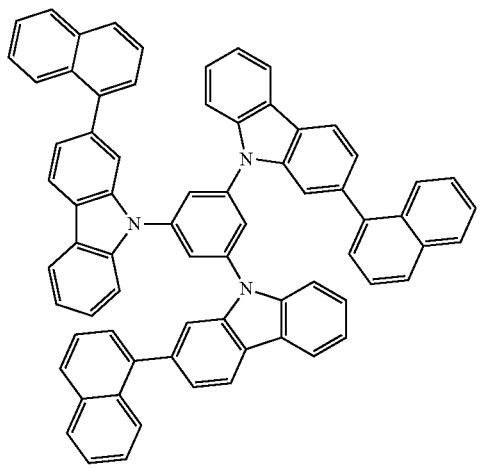
(XIII-41)
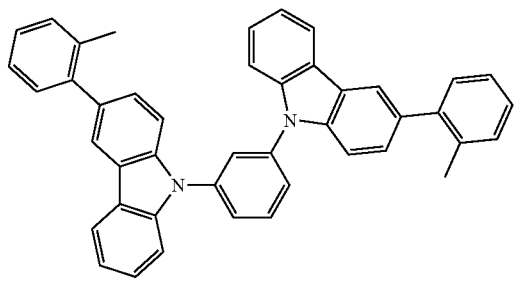

-continued
(XIII-42)
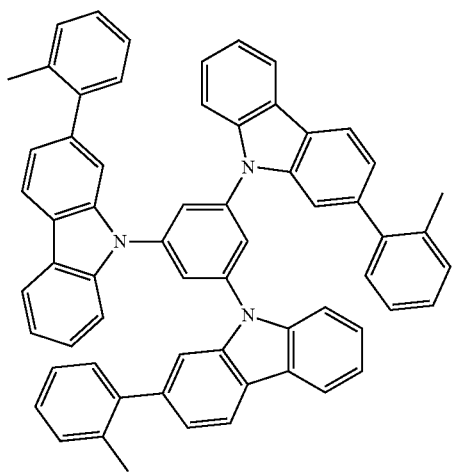
(XIII-43)
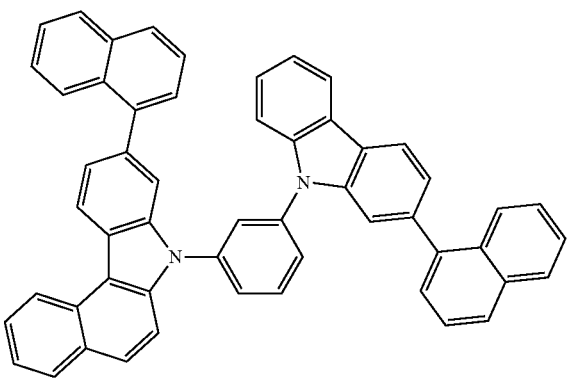
(XIII-44)
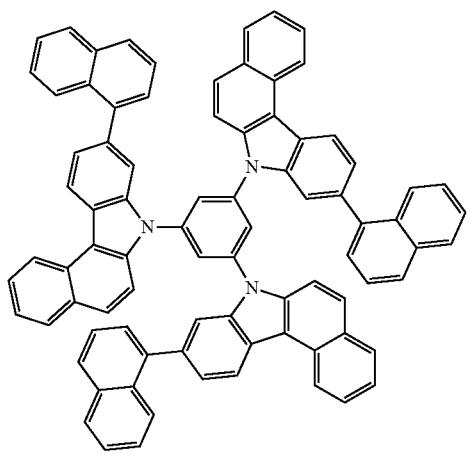
(XIII-45)
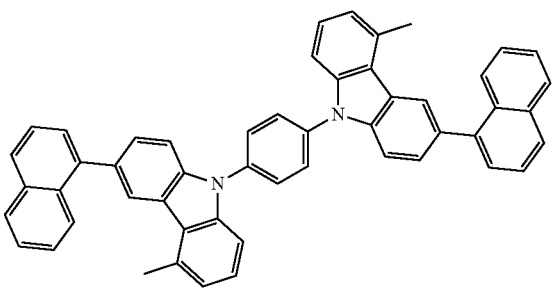
(XIII-46)
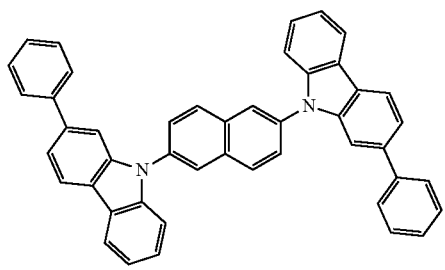
(XIII-47)
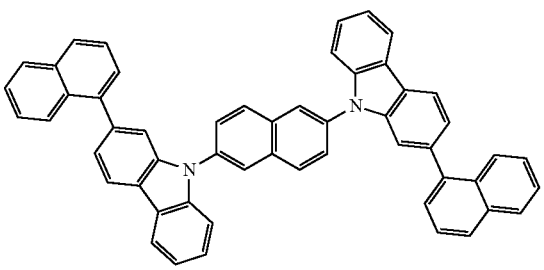

-continued
(XIII-48)
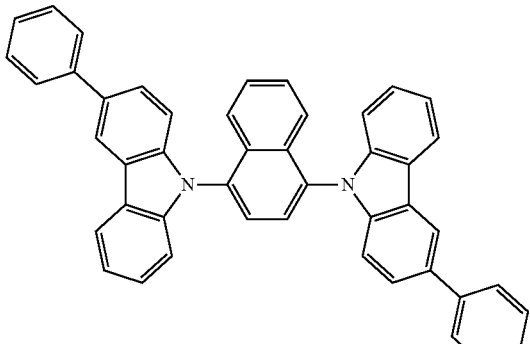
(XIII-49)
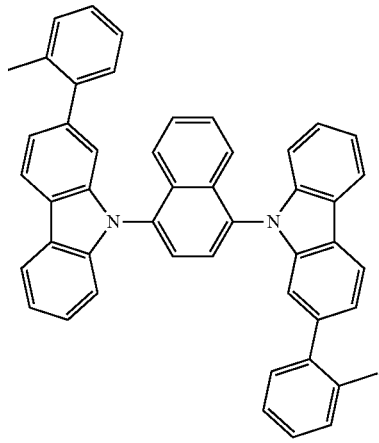
(XIII-50)
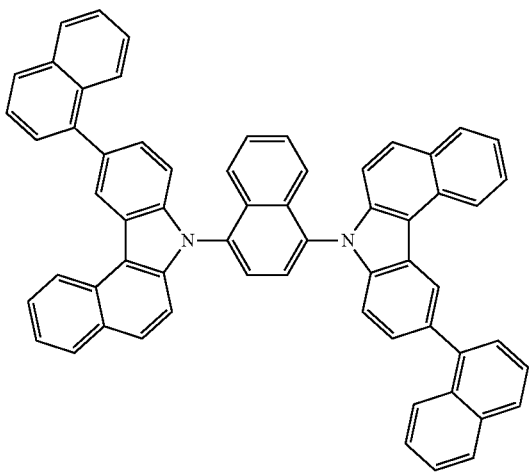
(XIII-51)
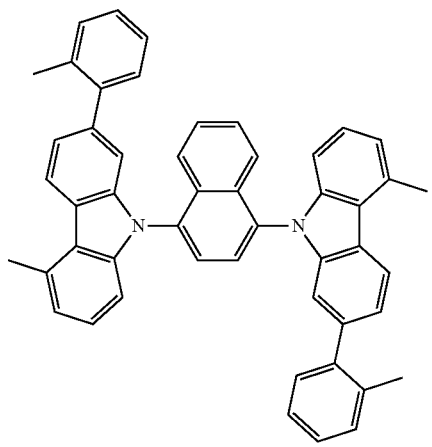
(XIII-52)
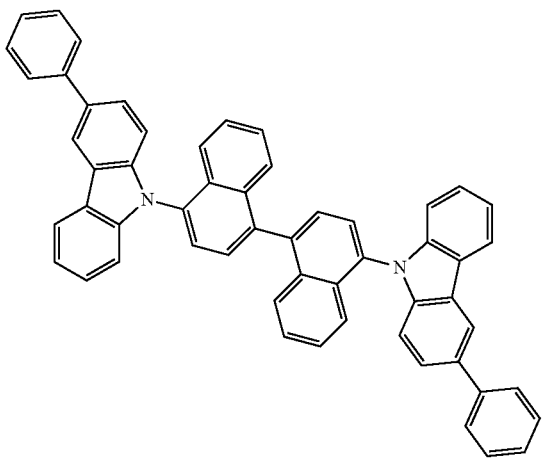
(XIII-53)
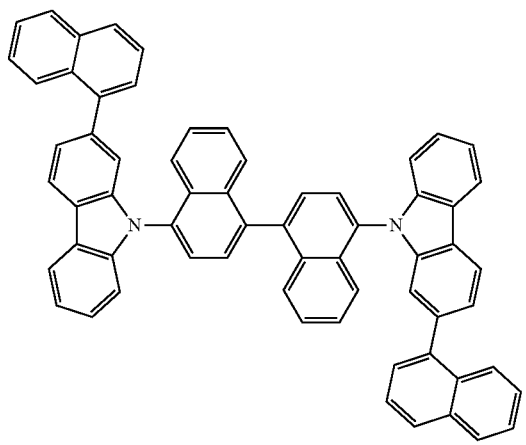

-continued
(XIII-54)
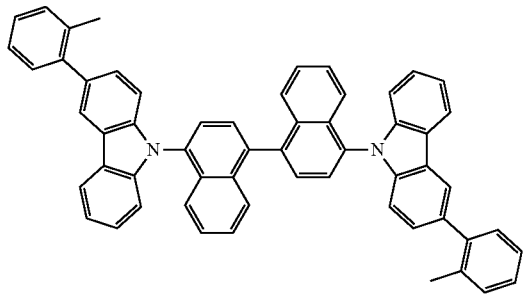
(XIII-55)
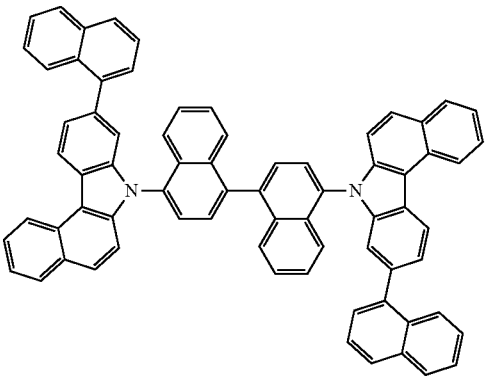
(XIII-56)
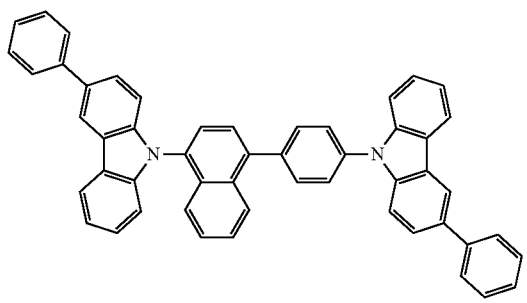
(XIII-57)
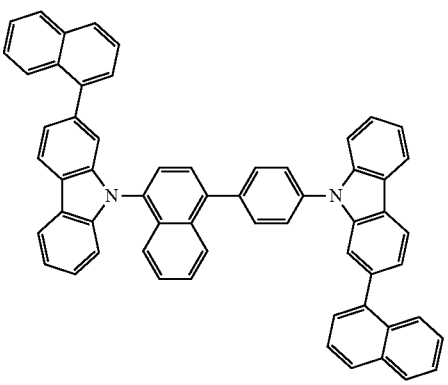
(XIII-58)
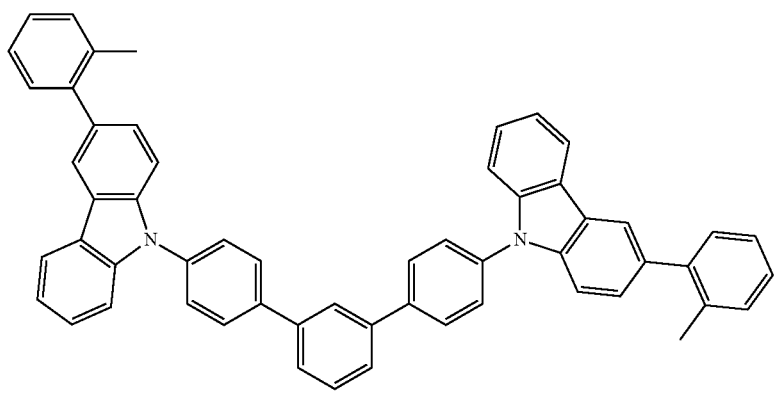
(XIII-59)
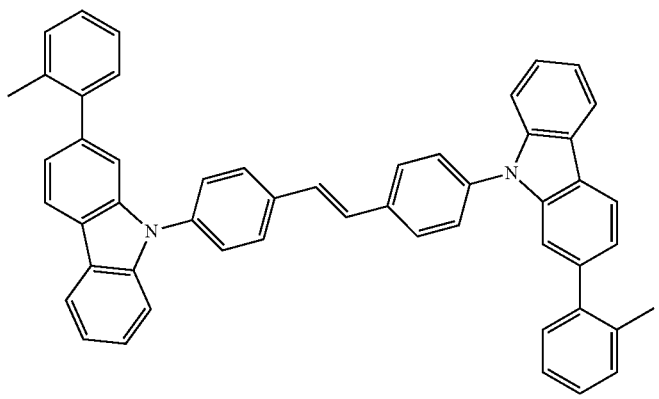

(XIII-60)
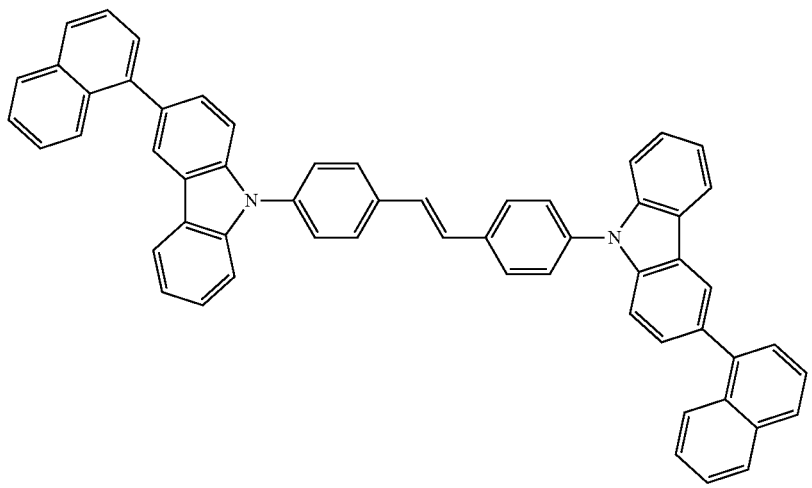
(XIII-61)
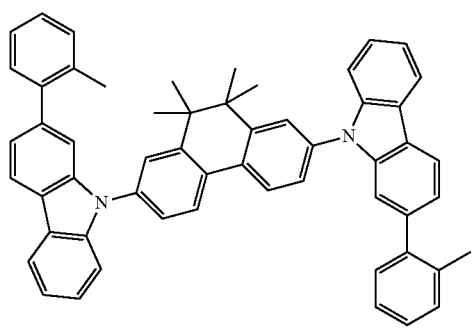
(XIII-62)
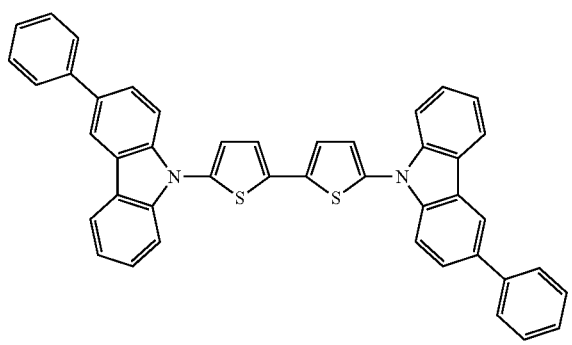
(XIII-63)
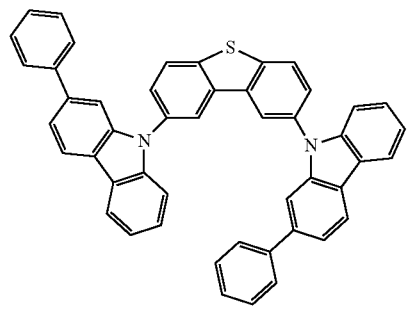
(XIII-64)
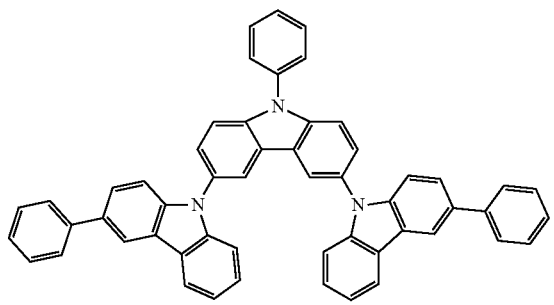

(XIII-65)
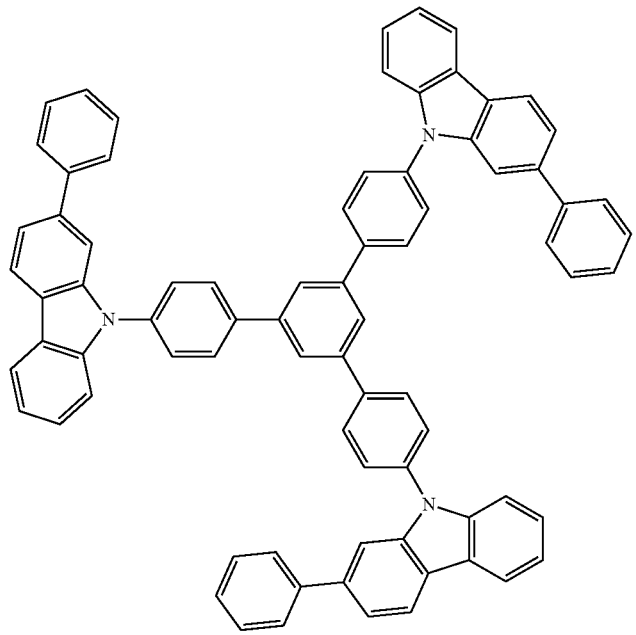
(XIII-66)
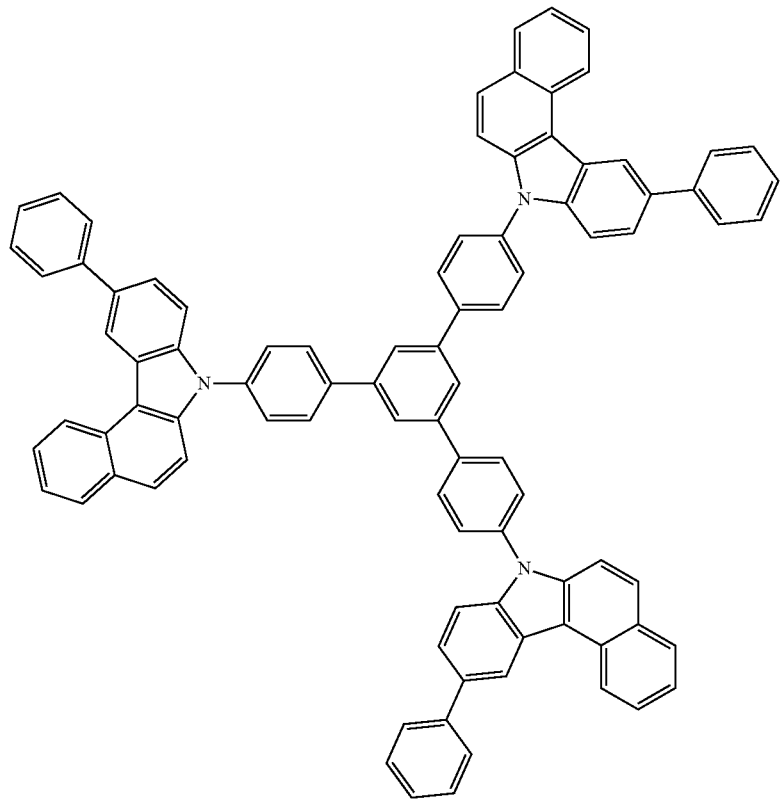

-continued
(XIII-67)
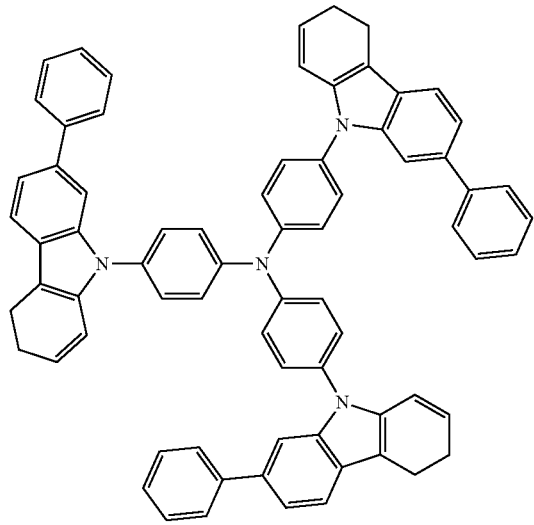
(XIII-68)
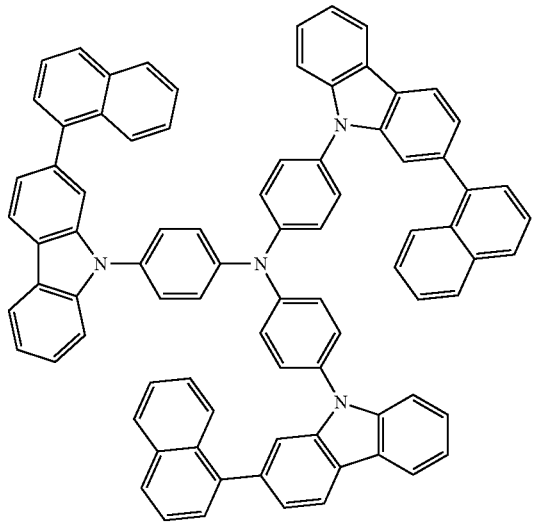
(XIII-69)
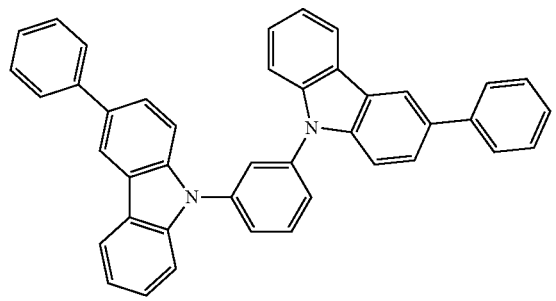
(XIII-70)
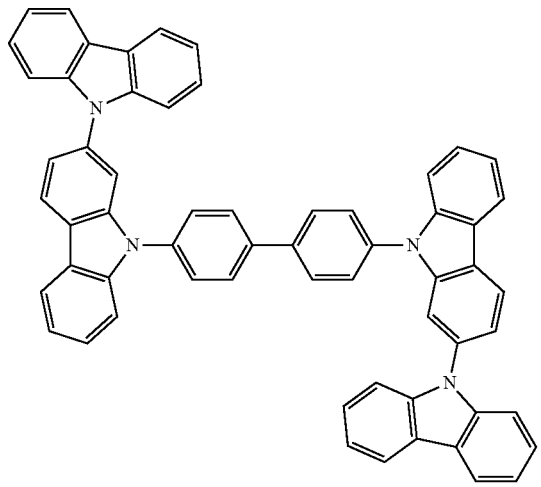
(XIII-71)
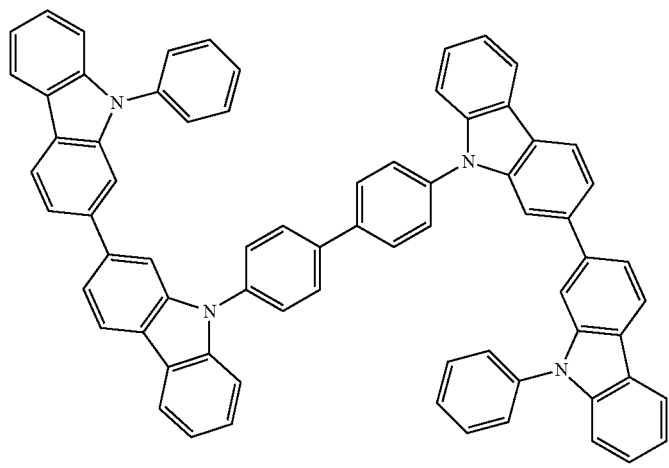

(XIII-72)
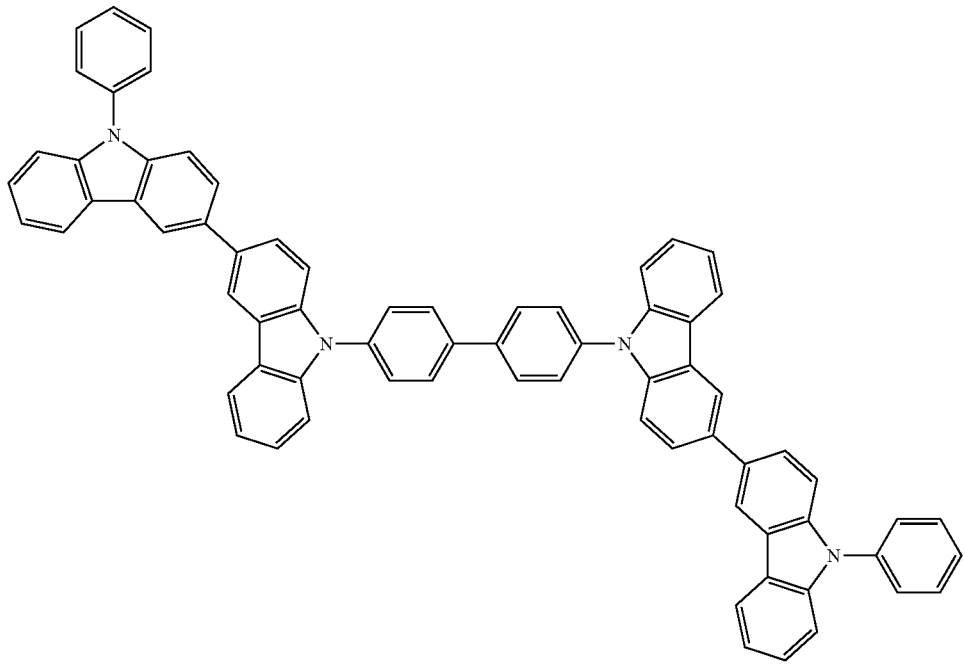
(XIII-73) (XIII-74)
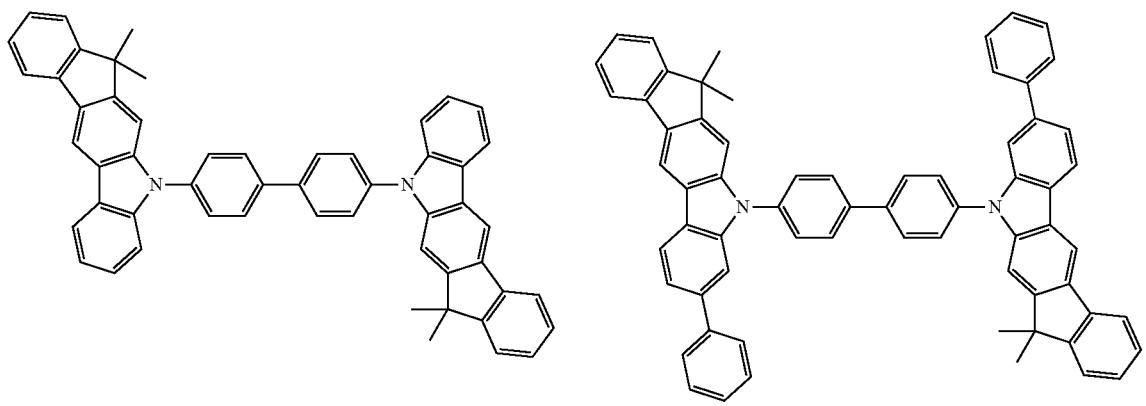
(XIII-75) (XIII-76)
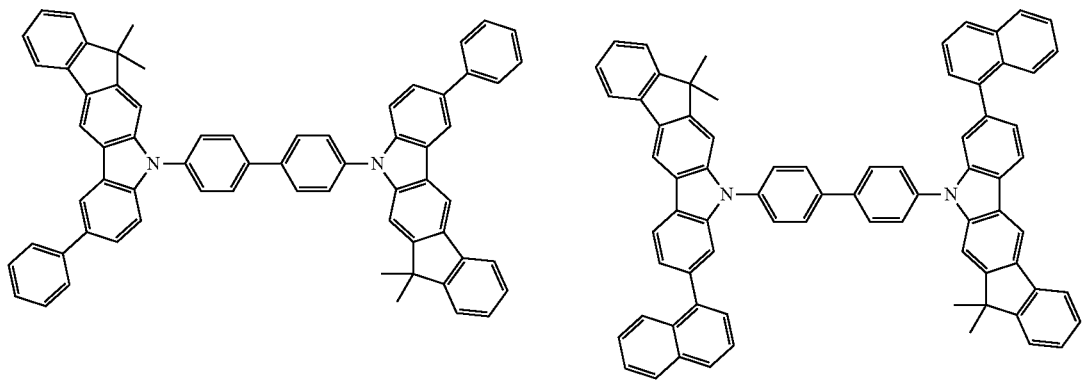

-continued
(XIII-77)
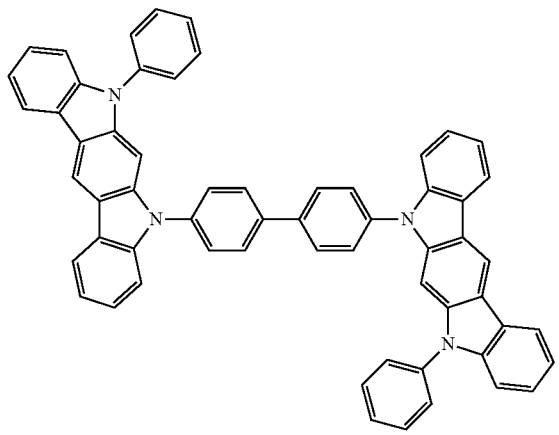
(XIII-78)
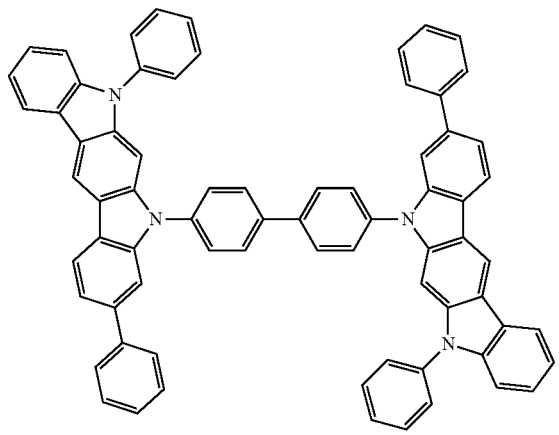
(XIII-79)
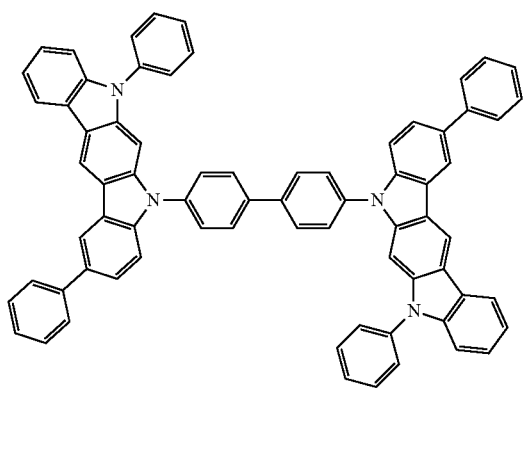
(XIII-80)
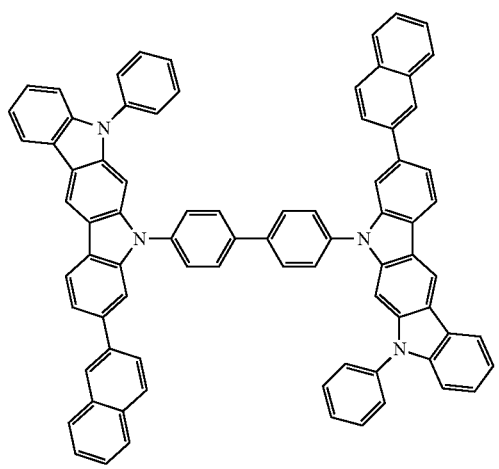
(XIII-81)
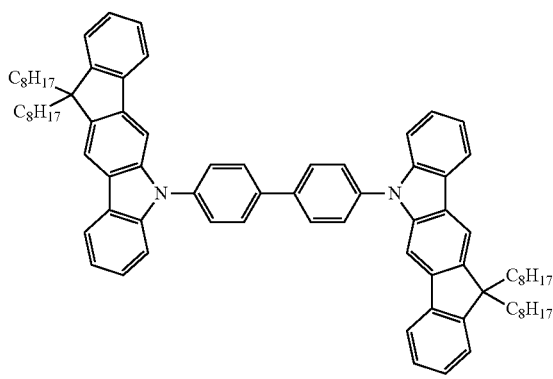
(XIII-82)
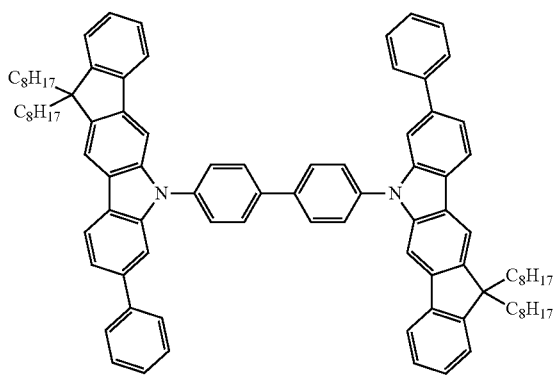

-continued
(XIII-83)
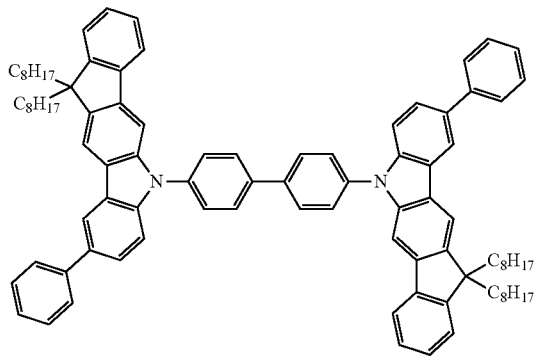
(XIII-84)
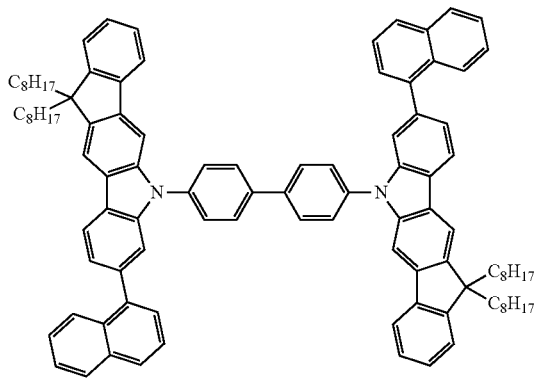
(XIII-85)
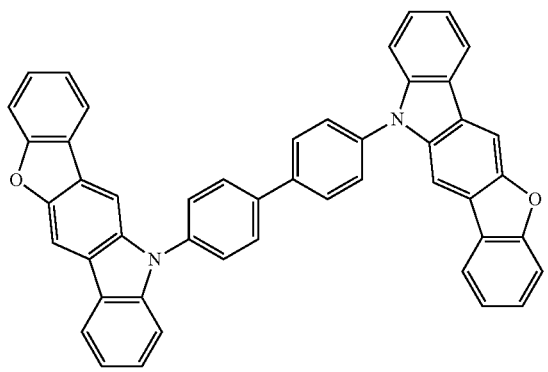
(XIII-86)
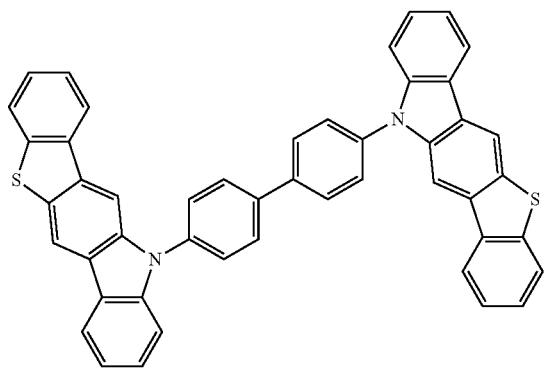
(XIII-87)
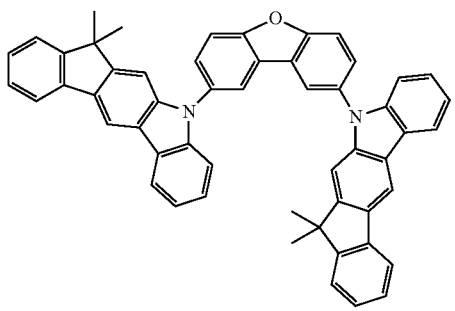
(XIII-88)
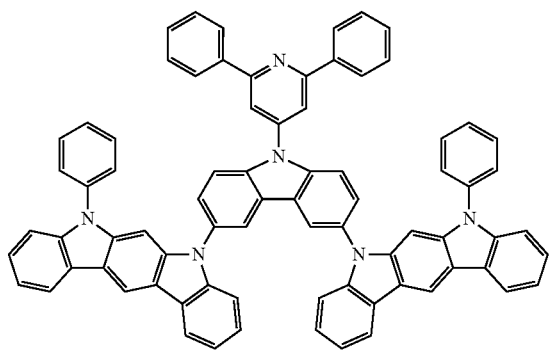
(XIII-89)
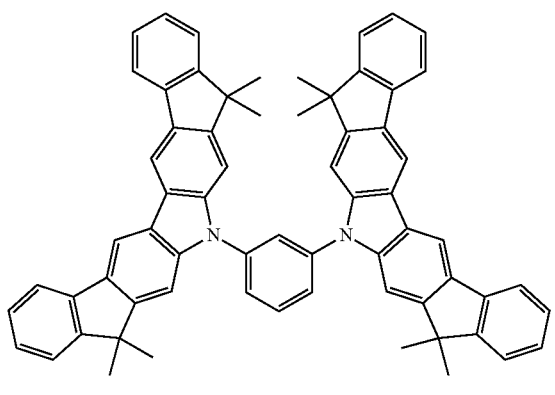
(XIII-90)
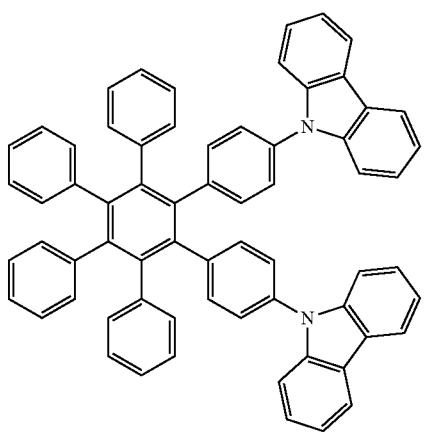

(XIII-91)

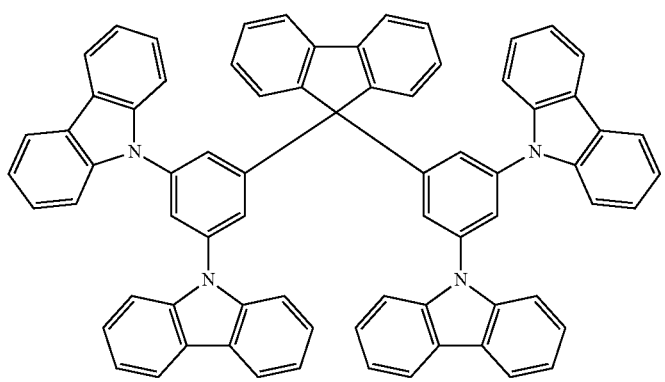

The carbazole compounds of the formula (III) employed in accordance with the invention can be synthesised by standard methods of organic chemistry, as also disclosed in detail in WO 2008/086851. The contents of this specification are incorporated into the present invention by way of reference.

Thus, it is known that 2-nitrobiphenyl derivatives can be reacted with a trialkyl phosphite to give the corresponding carbazole derivatives (M. Tavasli et al., *Synthesis* 2005, pp. 1619-1624). This reaction can be used to build up 2-aryl-substituted carbazole derivatives by firstly building up a corresponding aryl-substituted 2-nitrobiphenyl derivative, which is subsequently reacted with trialkyl phosphite. The 2-aryl-substituted carbazole derivative can be coupled to a dibromoaromatic compound in a Hartwig-Buchwald coupling under standard conditions to give the compound of the formula (III). The various methods and reaction conditions for carrying out the Hartwig-Buchwald coupling are known to the person skilled in the art of organic synthesis. Instead of a dibromoaromatic compound, it is also possible to use corresponding compounds containing different leaving groups, for example chlorine, iodine, triflate, tosylate or sulfonates in general. The use of trisubstituted aromatic compounds or compounds containing even more leaving groups enables compounds of the formula (III) in which the index w stands for 2 or more to be synthesised correspondingly.

The synthesis of compounds of the formula (III) is depicted in Scheme 1 below, where, for the purposes of clarity, w was selected to be 1 and no substituents R or $R^6$ are depicted:

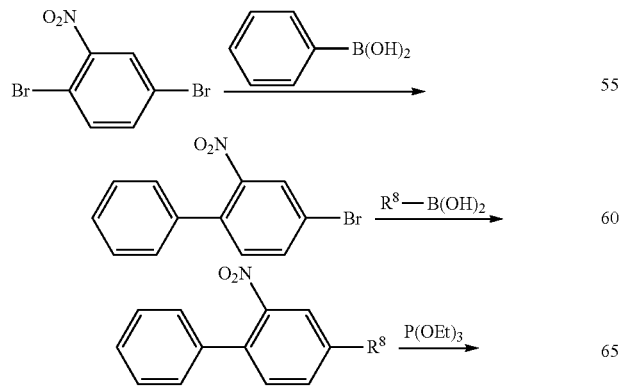

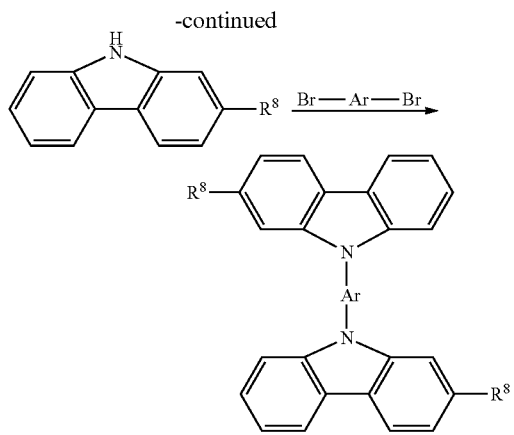

In addition or as an alternative to the above-mentioned carbazole compounds, the host molecule present may be a neutral compound, which is preferably a pure hydrocarbon compound, in particular an aromatic hydrocarbon compound.

Particular preference is given here to neutral compounds of the general formulae (XIV) or (XV)

formula (XIV)

formula (XV)

where the following applies to the symbols and indices used:

$X^1$ is on each occurrence, identically or differently, $CR^8$; or two directly adjacent groups $X^1$ stand for a unit of the following formula (XVI),

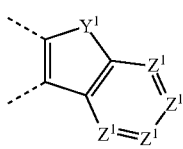

formula (XVI)

where the dashed bonds indicate the linking of the unit to the adjacent C atoms;

$Y^1$ is on each occurrence, identically or differently, a single bond or a group selected from $C(R^8)_2$, $C(=C(R^8)_2)$, $Si(R^8)_2$, $C(R^8)_2—C(R^8)_2$, or $CR^8=CR^8$;

$Z^1$ is on each occurrence, identically or differently, $CR^8$;

$R^8$ is on each occurrence, identically or differently, H, D, a straight-chain alkyl, alkenyl or alkynyl group having 1 to 40 C atoms or a branched or cyclic alkyl, alkenyl or alkynyl group having 3 to 40 C atoms, each of which may be substituted by one or more radicals $R^{10}$, or an aromatic or heteroaromatic ring system having 5 to 60 aromatic ring atoms, which may in each case be substituted by one or more radicals $R^{10}$, or a combination of these systems; two or more adjacent substituents $R^8$ here may also form a mono- or polycyclic, aliphatic or aromatic ring system with one another; or unit of the general formula (XVII)

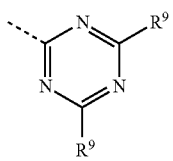

formula (XVII)

where the dashed bonds indicates the linking of the unit to the adjacent C atoms;

$R^9$ is on each occurrence, identically or differently, H, D or an aromatic or heteroaromatic ring system having 5 to 60 aromatic ring atoms, which may be substituted by one or more radicals $R^8$;

$R^{10}$ is on each occurrence, identically or differently, H, D or an aliphatic, aromatic and/or heteroaromatic hydrocarbon radical having 1 to 20 C atoms, in which, in addition, H atoms may be replaced by F; two or more adjacent substituents $R^{10}$ here may also form a mono- or polycyclic, aliphatic or aromatic ring system with one another; and x is 1 or 2.

The neutral compounds and thus also the compounds of the formula (XIV) preferably have a glass-transition temperature $T_g$ of greater than 70° C., particularly preferably greater than 100° C. and very particularly preferably greater than 110° C.

As evident from the formula (XIV), x=2 means that two aryl radicals which are substituted in the 3,5-position are bonded in the compound in the 9,9-position of the fluorene or the corresponding derivative, while n=1 means that one such aryl radical is present and furthermore a group $R^8$.

In an embodiment of the invention, the symbol $X^1$ preferably stands, identically or differently on each occurrence, for $CR^8$.

The symbol $Z^1$ in the unit of the formula (XIV) preferably stands for $CR^8$.

A preferred embodiment of the compounds of the formula (XIV) are the compounds of the formula (XVIII), (XIX) and (XX):

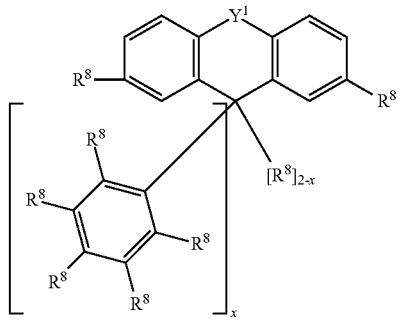

formula (XVIII)

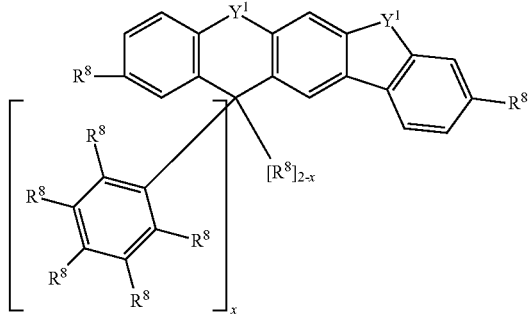

formula (XIX)

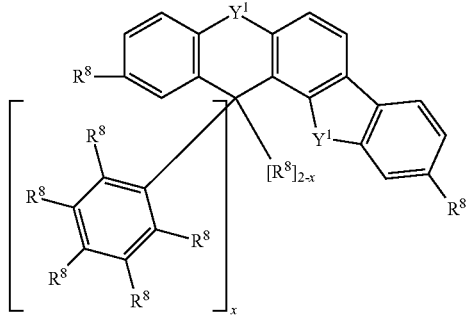

formula (XX)

where the symbols and indices used have the meanings indicated above.

Preference is furthermore given to the compounds of the formulae (XXI), (XXII) and (XXIII):

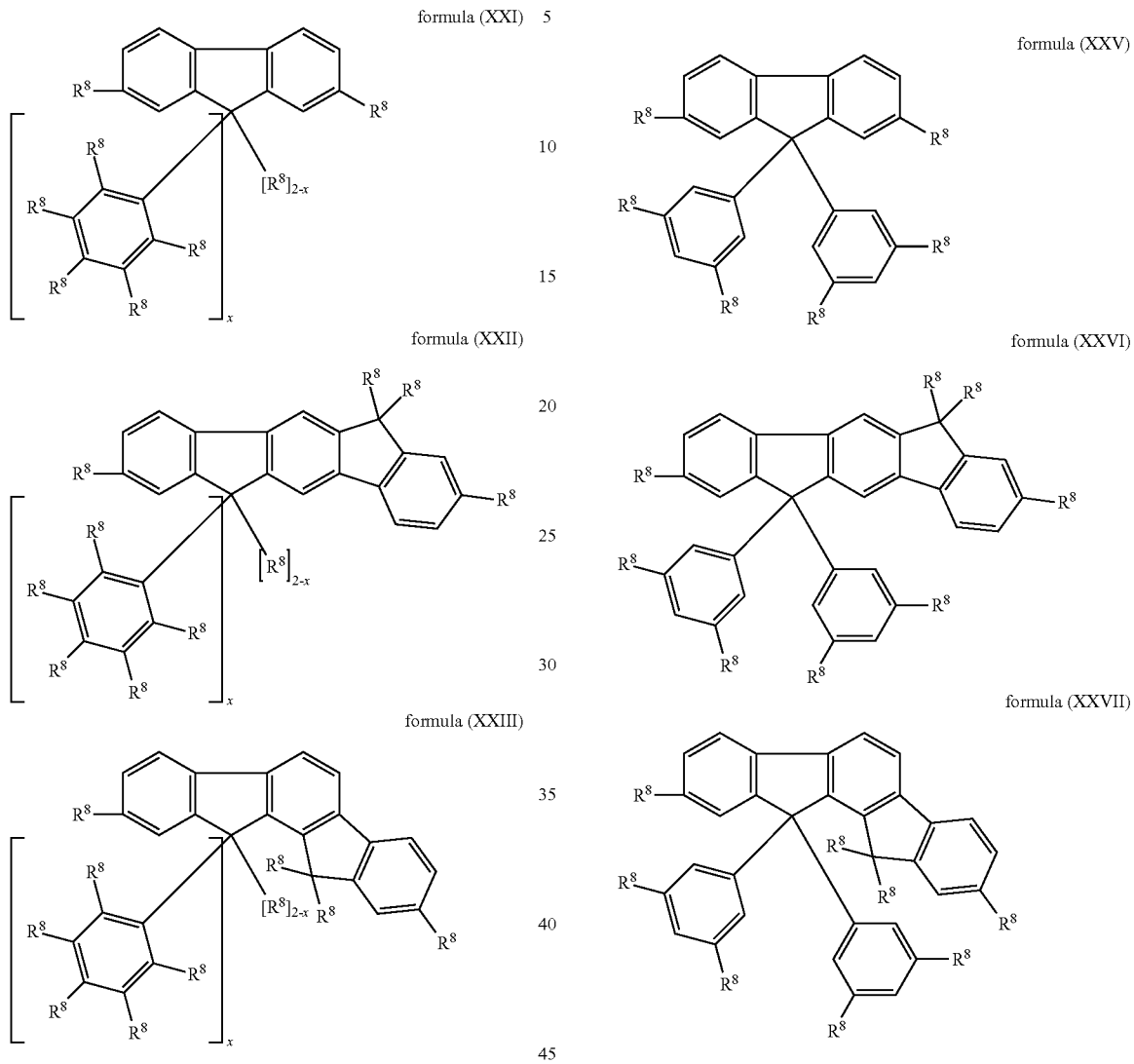

where the symbols and indices used have the meanings given above.

In a preferred embodiment of the invention, x=2.

A further preferred embodiment of the compounds of the formula (XIV) are the compounds of the formula (XXIV):

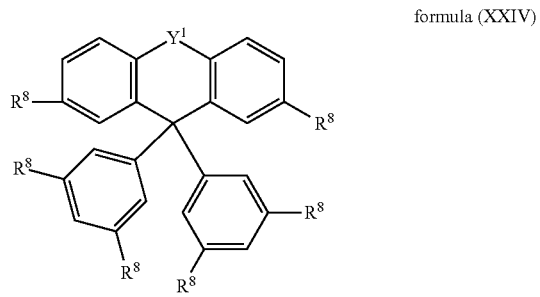

where the symbols used have the meanings indicated above.

A particularly preferred embodiment of the present invention are the compounds of the following formulae (XXV), (XXVI) and (XXVII)

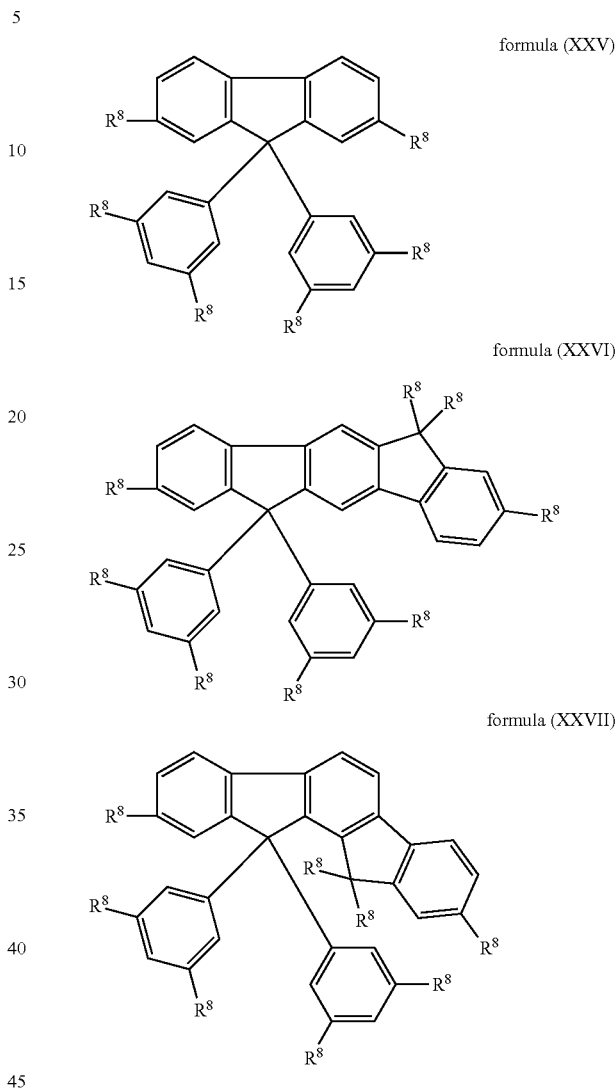

where the symbols and indices used have the meanings given above.

In a further embodiment of the present invention, the symbol $R^8$ in compounds of the above-mentioned formulae (XIV) to (XXVII) stands, identically or differently on each occurrence, for an aromatic or heteroaromatic ring system having 5 to 30 aromatic ring atoms, which may be substituted by one or more non-aromatic radicals $R^8$. Substituents $R^8$ which are furthermore preferred are halogen, preferably Br and I, O-tosylate, O-triflate, $O-SO_2R^{10}$, $B(OR^{10})_2$ and $Sn(R^{10})_3$, particularly preferably Br, since these are valuable intermediates in the synthesis of further compounds according to the invention.

In a further preferred embodiment of the present invention, all symbols $R^8$ in compounds of the above-mentioned formulae (XIV) to (XXVII) are selected identically. This preference can be explained by the easier synthetic accessibility of the compounds.

Examples of preferred compounds of the formulae (XIV) to (XXVII) are structures (XIV-1) to (XIV-32) depicted below.

| 81 | 82 |
|---|---|
| (XIV-1) 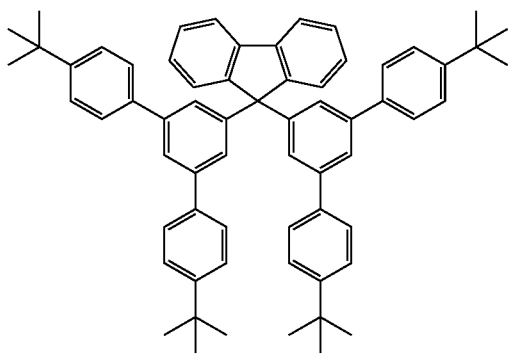 | (XIV-2) 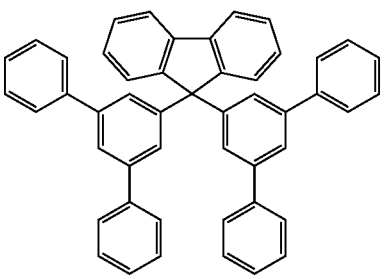 |
| (XIV-3) 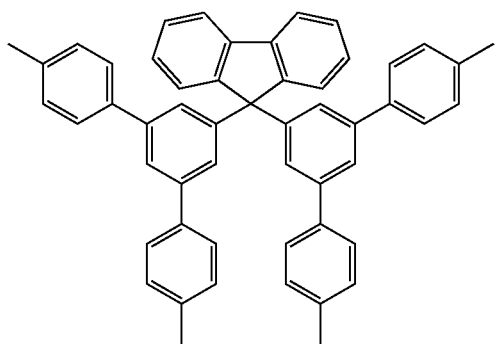 | (XIV-4) 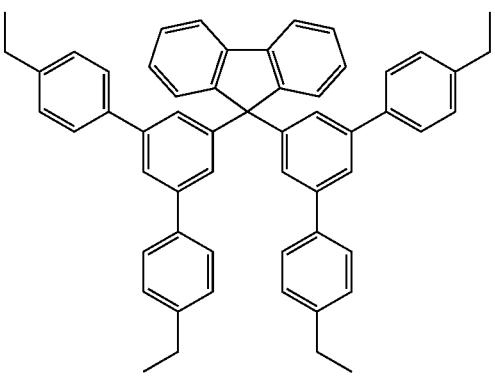 |
| (XIV-5) 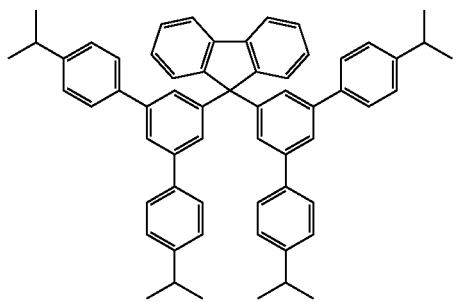 | (XIV-6) 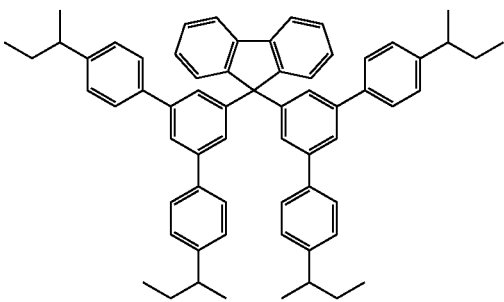 |
| (XIV-7) 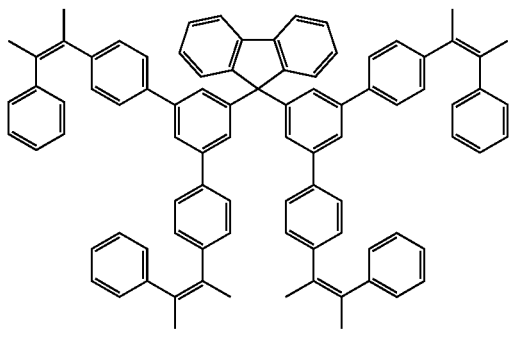 | (XIV-8) 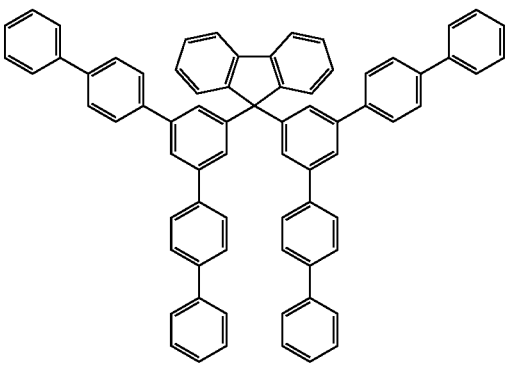 |

-continued
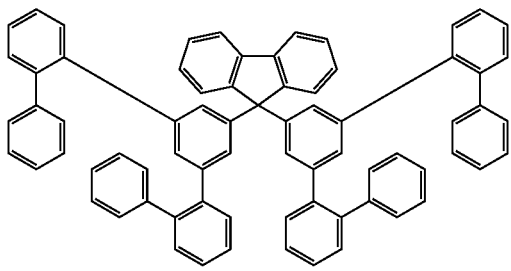
(XIV-9)
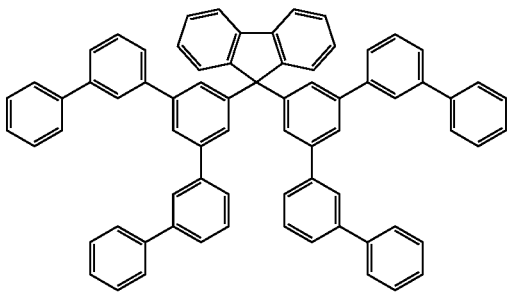
(XIV-10)
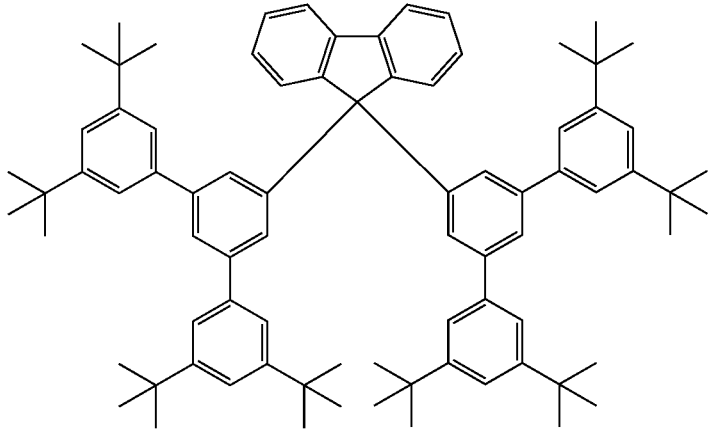
(XIV-11)
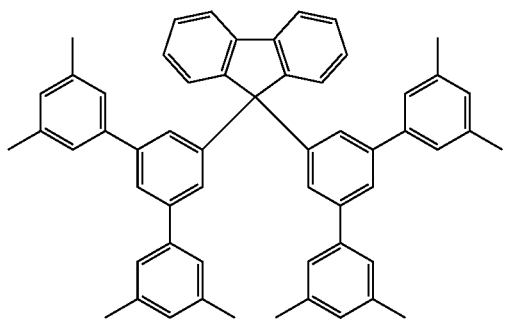
(XIV-12)
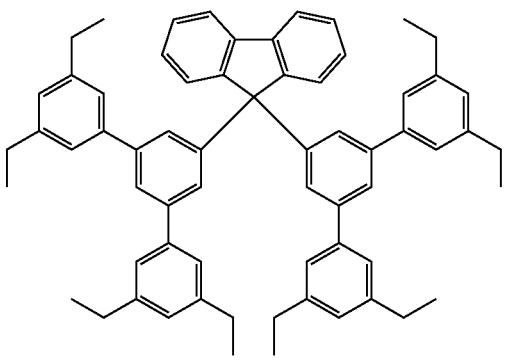
(XIV-13)
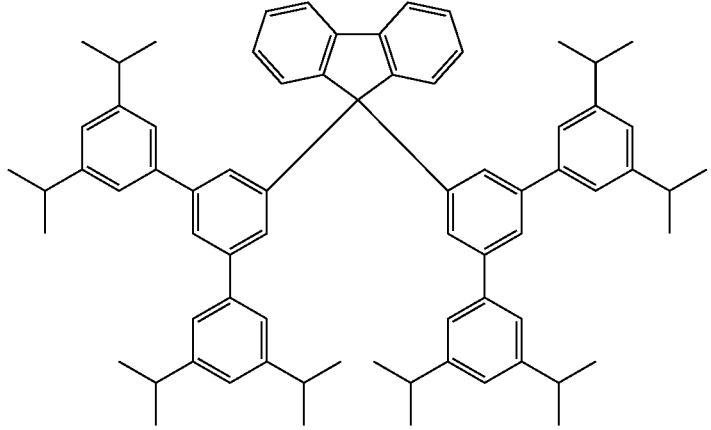
(XIV-14)

(XIV-15)
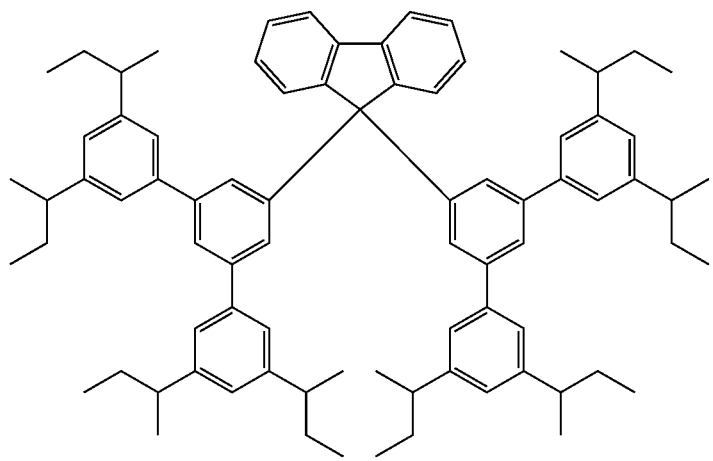
(XIV-16)
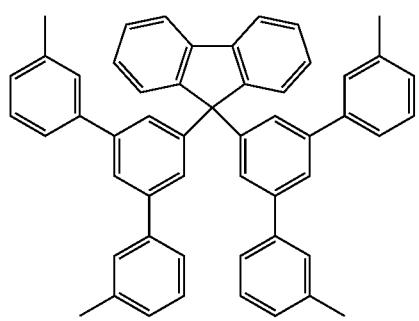
(XIV-17)
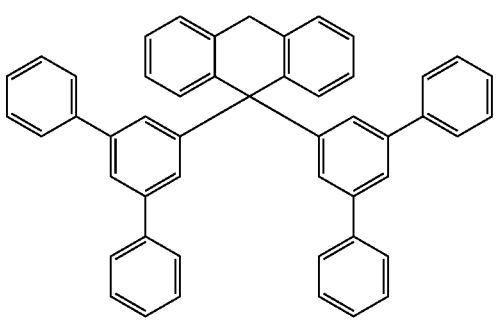
(XIV-18)
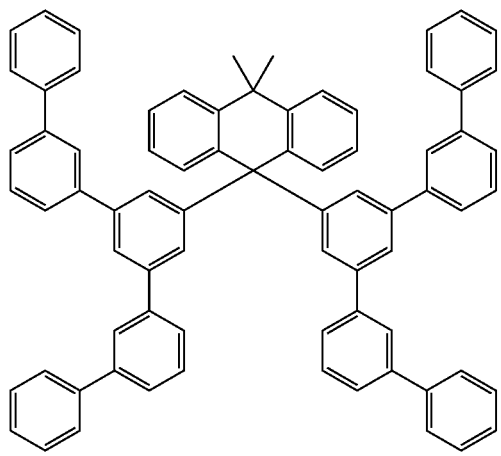
(XIV-19)
(XIV-20)
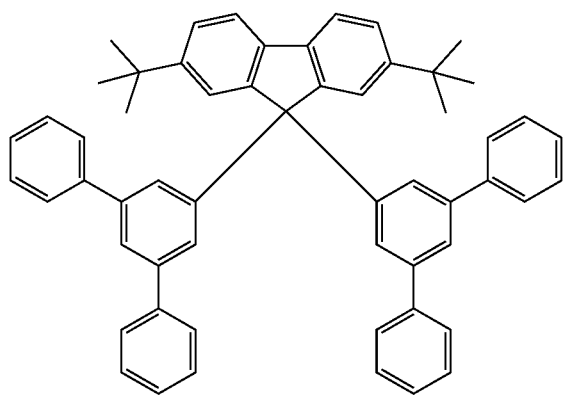

(XIV-21)
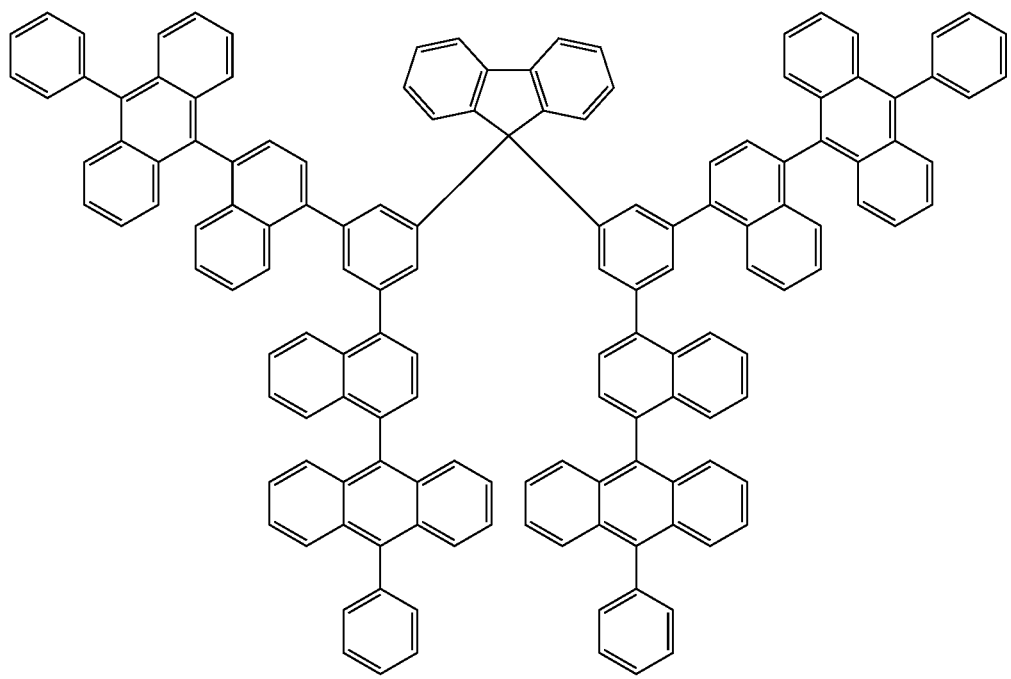
(XIV-22)
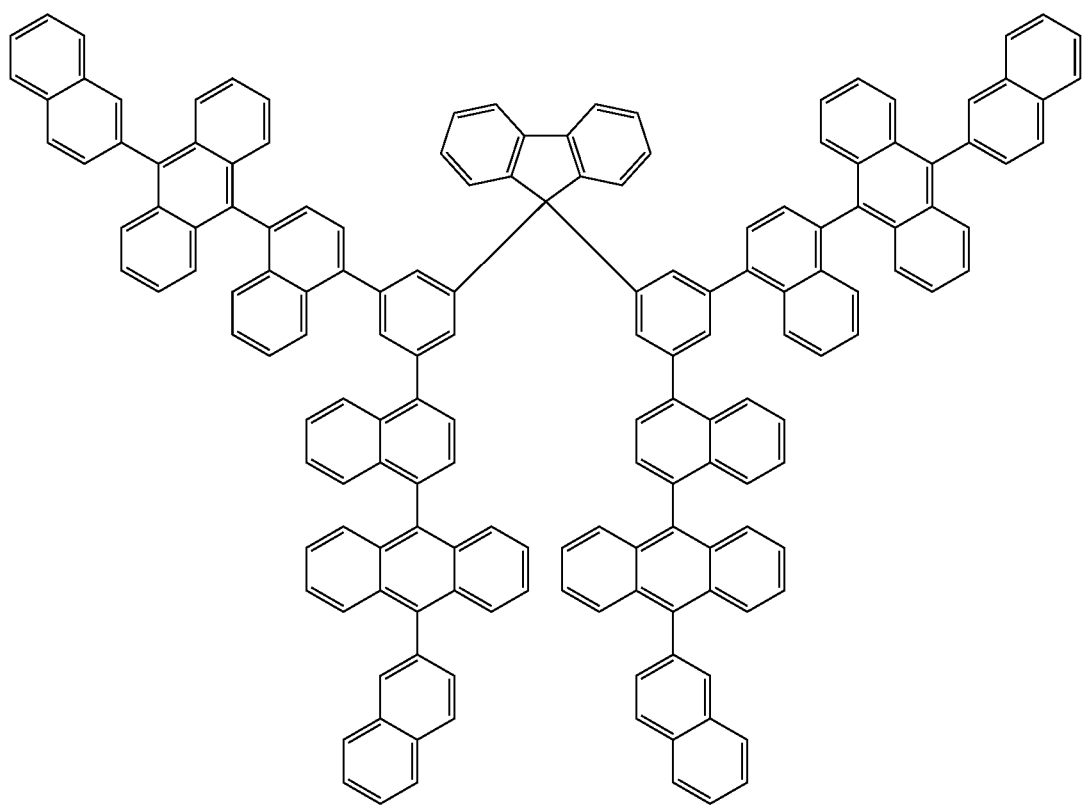

(XIV-23)
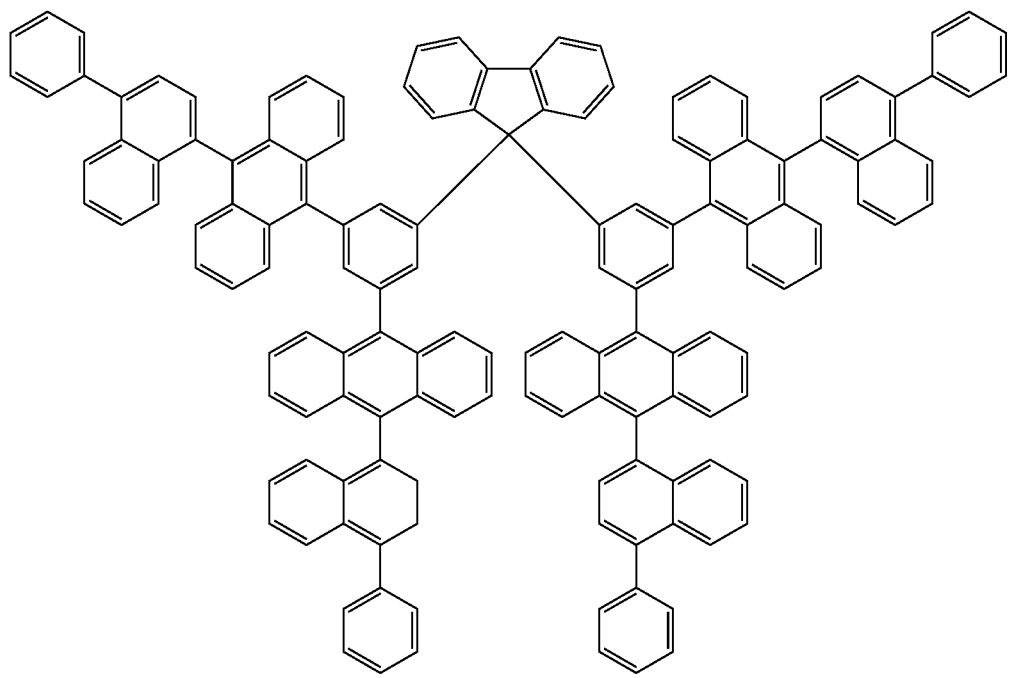
(XIV-24)
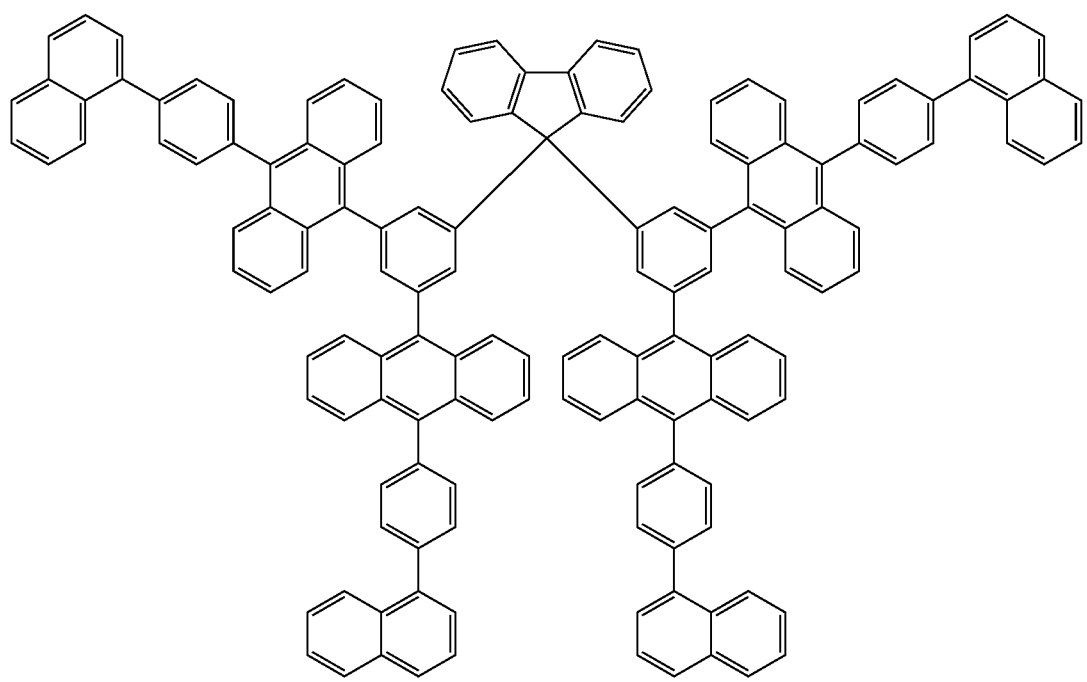

(XIV-25)
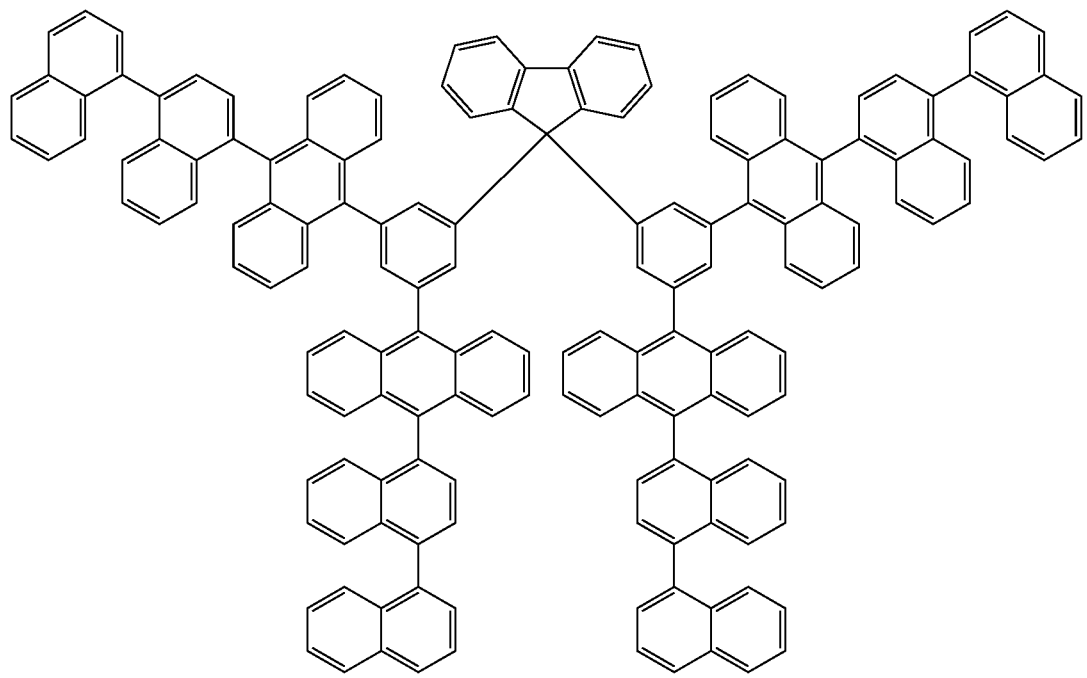
(XIV-26)
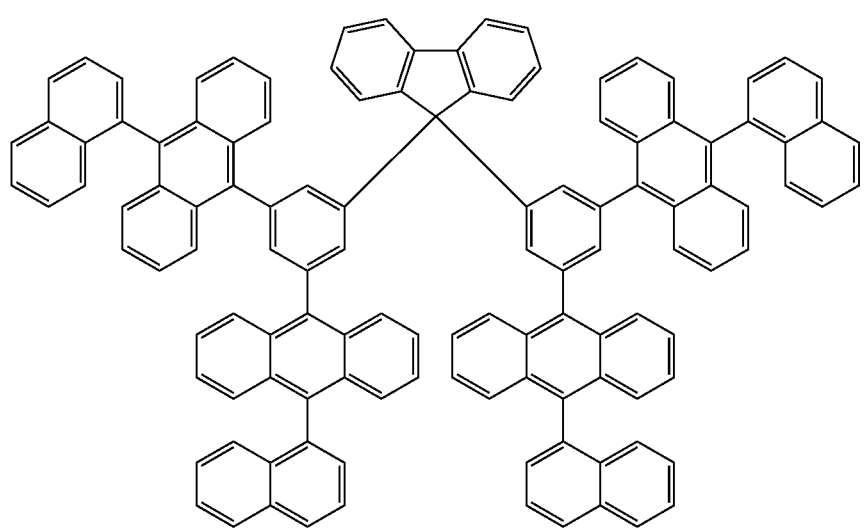

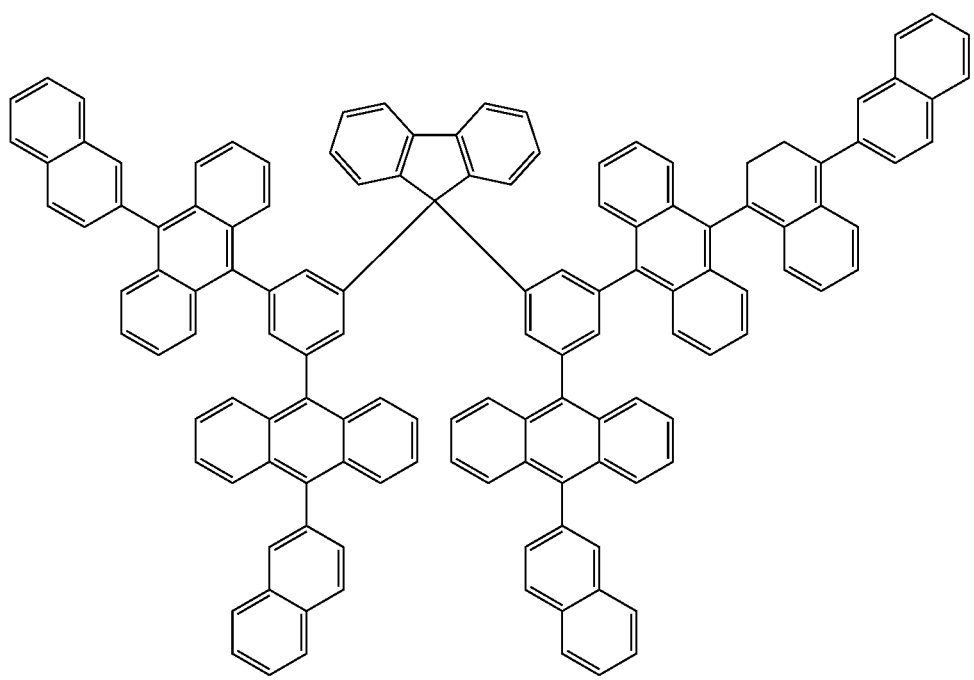
(XIV-27)
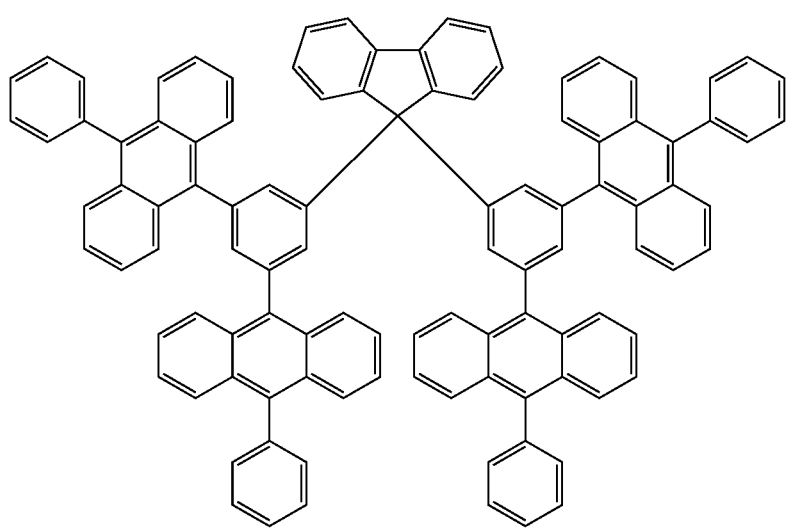
(XIV-28)

-continued
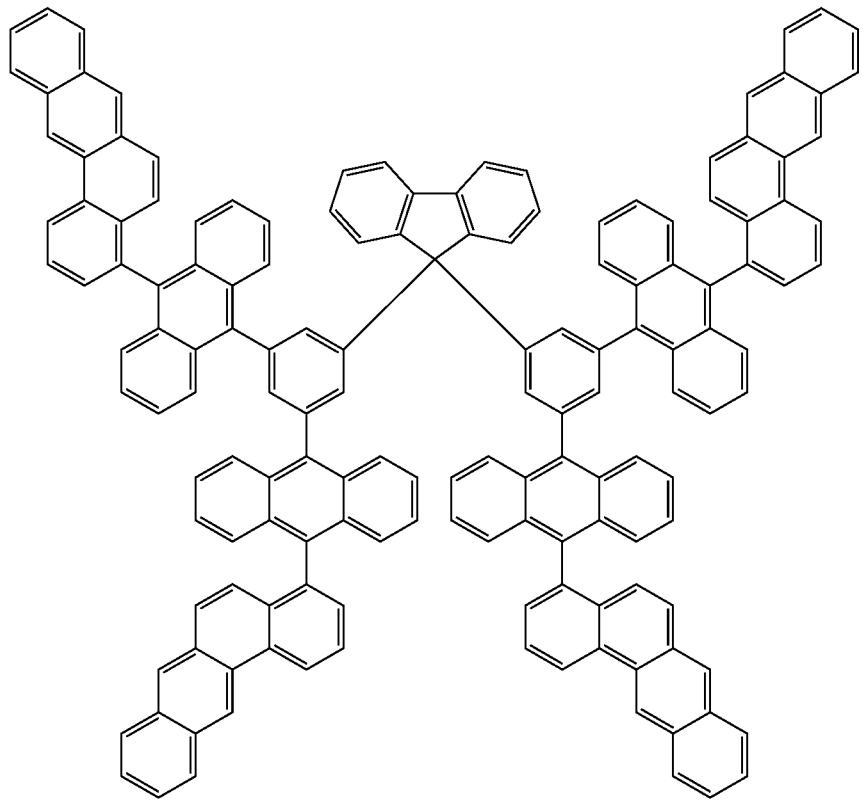
(XIV-29)
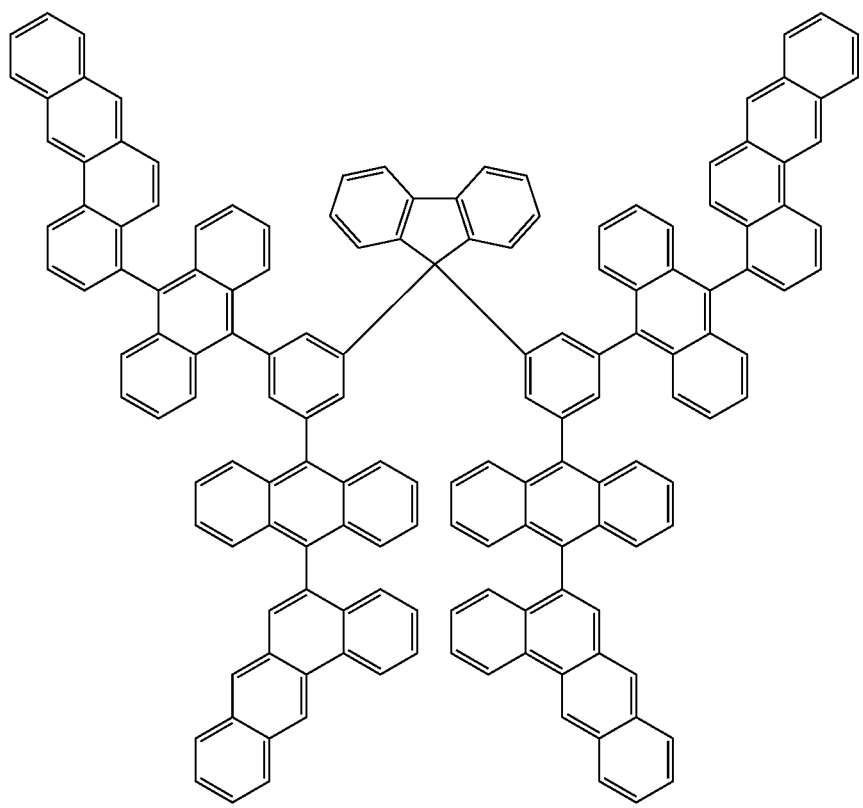
(XIV-30)

-continued (XIV-31)

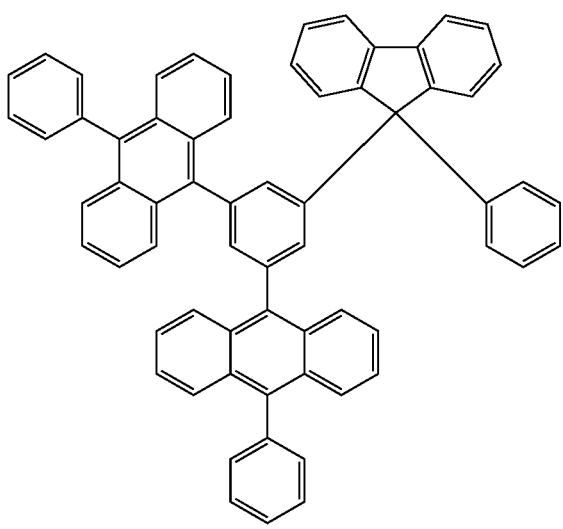

(XIV-32)

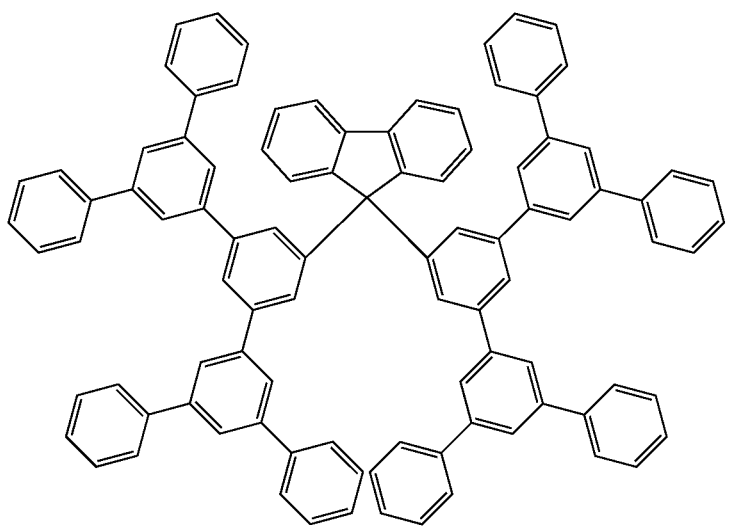

A particularly preferred compound of the formula here is the compound of the formula (XV-1)

(XV-1)

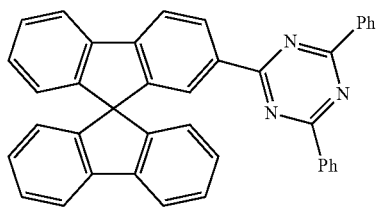

formula (XXVIII)

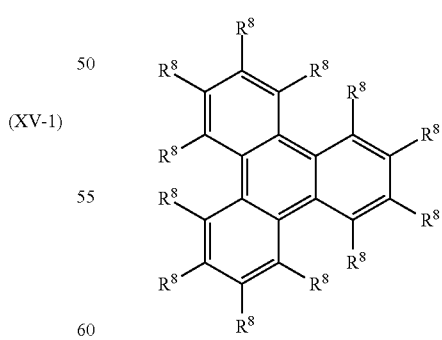

where $R^8$ can adopt the meanings indicated in relation to formula (XIV).

According to a further embodiment of the present invention, the neutral compound is a compound of the formula (XXVIII):

According to still a further embodiment of the present invention, the neutral compound is a compound of the formula (XXIX):

formula (XXIX)

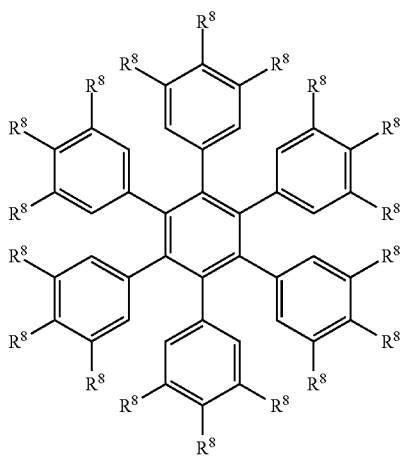

where $R^8$ can adopt the meanings indicated in relation to formula (XIV).

A particularly preferred neutral compound of the formula (XXIX) is the following structure:

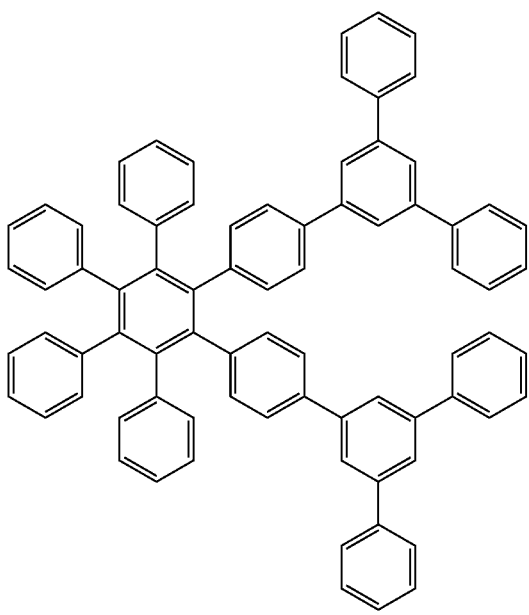 [SMILES: c1ccc(-c2cc(-c3ccccc3)cc(-c3ccc(-c4c(-c5ccccc5)c(-c5ccccc5)c(-c5ccccc5)c(-c5ccccc5)c4-c4ccc(-c5cc(-c6ccccc6)cc(-c6ccccc6)c5)cc4)cc3)c2)cc1]

The compounds of the formula (XIV) according to the invention can be prepared by synthetic steps which are generally known to the person skilled in the art. The starting compound used for symmetrically substituted compounds according to the invention can be, for example, 3,3',5,5'-tetrabromobenzophenone (*Eur. J. Org. Chem.* 2006, pp. 2523-2529). This can be reacted, for example in accordance with Scheme 2, by reaction with a substituted or unsubstituted 2-lithiobiphenyl, 2-lithiodiphenyl ether, 2-lithiodiphenyl thioether, 2-(2-lithiophenyl)-2-phenyl-1,3-dioxolane or 2-lithiophenyldiphenylamine to give the corresponding triarylmethanols, which are then cyclised under acidic conditions, for example in the presence of acetic acid and a mineral acid, such as hydrogen bromide. The organolithium compounds required for this reaction can be prepared by transmetallation of the corresponding aryl bromides (2-bromobiphenyl, 2-bromodiphenyl ether, 2-bromodiphenyl thioether, 2-(2-bromophenyl)-2-phenyl-1,3-dioxolane, 2-bromophenyldiphenylamine, etc.) using alkyllithium compounds, such as n-butyllithium. It is of course possible to employ the corresponding Grignard compounds analogously.

Scheme 2

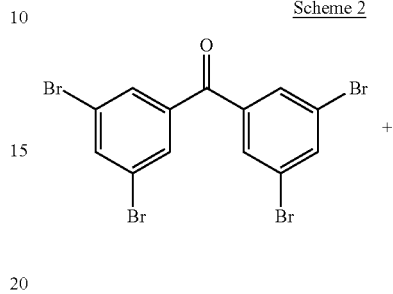

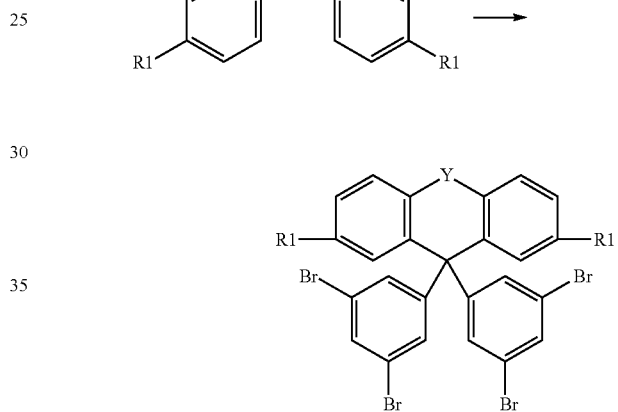

The tetrabromides produced in this way can be converted further by methods known to the person skilled in the art. The palladium-catalysed reaction with boronic acids (Suzuki coupling) or palladium-catalysed reaction with organozinc compounds (Negishi coupling) results in aromatic or heteroaromatic compounds according to the invention (Scheme 3).

Scheme 3

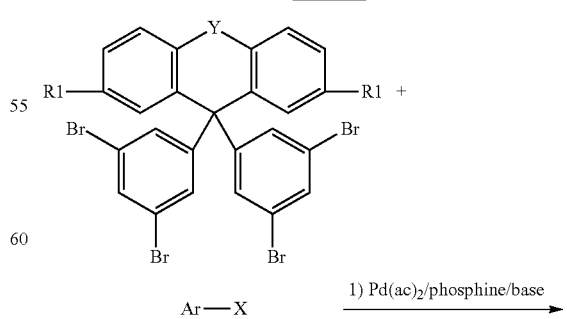

Ar = aromatic/heteroaromatic hydrocarbon
X = B(OH)$_2$, ZnBr, MgBr, etc.

101

-continued

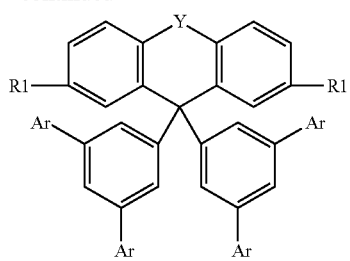

The bromine function can be converted by transmetallation using organolithium compounds or Grignard compounds into an electrophilic group, which are then coupled to a multiplicity of electrophiles, such as, for example, aryl-boron halides, aldehydes, ketones, nitriles, esters, halogen esters, carbon dioxide, arylphosphine halides, halosulfinic acids, haloarylsulfonic acids, etc., where the resultant compounds may be end products according to the invention or alternatively intermediates which can be reacted further.

Asymmetrically substituted compounds according to the invention can be obtained by the sequence according to Scheme 4 starting from fluorenone and analogous aryl ketones by addition of an aryl-metal compound, for example 1-lithio-3,5-dibromobenzene, onto the carbonyl function, conversion of the brominated aromatic compound by one of the methods mentioned above with build-up of the one functionality and subsequent introduction of the other functionality via acid-catalysed Friedel-Crafts arylation on 1,3-dibromobenzene and conversion of the brominated aromatic compound by one of the methods mentioned above (see, for example, *Org. Lett.* 2001, 3(15), p. 2285).

Scheme 4

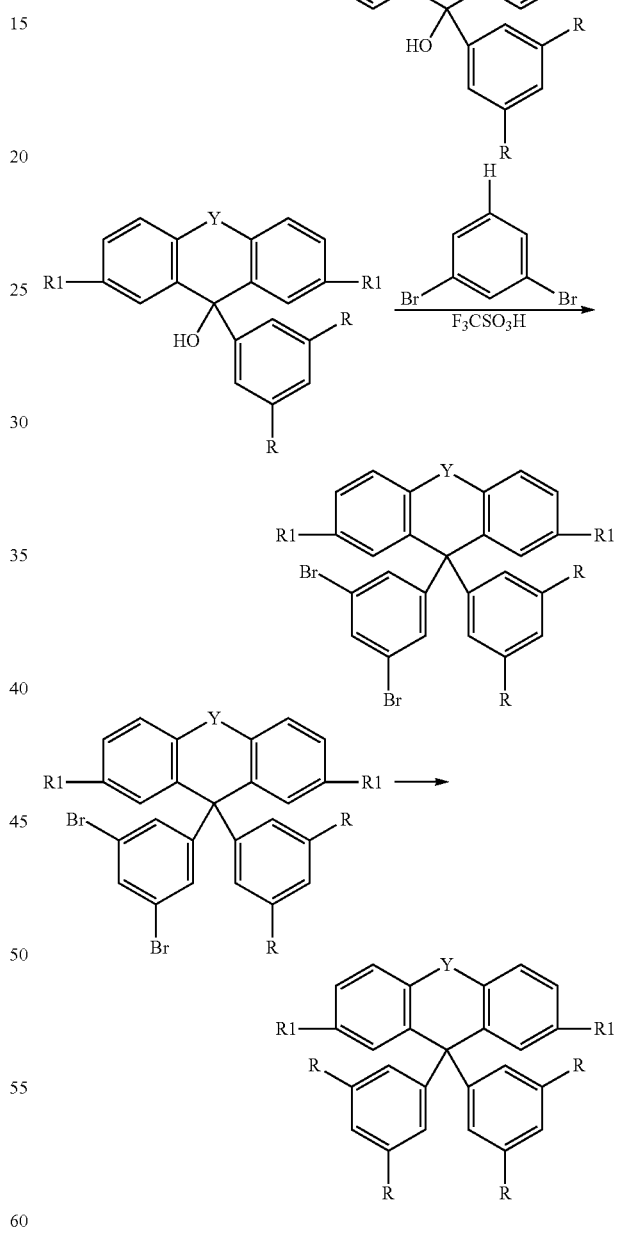

102

-continued

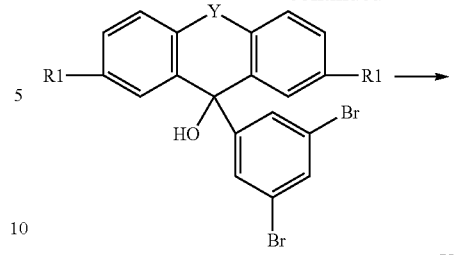

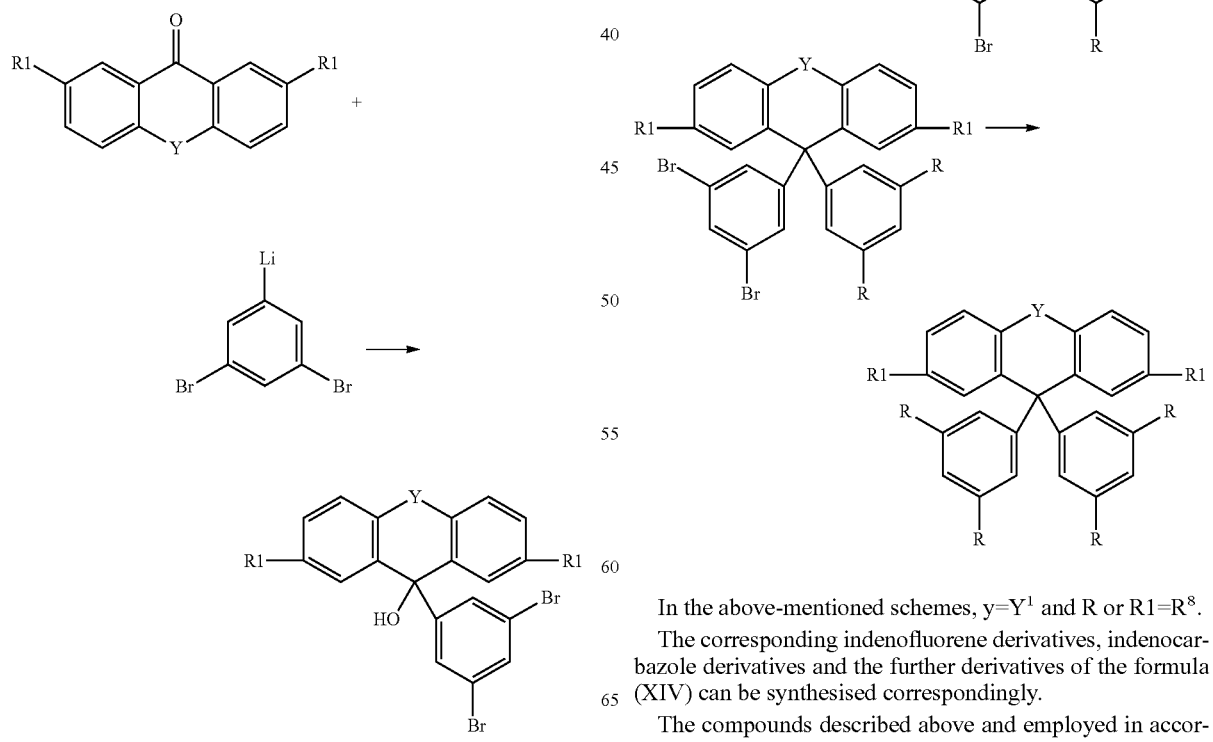

In the above-mentioned schemes, y=$Y^1$ and R or R1=$R^8$.

The corresponding indenofluorene derivatives, indenocarbazole derivatives and the further derivatives of the formula (XIV) can be synthesised correspondingly.

The compounds described above and employed in accordance with the invention, in particular compounds which are substituted by reactive leaving groups, such as bromine, iodine, triflate, tosylate, boronic acid or boronic acid ester, can be used as monomers for the generation of corresponding dimers, trimers, tetramers, pentamers, oligomers, polymers or as core of dendrimers. The oligomerisation or polymerisation here preferably takes place via the halogen functionality or the boronic acid functionality.

In addition or as an alternative to the above-mentioned carbazole compounds or to the neutral compounds described above, it is likewise possible for neutral compounds, also neutral compounds of the general formula (XXX)

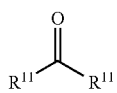

formula (XXX)

to be present, where
- $R^{11}$ an aromatic or heteroaromatic ring system having 5 to 60 aromatic ring atoms, which may in each case be substituted by one or more radicals $R^9$, or a combination of these systems; two or more adjacent substituents $R^{10}$ here may also form a mono- or polycyclic, aliphatic or aromatic ring system with one another; or a unit of the general formula (XXXI)

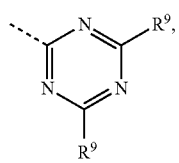

formula (XXXI)

where the dashed bonds indicate the linking of the unit to the C atom of the keto group.

Particularly preferred host molecules here have electron-transporting functionality and are, in particular, selected from the group consisting of the compounds depicted below

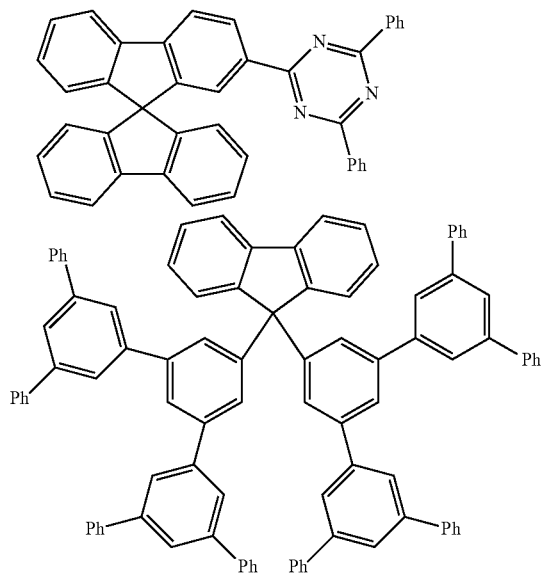

As an alternative or in addition thereto, the host molecule may also have hole-transporting functionalities, in particular it is then selected from the group consisting of the compounds depicted below

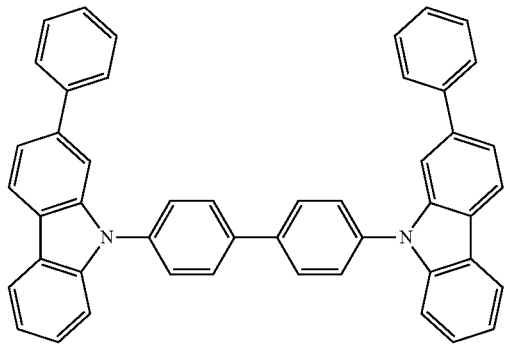

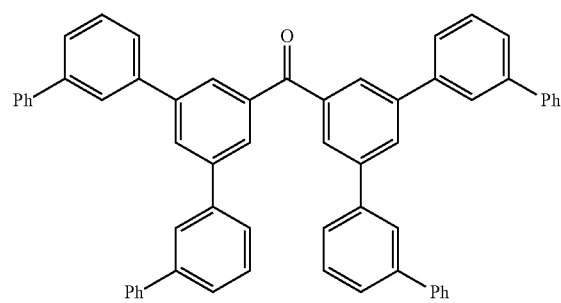

As already stated above, the mixture according to the invention or the blend according to the invention also comprises an emitter molecule. An emitter molecule or an emitter compound (phosphorescent compound) in the sense of the present invention is a compound which exhibits luminescence from an excited state having relatively high spin multiplicity, i.e. a spin state >1, in particular from an excited triplet state, at room temperature. For the purposes of the present invention, all luminescent transition-metal complexes containing transition metals from the second and third transition-metal series, in particular all luminescent iridium, platinum and copper compounds, are to be regarded as phosphorescent compounds.

In a preferred embodiment of the present invention, the triplet emitter compound is a red-phosphorescent compound or a green-phosphorescent compound.

Suitable as triplet emitter compound (phosphorescent compound) are, in particular, compounds which emit light, preferably in the visible region, on suitable excitation and in addition contain at least one atom having an atomic number greater than 20, preferably greater than 38 and less than 84, particularly preferably greater than 56 and less than 80. Compounds which contain copper, molybdenum, tungsten, rhenium, ruthenium, osmium, rhodium, iridium, palladium, platinum, silver, gold or europium, in particular compounds which contain iridium, platinum or copper, are preferably used as triplet emitter compound.

Particularly preferred mixtures according to the invention comprise, as triplet emitter compound, a compound of the formulae (21) to (24),

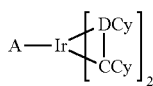

formula (21)

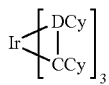

formula (22)

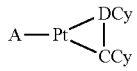

formula (23)

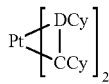

formula (24)

where the following applies to the symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^{12}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{14}$;

A is, identically or differently on each occurrence, a monoanionic, bidentate-chelating ligand, preferably a diketonate ligand;

$R^{12}$ is on each occurrence, identically or differently, H, D, F, CN, $N(R^{13})_2$, a straight-chain, branched or cyclic alkyl, alkoxy or thioalkoxy group having 1 to 40 C atoms, which may be substituted by $R^{14}$ or may also be unsubstituted, where one or more non-adjacent $CH_2$ groups may be replaced by $-R^{15}C=CR^{15}-$, $-C\equiv C-$, $Si(R^{15})_2$, $Ge(R^{15})_2$, $Sn(R^{15})_2$, $C=O$, $C=S$, $C=Se$, $C=NR^{15}$, $-O-$, $-S-$, $-NR^{15}-$ or $-CONR^{15}$ and where one or more H atoms may be replaced by F, Cl, Br, I, CN or $NO_2$, or an aromatic or heteroaromatic ring system having 1 to 60 C atoms, which may be substituted by one or more radicals $R^{14}$, where two or more substituents $R^{12}$ may also, together with the atoms to which they are bonded, form a mono- or polycyclic, aliphatic or aromatic ring system with one another; where at least one group $R^{12}$ has a bond to a further structural unit of the polymer;

$R^{13}$ is on each occurrence, identically or differently, a straight-chain, branched or cyclic alkyl or alkoxy group having 1 to 22 C atoms, in which, in addition, one or more non-adjacent C atoms may be replaced by $-R^{15}C=CR^{15}-$, $-C\equiv C-$, $Si(R^{15})_2$, $Ge(R^{15})_2$, $Sn(R^{15})_2$, $-NR^{15}-$, $-O-$, $-S-$, $-CO-O-$, $-O-CO-O-$, where, in addition, one or more H atoms may be replaced by fluorine, an aryl, heteroaryl or aryloxy group having 1 to 40 C atoms, which may also be substituted by one or more radicals $R^{14}$, or OH or $N(R^{14})_2$;

$R^{14}$ is on each occurrence, identically or differently, $R^{15}$ or CN, $B(R^{15})_2$ or $Si(R^{15})_3$;

$R^{15}$ is on each occurrence, identically or differently, H, D or an aliphatic or aromatic hydrocarbon radical having 1 to 20 C atoms.

Due to formation of ring systems between a plurality of radicals $R^{12}$, a bridge may also be present between the groups DCy and CCy. Furthermore, due to formation of ring systems between a plurality of radicals $R^{12}$, a bridge may also be present between two or three ligands CCy-DCy or between one or two ligands CCy-DCy and the ligand A, giving a polydentate or polypodal ligand system.

Examples of the emitters described above are revealed by WO 00/70655, WO 01/41512, WO 02/02714, WO 02/15645, EP 1 191 613, EP 1 191 612, EP 1 191 614, WO 04/081017, WO 05/033244, WO 05/042550, WO 05/113563, WO 06/008069, WO 06/061182, WO 06/081973, DE 10 2008 015 526, DE 10 2008 027 005 and DE 10 2009 007 038. In general, all phosphorescent complexes as used in accordance with the prior art for phosphorescent OLEDs or PLEDs and as are known to the person skilled in the art in the area of organic electroluminescence are suitable, and the person skilled in the art will be able to use further phosphorescent compounds without an inventive step. In particular, it is known to the person skilled in the art what phosphorescent complexes emit with what colour.

Examples of suitable phosphorescent compounds are structures (T-1) to (T-140) shown in the following table.

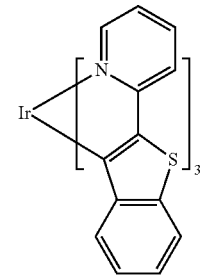

(T-1)

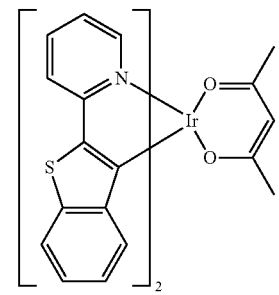

(T-2)

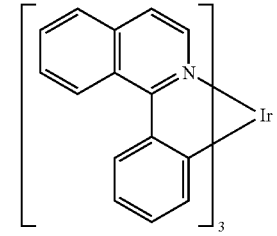

(T-3)

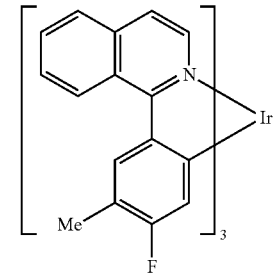

(T-4)

| | |
|---|---|
| (T-5) 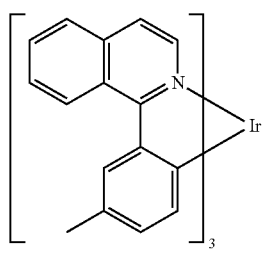 | (T-10) 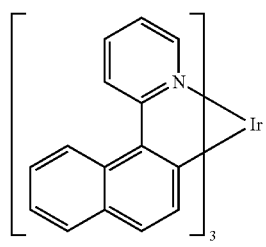 |
| (T-6) 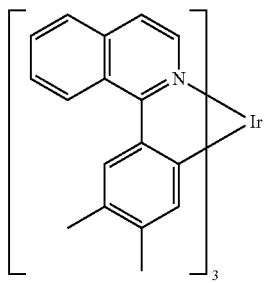 | (T-11) 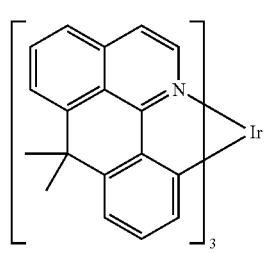 |
| (T-7) 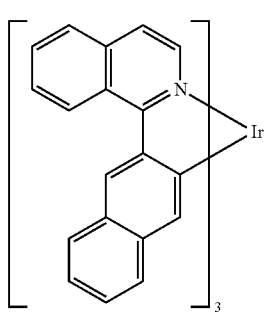 | (T-12) 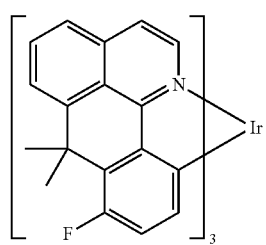 |
| (T-8) 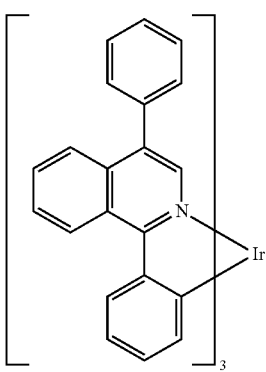 | (T-13) 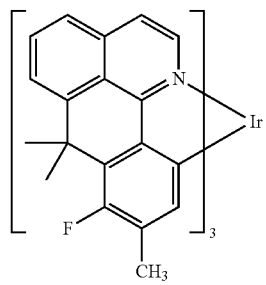 |
| (T-9) 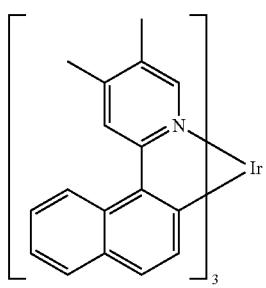 | (T-14) 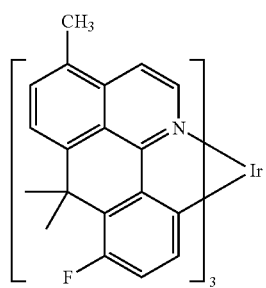 |

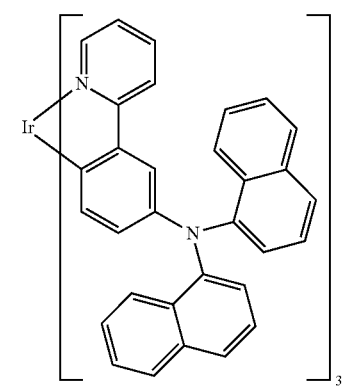 (T-15)
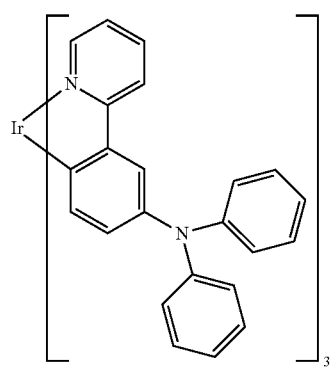 (T-16)
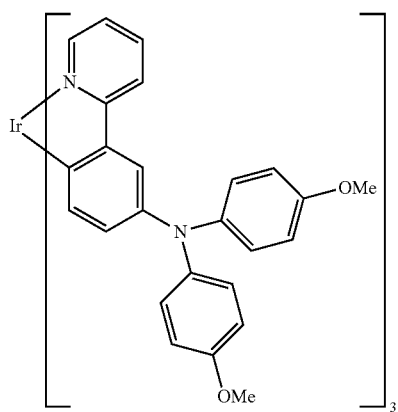 (T-17)
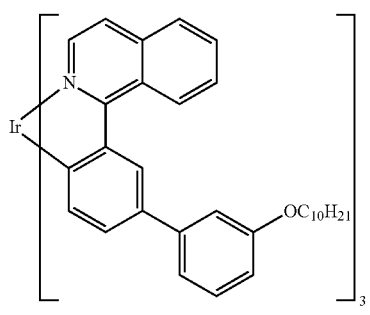 (T-18)
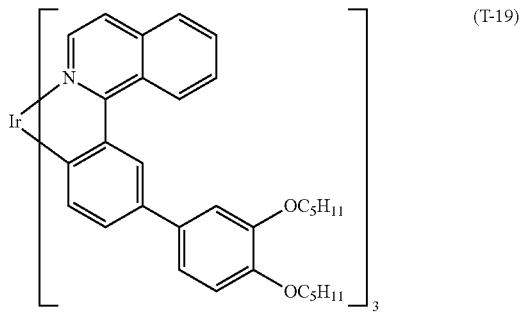 (T-19)
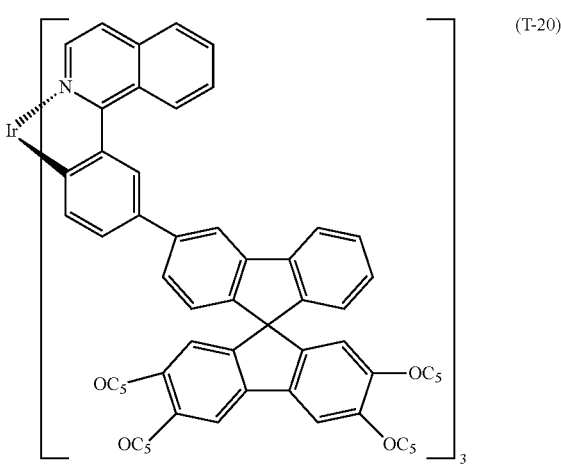 (T-20)
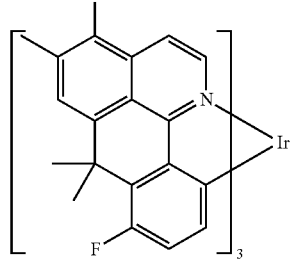 (T-21)
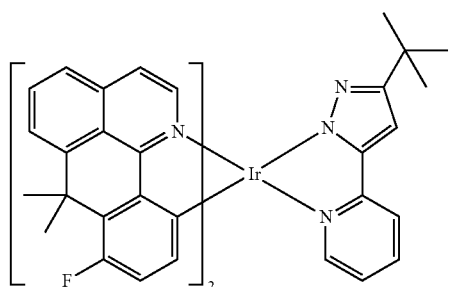 (T-22)
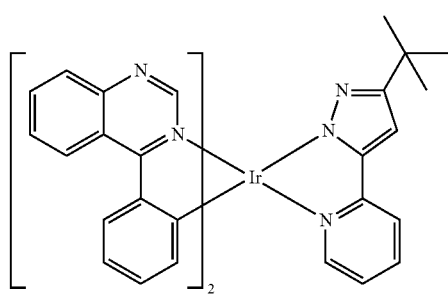 (T-23)

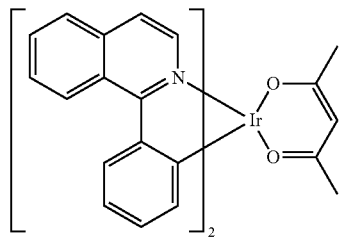
(T-24)
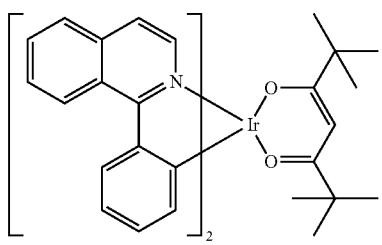
(T-25)
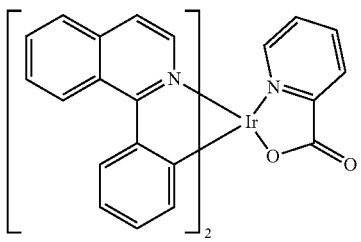
(T-26)
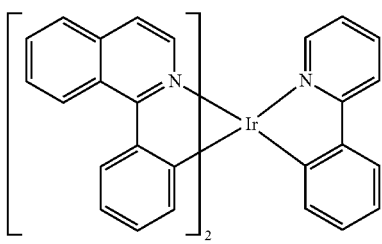
(T-27)
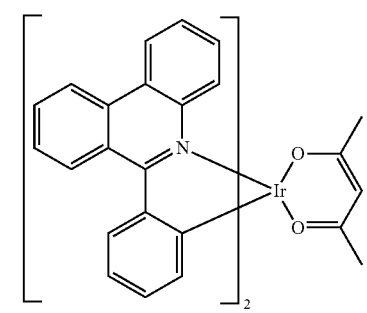
(T-28)
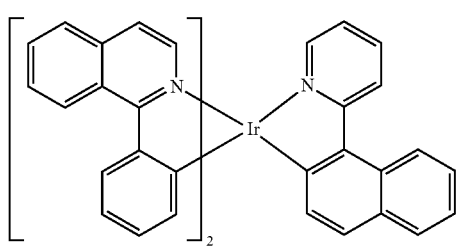
(T-29)
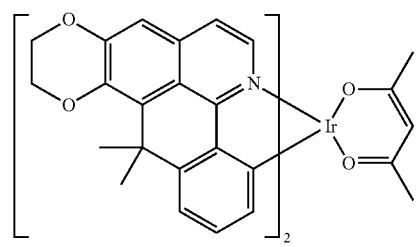
(T-30)
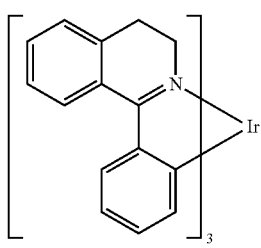
(T-31)
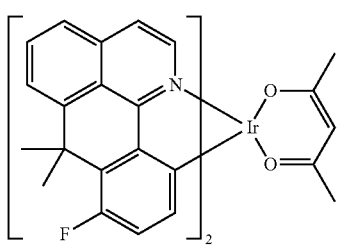
(T-32)
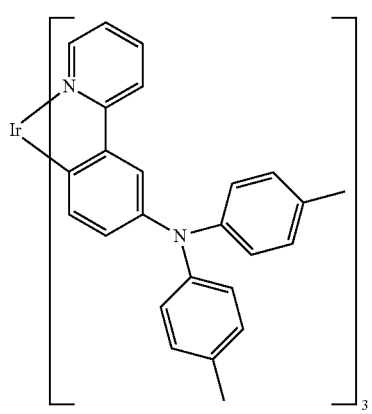
(T-33)
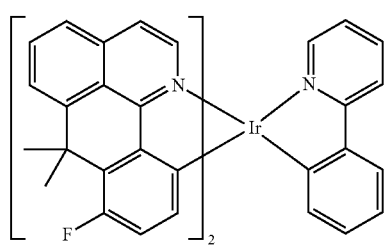
(T-34)

-continued
(T-35) 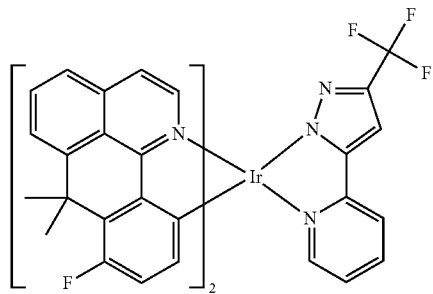
(T-36) 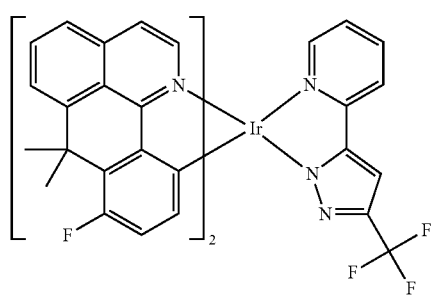
(T-37) 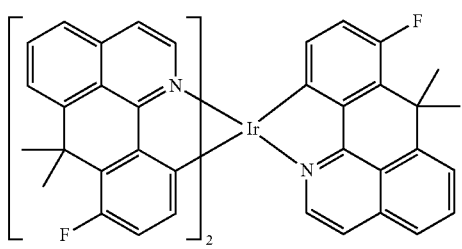
(T-38) 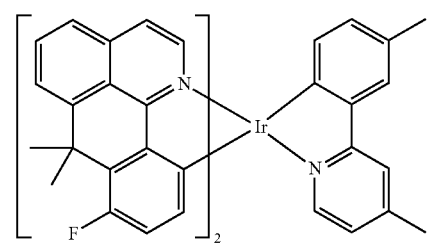
(T-39) 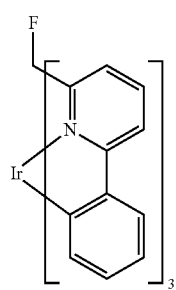
-continued
(T-40) 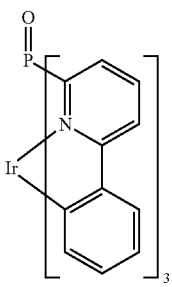
(T-41) 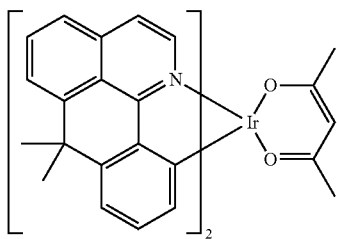
(T-42) 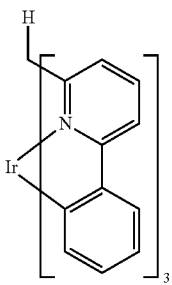
(T-43) 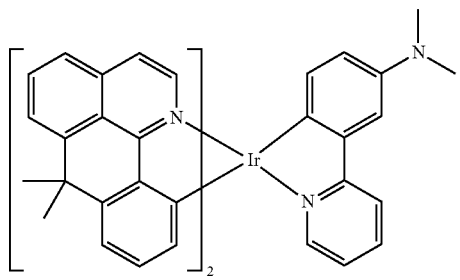
(T-44) 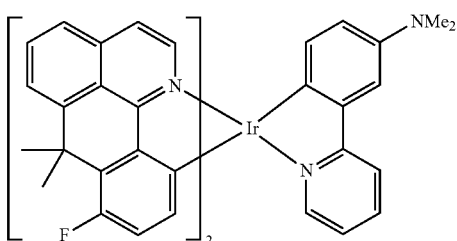
(T-45) 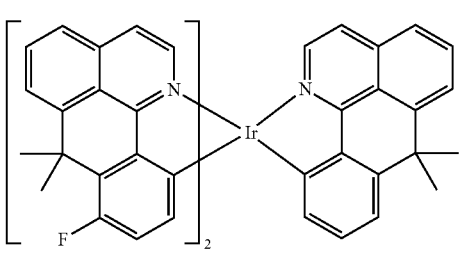

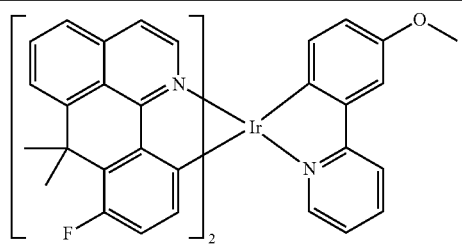
(T-46)
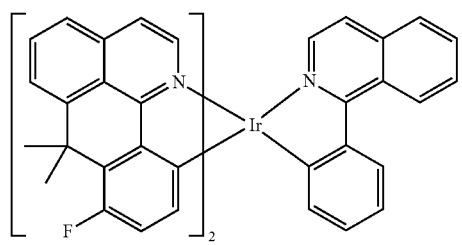
(T-47)
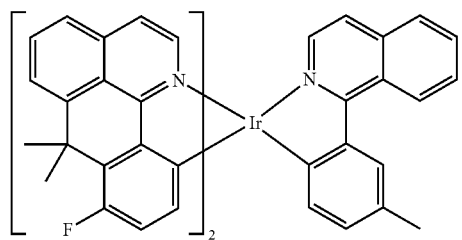
(T-48)
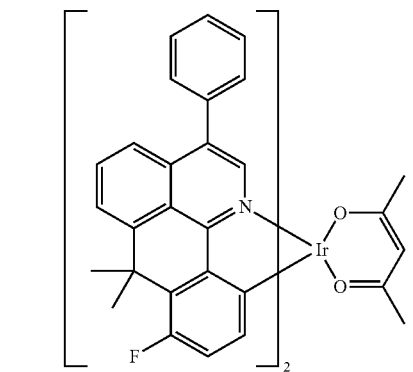
(T-49)
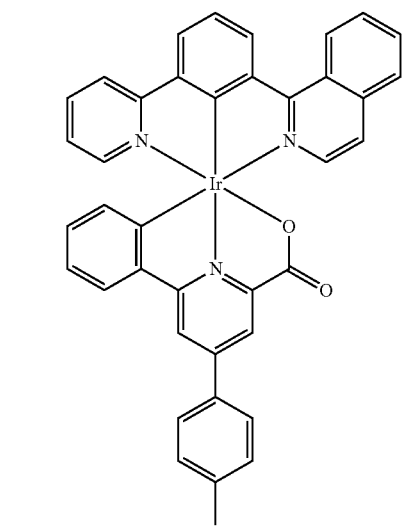
(T-50)
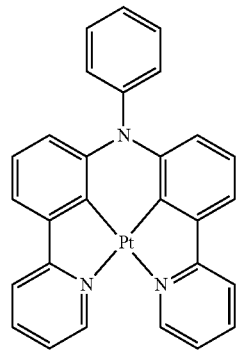
(T-51)
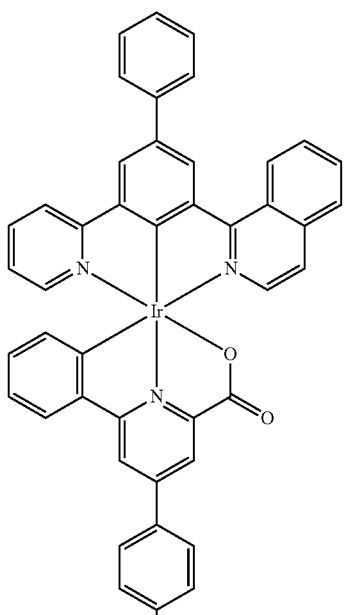
(T-52)
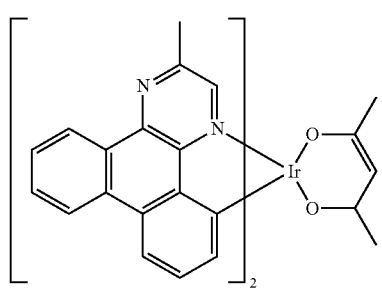
(T-53)
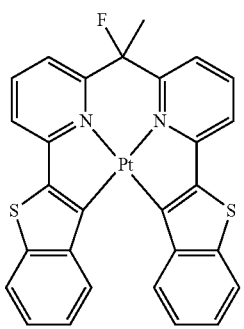
(T-54)

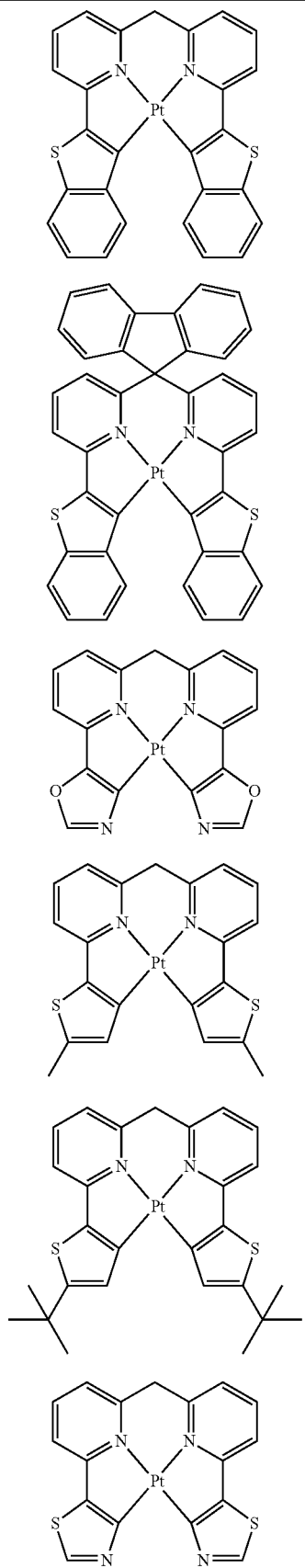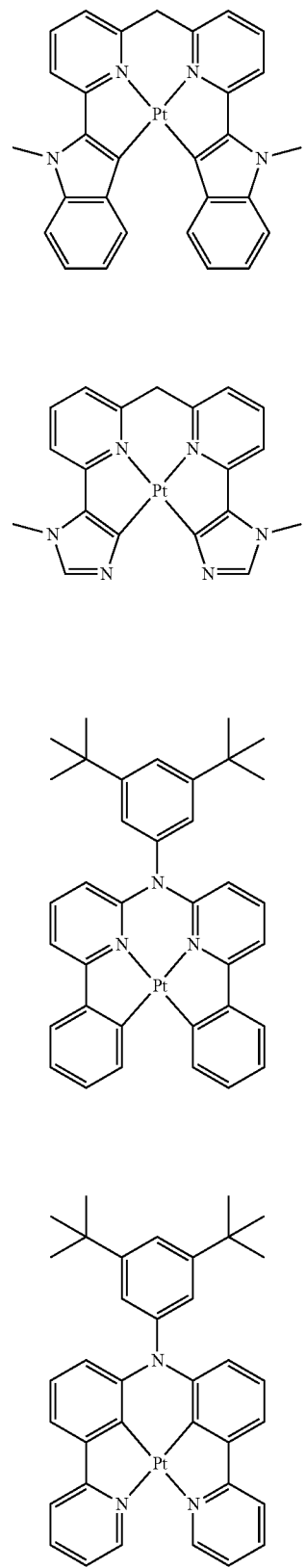

-continued
(T-65) 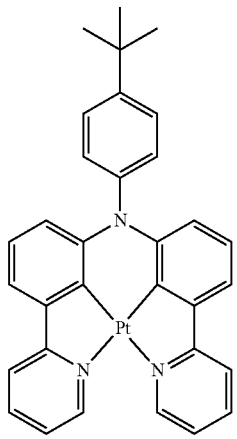
(T-66) 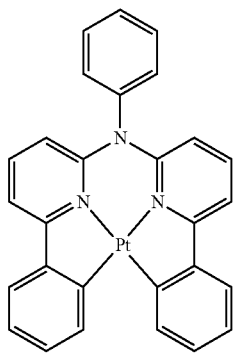
(T-67) 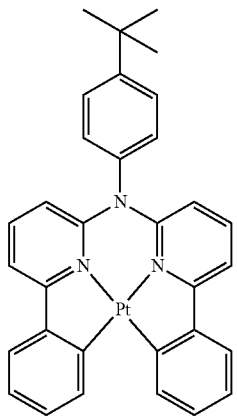
(T-68) 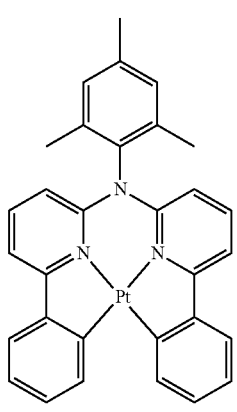
-continued
(T-69) 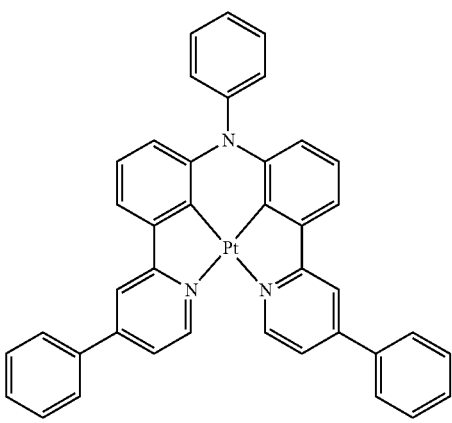
(T-70) 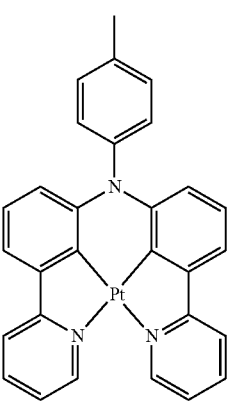
(T-71) 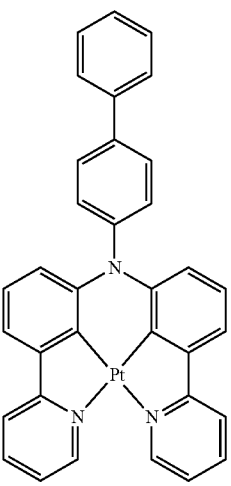

(T-72)
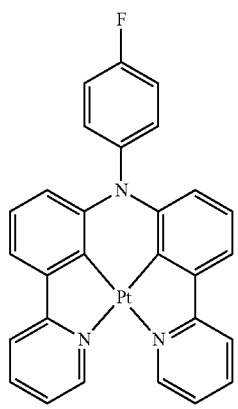
(T-73)
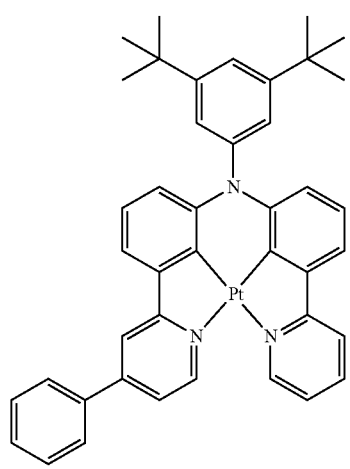
(T-74)
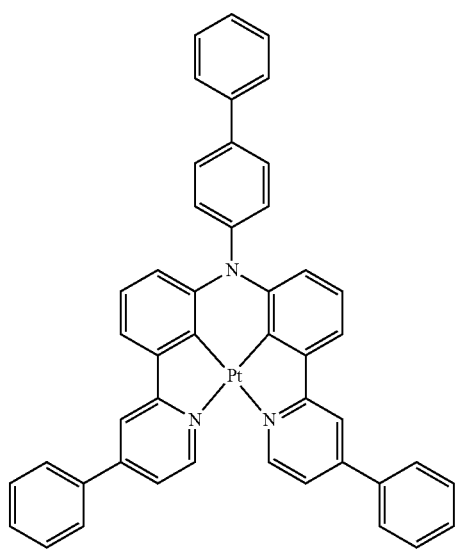
(T-75)
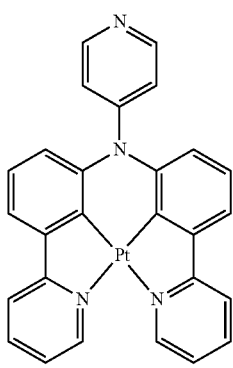
(T-76)
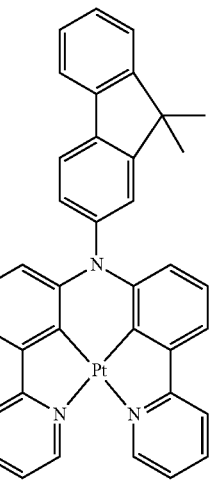
(T-77)
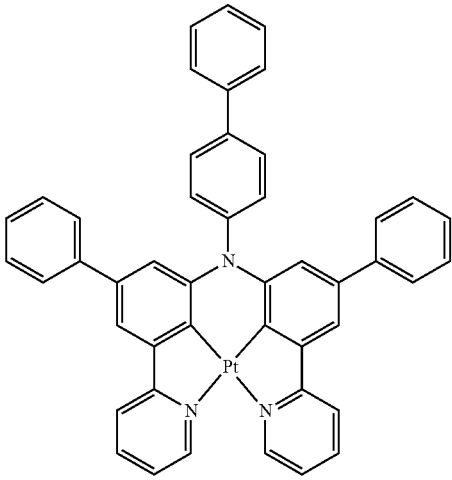

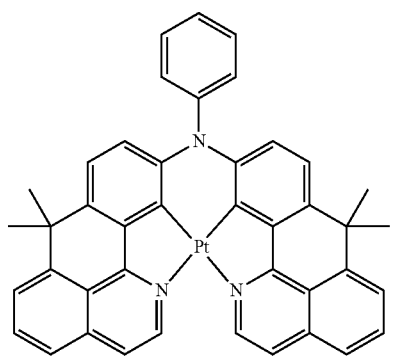
(T-78)
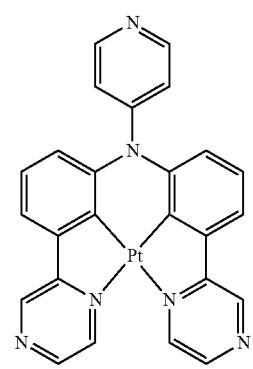
(T-79)
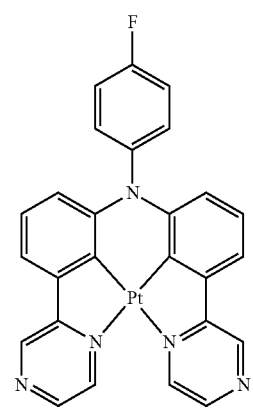
(T-80)
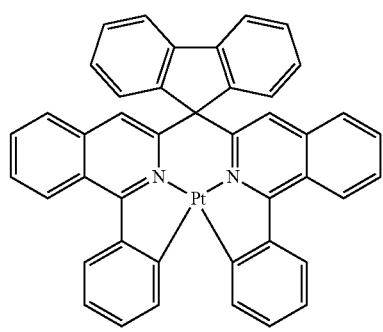
(T-81)
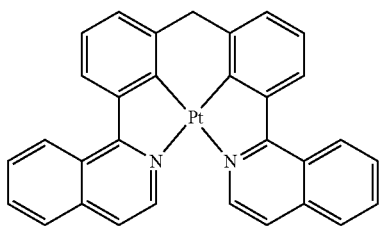
(T-82)
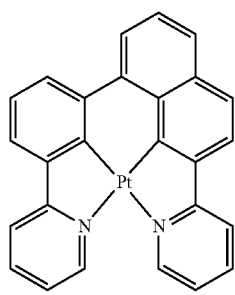
(T-83)
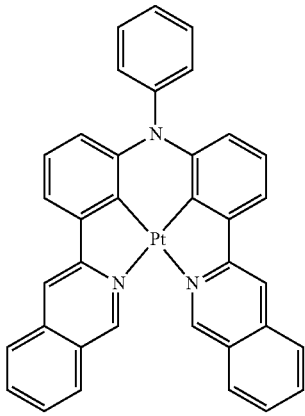
(T-84)
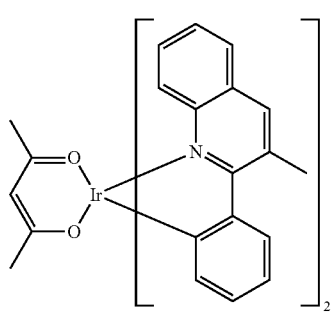
(T-85)
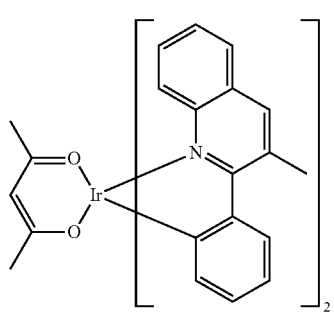
(T-86)

-continued
(T-87)
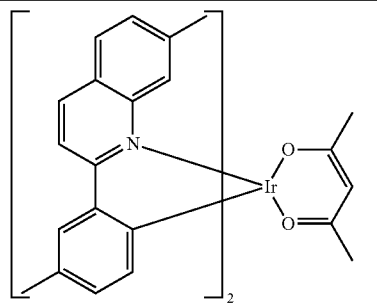
(T-88)
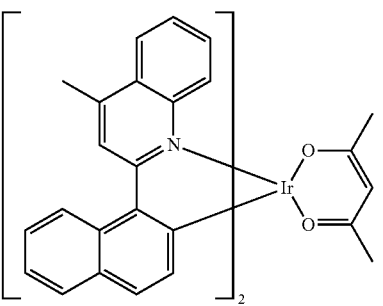
(T-89)
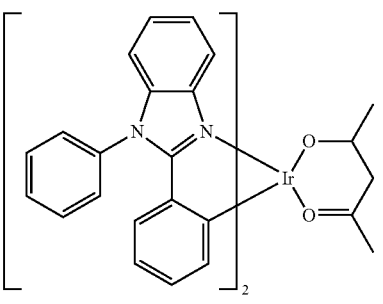
(T-90)
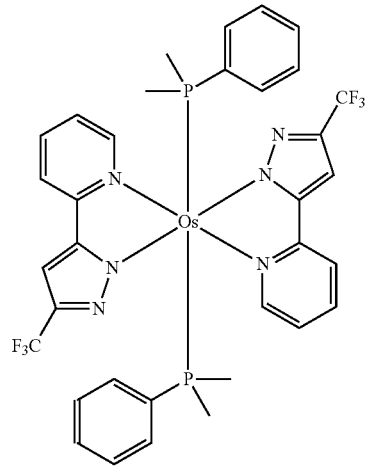
(T-91)
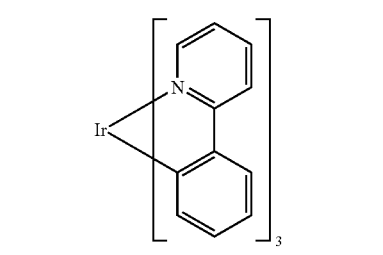
-continued
(T-92)
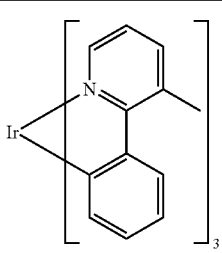
(T-93)
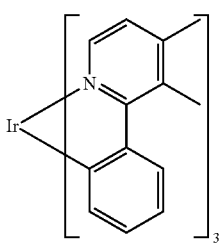
(T-94)
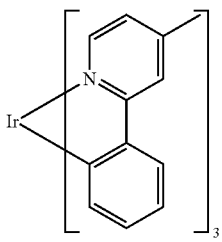
(T-95)
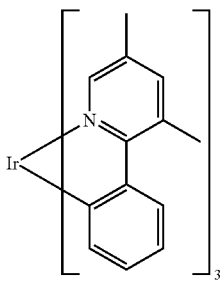
(T-96)
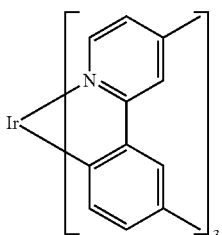
(T-97)
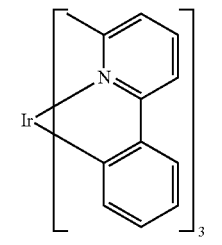

(T-98)
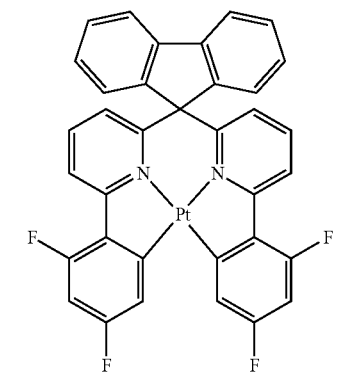
(T-99)
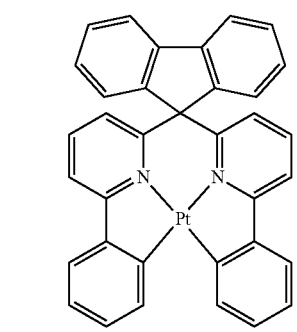
(T-100)
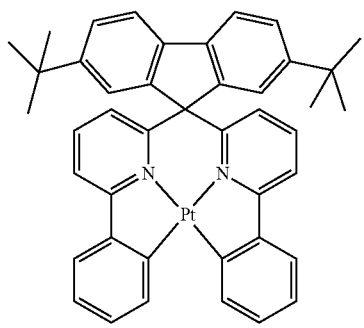
(T-101)
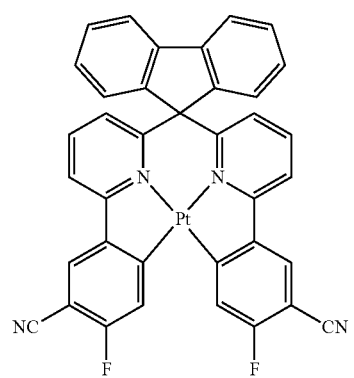
(T-102)
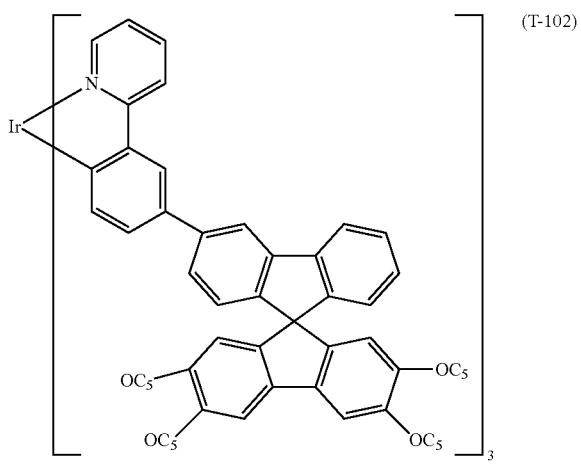
(T-103)
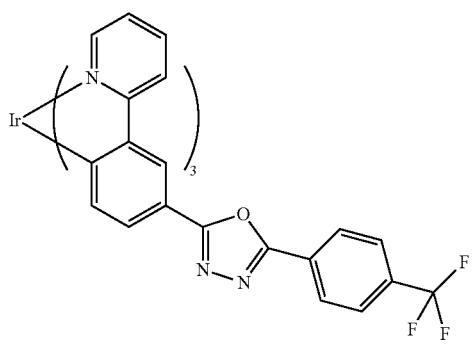
(T-104)
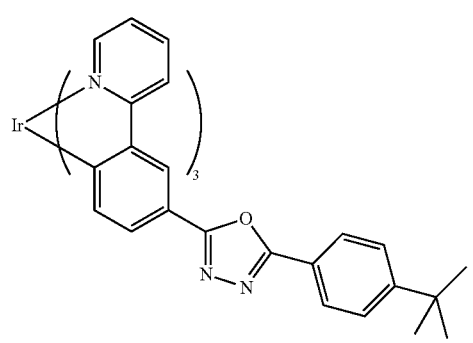
(T-105)
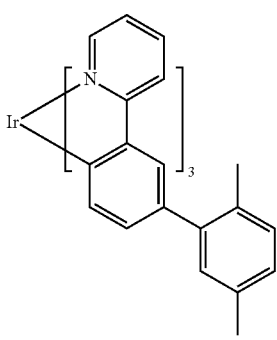

(T-106) 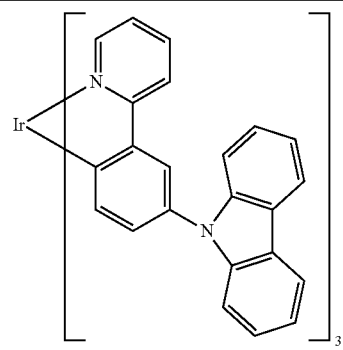
(T-107) 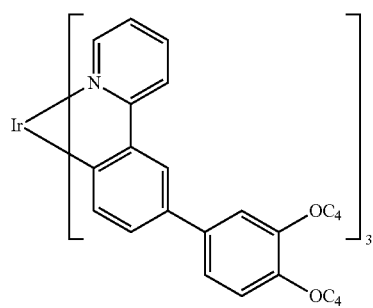
(T-108) 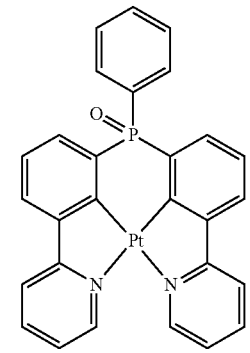
(T-109) 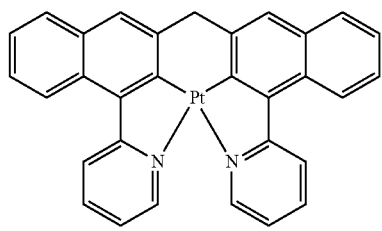
(T-110) 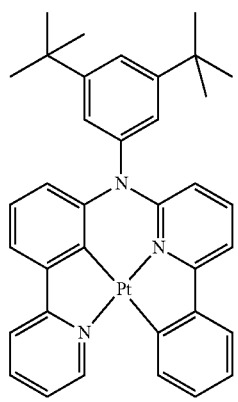
(T-111) 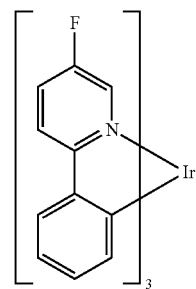
(T-112) 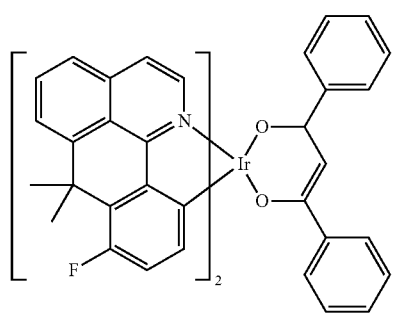
(T-113) 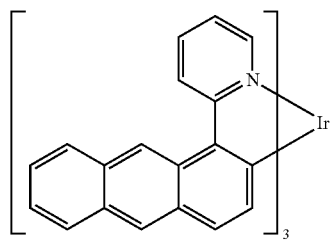
(T-114) 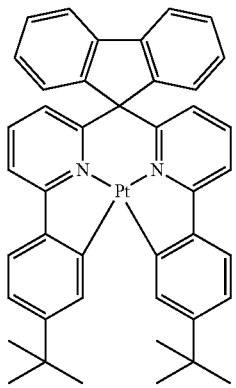
(T-115) 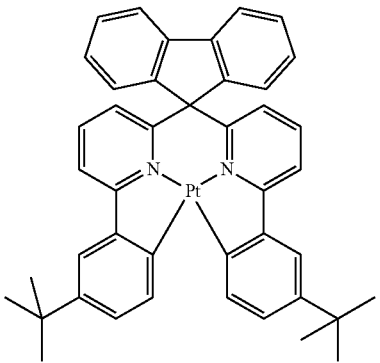

-continued
(T-116) 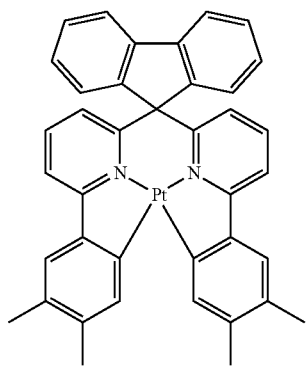
(T-117) 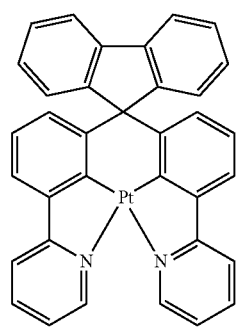
(T-118) 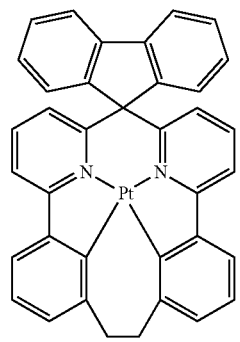
(T-119) 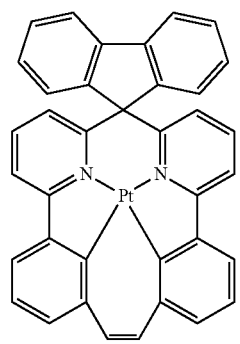
-continued
(T-120) 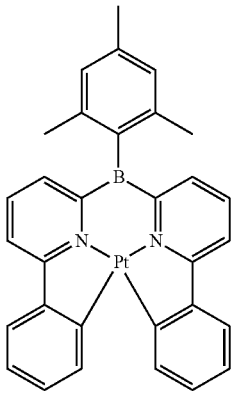
(T-121) 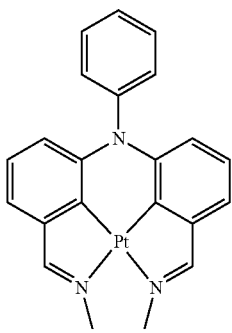
(T-122) 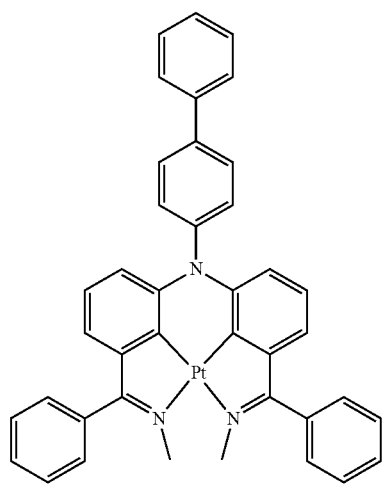
(T-123) 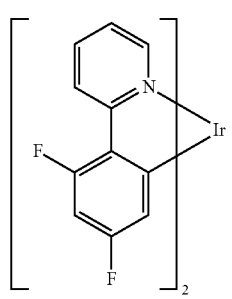

(T-124) 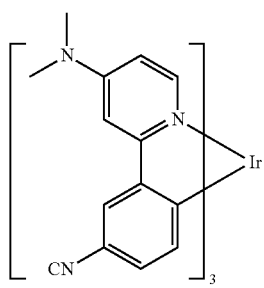
(T-125) 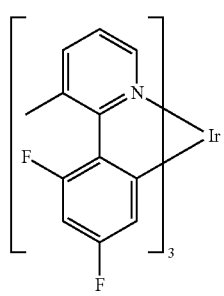
(T-126) 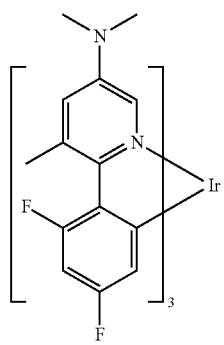
(T-127) 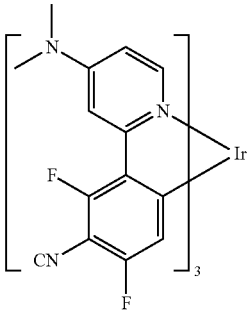
(T-128) 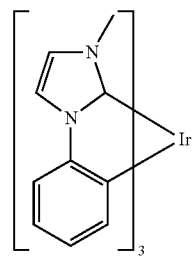
(T-129) 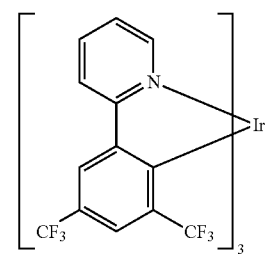
(T-130) 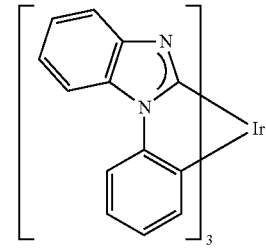
(T-131) 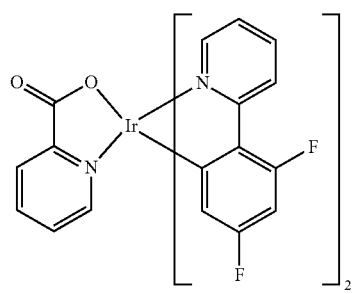
(T-132) 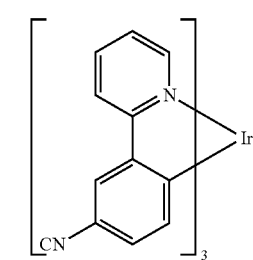
(T-133) 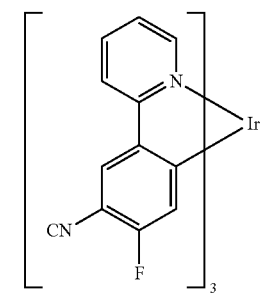

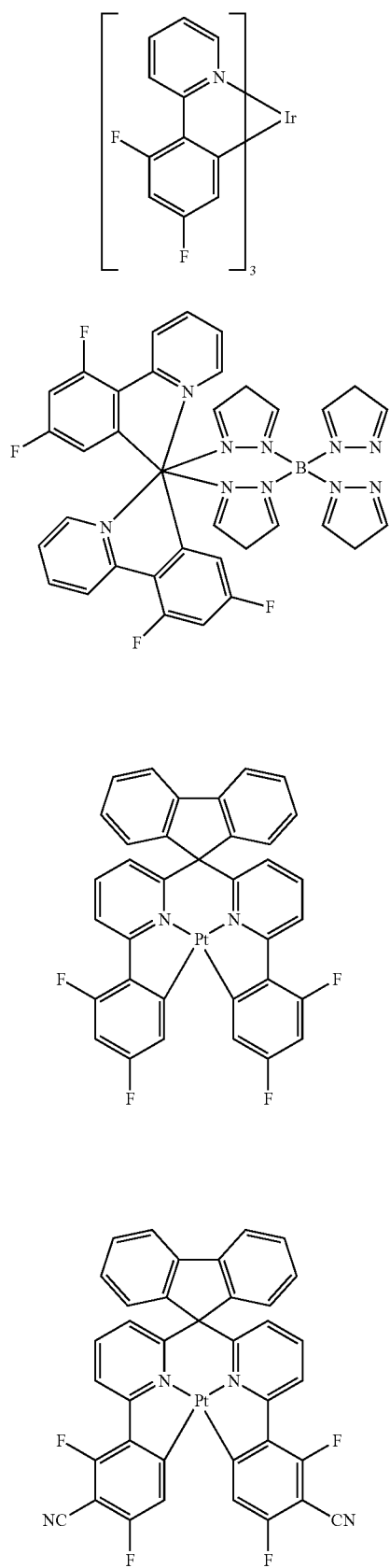
(T-134)
(T-135)
(T-136)
(T-137)

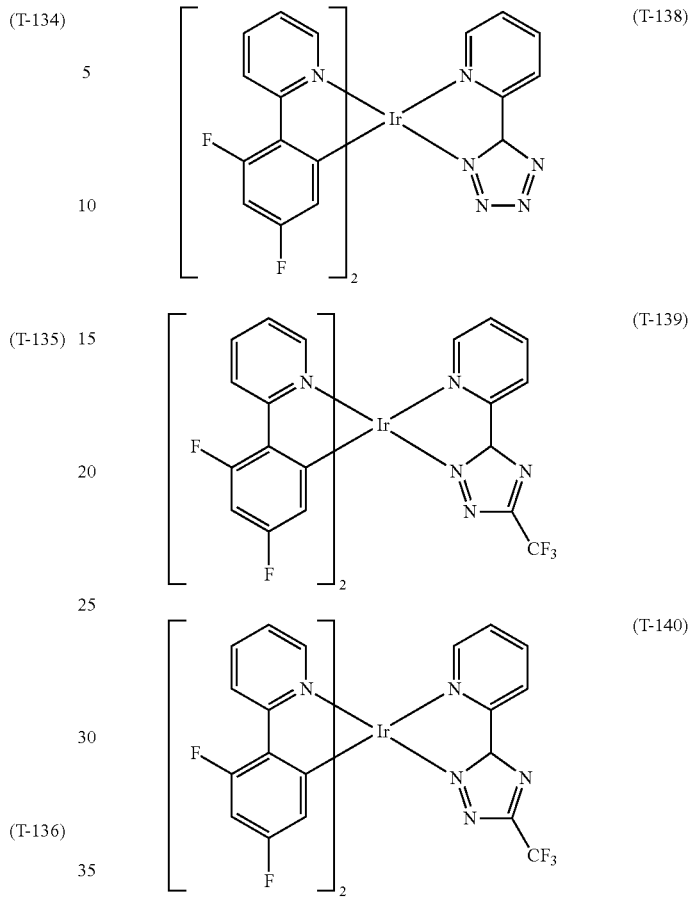
(T-138)
(T-139)
(T-140)

The mixture according to the invention preferably comprises:
a) 1 to 70% by weight, particularly preferably 5 to 60% by weight and very particularly preferably 10 to 50% by weight of the at least one polymer or copolymer of the general formula I,
b) 1 to 70% by weight, particularly preferably 5 to 60% by weight and very particularly preferably 10 to 50% by weight of the at least one host molecule, and
c) 0.1 to 40% by weight, particularly preferably 0.5 to 30% by weight and very particularly preferably 1 to 25% by weight of emitter molecule.

It is furthermore preferred for
a) the structural unit in the side chains of the at least one polymer or copolymer to have electron-transporting functionality and for the at least one host molecule to have hole-transporting functionality, or
b) for the structural unit in the side chains of the at least one polymer or copolymer to have hole-transporting functionality and for the at least one host molecule to have electron-transporting functionality.

The polymer or copolymer backbone here is preferably a polyethylene structure. This structure can be obtained through the polymerisable compounds described above having, for example, a vinylic function. Polymerisation of this type enables homopolymers to be obtained which have a polyethylene backbone, where every second carbon atom of the chain is provided with a side chain of the general formula (I).

Corresponding copolymers can be obtained by copolymerisation of polymerisable compounds of this type with further monomers, such as, for example, ethylene, propylene, styrene, etc.

In addition, the present invention relates to a formulation which comprises a blend as described above and at least one further component.

The at least one further component here is preferably selected from the group consisting of solvents, where the formulation in this case is preferably in the form of a solution, dispersion, suspension or slurry; light stabilisers; UV stabilisers; flameproofing agents; fillers and combinations thereof.

Suitable and preferred solvents are, for example, toluene, anisole, xylenes, methyl benzoate, dimethylanisoles, trimethylbenzenes, tetralin, veratrols, tetrahydrofuran, chlorobenzene or dichlorobenzene, and mixtures thereof. The formulations as solution or dispersion or suspension are highly suitable for the generation or deposition of layers.

The mixture according to the invention is suitable for use in organic electroluminescent devices (OLEDs, PLEDs), in particular in a luminescent layer of such devices.

The invention therefore furthermore relates to the use of the blend according to the invention in organic electronic devices, in particular in organic electroluminescent devices, in particular OLEDs or PLEDs, organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), organic light-emitting electrochemical cells (OECs) or organic laser diodes (O-lasers).

The invention again furthermore relates to organic electronic devices comprising the blend according to the invention, in particular organic electroluminescent devices, comprising anode, cathode and at least one emitting layer, which is characterised in that at least one layer comprises a mixture according to the invention. In particular, such devices are designed as organic electroluminescent devices, in particular OLEDs or PLEDs, organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), organic light-emitting electrochemical cells (OECs) or organic laser diodes (O-lasers).

Apart from cathode, anode and the at least one emitting layer which was described above, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, interlayers which control, for example, the charge balance in the device may be present. In particular, such interlayers may be appropriate as interlayer between two emitting layers, in particular as interlayer between a fluorescent layer and a phosphorescent layer. Furthermore, the layers, in particular the charge-transport layers, may also be doped. Doping of the layers may be advantageous for improved charge transport. However, it should be pointed out that each of the layers mentioned above does not necessarily have to be present and the choice of layers is always dependent on the compounds used. The use of such layers is known to the person skilled in the art, and he will be able to use all materials in accordance with the prior art that are known for such layers for this purpose without an inventive step.

It is furthermore possible to use more than one emitting layer, for example two or three emitting layers, which preferably have different emission colours. A particularly preferred embodiment of the present invention relates to a white-emitting organic electroluminescent device. This is characterised in that it emits light having CIE colour coordinates in the range from 0.28/0.29 to 0.45/0.41. The general structure of a white-emitting electroluminescent device of this type is disclosed, for example, in WO 05/011013.

The cathode of the electroluminescent device according to the invention preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb and Sm). In the case of multilayered structures, further metals which have a relatively high work function, such as, for example, Ag, may also be used in addition to the said metals, in which case combinations of the metals, such as, for example, Ca/Ag or Ba/Ag, are generally used. Preference is likewise given to metal alloys, in particular alloys of an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO and NaF). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers.

The device is correspondingly (depending on the application) structured, provided with contacts and finally hermetically sealed, since the lifetime of devices of this type is drastically shortened in the presence of water and/or air.

In a preferred embodiment of the invention, the polymers according to the invention are employed as emitting compounds in an emitting layer. The organic electroluminescent device here may comprise one emitting layer or it may comprise a plurality of emitting layers, where at least one emitting layer comprises at least one polymer according to the invention, as defined above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013).

If the polymers according to the invention are employed as emitting compounds in an emitting layer, they are preferably employed in combination with one or more matrix materials. The mixture of the polymers according to the invention and the matrix material comprises between 1 and 99% by weight, preferably between 2 and 90% by weight, particularly preferably between 3 and 40% by weight, in particular between 5 and 15% by weight of the polymers according to the invention, based on the mixture as a whole comprising emitter polymer and matrix material. Correspondingly, the mixture comprises between 99 and 1% by weight, preferably between 98 and 10% by weight, particularly preferably between 97 and 60% by weight, in particular between 95 and 85% by weight of the matrix material, based on the mixture as a whole comprising emitter polymer and matrix material.

Preferred matrix materials are CBP (N,N-biscarbazolylbiphenyl), carbazole derivatives (for example in accordance with WO 05/039246, US 2005/0069729, JP 2004/288381), azacarbazoles (for example in accordance with EP 1 617 710, EP 1 617 711, EP 1 731 584, JP 2005/347160), ketones (for example in accordance with WO 04/093207), phosphine oxides, sulfoxides and sulfones (for example in accordance with WO 05/003253), oligophenylenes, aromatic amines (for example in accordance with US 2005/0069729), bipolar matrix materials (for example in accordance with WO 07/137725) or silanes (for example in accordance with WO 05/111172).

Preference is furthermore given to an organic electroluminescent device where one or more layers are coated with small molecules by means of a sublimation process, where the materials are applied by vapour deposition in vacuum-sublimation units at a pressure of less than $10^{-5}$ mbar, preferably less than $10^{-6}$ mbar, particularly preferably less than $10^{-7}$ mbar.

Preference is likewise given to an organic electroluminescent device, characterised in that one or more layers are coated by means of the OVPD (organic vapour phase deposition) process or with the aid of carrier-gas sublimation, where the materials are applied at a pressure between $10^{-5}$ mbar and 1 bar.

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose, which are obtained, if necessary, by suitable substitution.

In general, all further materials as are employed in accordance with the prior art in organic electroluminescent devices, can be employed in the emitting layer in combination with the mixture according to the invention.

Very particular preference is given to an organic electroluminescent device which is characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble systems are necessary for this purpose, as are provided by the mixture according to the invention.

The organic electroluminescent device can also be produced as hybrid system by applying one or more layers from solution and applying one or more further layers by vacuum vapour deposition.

Preference is thus furthermore given to an organic electroluminescent device which is characterised in that one or more layers are coated by means of a sublimation process, in which the materials are applied by vapour deposition in vacuum-sublimation units at an initial pressure of less than $10^{-5}$ mbar, preferably less than $10^{-6}$ mbar. However, it should be noted that the initial pressure may be even lower, for example less than $10^{-7}$ mbar.

Preference is likewise given to an organic electroluminescent device which is characterised in that one or more layers are coated by means of the OVPD (organic vapour phase deposition) process or with the aid of carrier-gas sublimation, where the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

These processes are generally known to the person skilled in the art and can be applied by him to the organic electroluminescent devices according to the invention without an inventive step.

The organic electroluminescent devices according to the invention have the following surprising advantages over the prior art:
1. The organic electroluminescent device according to the invention has very high efficiency.
2. The organic electroluminescent device according to the invention simultaneously has an improved lifetime.

The invention is described in greater detail by the following examples, without wishing to restrict it thereby. The person skilled in the art will be able, without being inventive, to produce further organic electroluminescent devices according to the invention.

WORKING EXAMPLES

A) Preparation of the Monomers

Example 1

Phenyl 4-vinylphenyl ketone (M1)

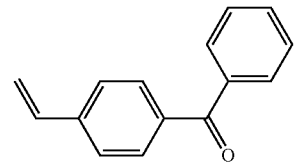 [SMILES: C=Cc1ccc(C(=O)c2ccccc2)cc1]

8.88 g of magnesium is suspended in 150 ml of dry THF in a flask which has been dried by heating, and a small amount of chlorostyrene and 2.6 ml of dichloroethane are added, and the mixture is warmed. As soon as the reaction has started, the remaining chlorostyrene (46.4 g) is added dropwise at such a rate that it boils gently. The mixture is subsequently heated under reflux for 30 minutes until the magnesium has completely dissolved. 34.2 g of benzonitrile in 60 ml of dry THF are then added dropwise over the course of 15 minutes under reflux, and the mixture is heated at the boil for a further 15 minutes.

200 ml of ice-water with 30 ml of conc. $H_2SO_4$ are initially introduced, and the batch is added with stirring, and the mixture is stirred for a further 10 minutes. The reaction mixture is subsequently transferred into a separating funnel with ethyl acetate and extended with heptane until phase separation. The phases are separated, the aqueous phase is extracted once with ethyl acetate/hexane 1/1, the organic phases are combined and washed with a saturated NaHCO$_3$ solution and water, dried over MgSO$_4$, filtered, and the solvent is stripped off in vacuo.

The residue is recrystallised from hexane (melting point: 49° C.), giving 62.5 g of a white solid.

Example 2

1st Step 2,4-Bisbiphenyl-3-yl-6-(3-bromophenyl)-1,3,5-triazine

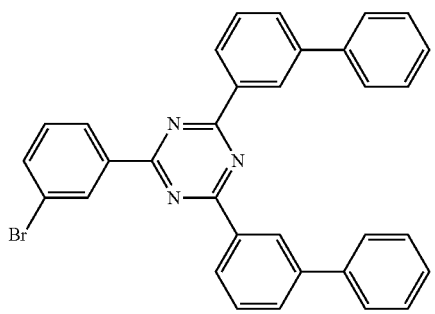 [SMILES: Brc1cccc(-c2nc(-c3cccc(-c4ccccc4)c3)nc(-c3cccc(-c4ccccc4)c3)n2)c1]

171 g of biphenyl-3-carbonitrile [24973-50-0] are slowly added at 100° C. to a suspension of 60 ml of 3-bromobenzoyl chloride [1711-09-7], 10 ml of thionyl chloride and 60.6 g of aluminium chloride in 800 ml of dichlorobenzene. The temperature increases slightly, and the reaction solution becomes an orange colour. The reaction is stirred at 115° C. until the cloudiness has disappeared. The reaction is cooled to 100° C., and aluminium chloride is added, and the mixture is stirred at 100° C. for 20 hours. The solution is cooled to room temperature and poured into 3 l of methanol, stirred for a further hour, and the resultant precipitate is filtered off with suction.

The precipitate obtained is washed in hot ethanol, filtered off with suction and dried in vacuo, giving 92 g of a white solid.

2nd Step 2,4-Bisbiphenyl-3-yl-6-(4'-vinylbiphenyl-3-yl)-1,3,5-triazine (M2)

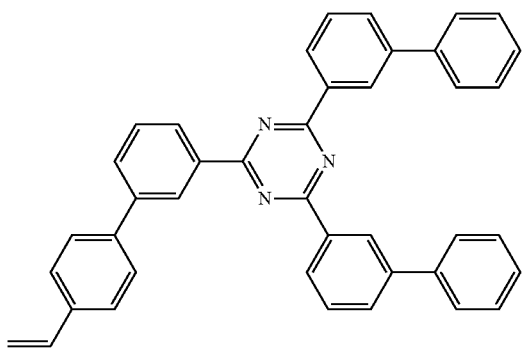 [SMILES: C=Cc1ccc(-c2cccc(-c3nc(-c4cccc(-c5ccccc5)c4)nc(-c4cccc(-c5ccccc5)c4)n3)c2)cc1]

50 g of 2,4-bisbiphenyl-3-yl-6-(3-bromophenyl)-1,3,5-triazine and 13.8 g of styreneboronic acid [2156-04-9] are dissolved in 300 ml of toluene, and 100 ml of a 2M sodium carbonate solution are added. The reaction mixture is carefully degassed, and 200 mg of tetrakistriphenylphosphine-palladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from isopropanol, giving 18.8 g (36%) of a white solid having a purity of 99.7%.

Example 3

4-Styryl-5-terphenyl (M3)

1,3,5-Tribromo-2-iodobenzene

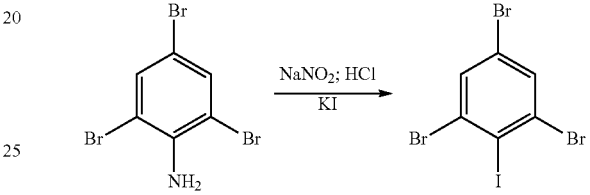

22.5 g (68.25 mmol) of tribromoaniline are dissolved in 60 ml of concentrated hydrochloric acid and cooled to 0° C. Separately, 4.92 g (71.3 mmol) of sodium nitrite are dissolved in 22.5 ml of water. This solution is added dropwise to the hydrochloric acid solution and stirred at RT for 30 min. In parallel, 113.3 g (682.5 mmol) of potassium iodide are dissolved in 171 ml of water. Reaction solution 1 is added dropwise to the potassium iodide solution and stirred at RT for 1 h. After addition of 300 ml of dichloromethane and 30 ml of a 0.5 M sodium sulfite solution, the phases are separated. The aqueous phase is washed with dichloromethane. The organic phase is washed with 10% NaOH solution and with a saturated sodium chloride solution. The combined organic phases are dried over sodium sulfate, evaporated to dryness and recrystallised in hexane/dichloromethane. 21.1 g (69%) of clean substance are isolated.

5'-Bromo-[1,1';3',1"]terphenyl

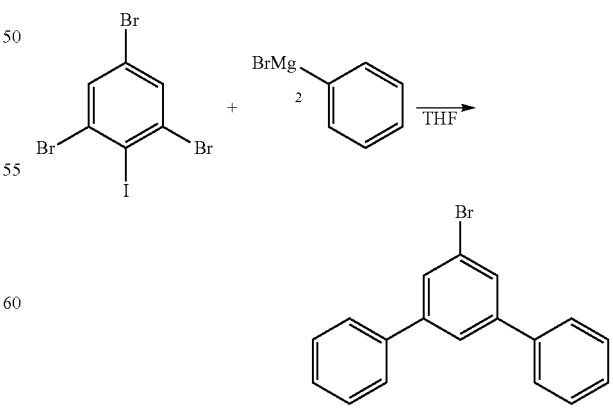

10 g (0.023 mol) of 2,4,6-tribromophenylamine are dissolved in 100 ml of THF. In a second apparatus, 228 ml of phenylmagnesium bromide is heated under reflux. The dissolved 2,4,6-tribromophenylamine is added dropwise to the phenylmagnesium bromide solution, stirred under reflux for 1 h and at room temperature for a further 12 h. After addition of saturated sodium chloride solution, the aqueous phase is washed with diethyl ether and dried over sodium sulfate. After removal of the solvent, the product is recrystallised in hexane/dichloromethane. 4.8 g (77%) of clean substance are isolated.

4-Styryl-5-terphenyl

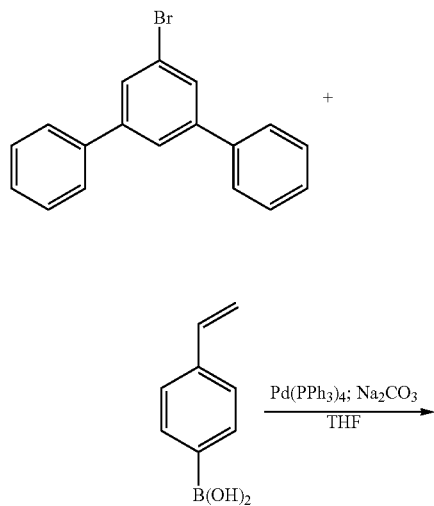

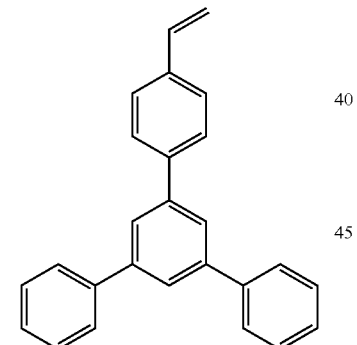

2.2 g (0.007 mol) of 5-bromoterphenyl, 1.32 g (0.010 mol) of vinylphenylboronic acid and 0.023 g (0.02 mmol) of tetrakispalladium are initially introduced. After addition of 30 ml of a 1 M sodium carbonate solution and 45 ml of THF, the mixture is stirred under reflux for 22 h.

The mixture is filtered through Celite and taken up in ethyl acetate. The organic phase is washed 3× with water. The combined organic phases are evaporated to dryness, and the residue is recrystallised from ethanol/chloroform. Further purification is carried out by column chromatography (eluent: hexane/chloroform). 1.3 g (77%) of pure substance are isolated.

Elemental Analysis:
C, 90.83%; H, 6.19%; N, 0.04%.

Example 4

5'-Vinyl-[1,1';3',1"]terphenyl (M4)

[1,1';3',1"]Terphenyl-5'-carbaldehyde

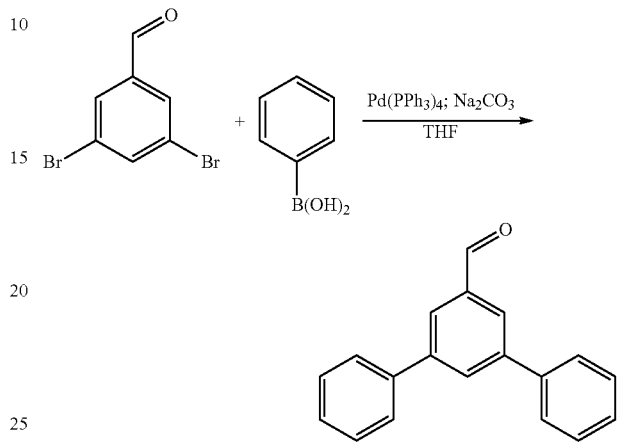

21.38 g (0.081 mol) of 3,5-dibromobenzaldehyde, 16.82 g (0.162 mol) of phenylboronic acid and 1.04 g (0.90 mmol) of tetrakispalladium are initially introduced. 500 ml of 1 M sodium carbonate solution and 300 ml of THF are added, and the reaction is brought to reaction under reflux for 24 h.

After cooling to room temperature and filtration through Celite, ethyl acetate is added to the mother liquor. The organic phase is washed a number of times with water and evaporated to dryness. A first recrystallisation is carried out in ethanol and a second is carried out in dichloromethane/hexane. After successful recrystallisation, 9.3 g (47%) of pure substance are isolated.

5'-Vinyl-[1,1';3',1"]terphenyl

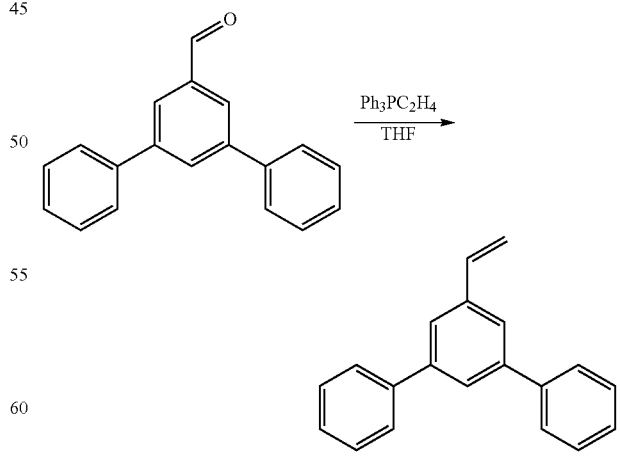

25 ml of THF are added at 0° C. to 4.82 g (0.0228 mol) of methyltriphenylphosphonium bromide and 1.64 g (0.0146 mol) of potassium tert-butoxide, and the mixture is stirred for 20 minutes.

3.33 g (0.01289 mol) of [1,1';3',1"]terphenyl-5'-carbaldehyde are dissolved in 12 ml of THF and added to methyltriphenylphosphonium bromide solution. The yellowish mixture is stirred at 0° C. for 1 h. After cooling to room temperature, the mixture is taken up in dichloromethane. The solution is washed with water, and the combined organic phases are dried over sodium sulfate. The mixture is evaporated to dryness. Column chromatography is carried out with hexane/ethyl acetate. The column chromatography results in a yield of 2.4 g (71%) of clean substance.

Elemental analysis: C, 92.68%; H, 6.69%.

Example 5

2,4-Diphenyl-6-(4'-vinylbiphenyl-3-yl)-1,3,5-triazine (M5)

2-(3-Bromophenyl)-4,6-diphenyl-1,3,5-triazine

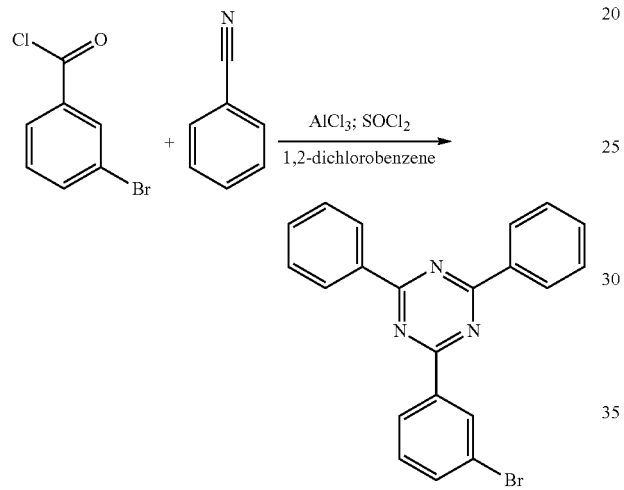

60.587 g (0.454 mol) of aluminum trichloride are initially introduced. After addition of 9.889 ml (0.136 mol) of thionyl chloride, 60 ml (0.454 mol) of 3-bromobenzoyl chloride, 800 ml of 1,2-dichlorobenzene and 98.398 ml (0.954 mol) of benzonitrile, the mixture is stirred at 100° C. for 20 h. After 1 h, 48.61 g (0.909 mol) of ammonium chloride are added.

The reaction solution is poured into 3 l of methanol and stirred for 45 min. The solid is filtered off, and 1.25 l of hot ethanol are added. The mixture is heated under reflux for a further 10 min with stirring, cooled to RT, and the product is filtered off. 37.7 g (20%) of clean substance are isolated.

2,4-Diphenyl-6-(4'-vinylbiphenyl-3-yl)-1,3,5-triazine

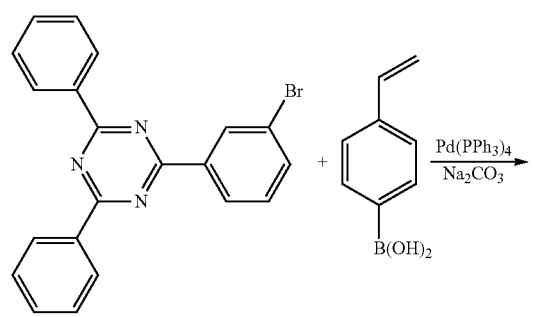

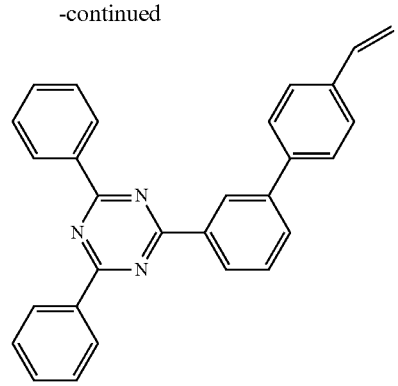

1.16 g (0.003 mol) of 2-(3-bromophenyl)-4,6-diphenyl-1,3,5-triazine, 0.74 g (0.005 mol) of 4-styreneboronic acid and 0.023 g (0.02 mmol) of tetrakispalladium phosphate are stirred under reflux for 24 h in 45 ml of THF and 30 ml of 1M sodium carbonate solution.

After cooling to room temperature, the mixture is filtered through Celite and taken up in ethyl acetate. After washing three times with water, the combined organic phases are evaporated to dryness in a rotary evaporator. The residue is recrystallised from chloroform/ethanol, which gives 0.8 g (61%) of clean substance.

Elemental Analysis:
C, 83.77%; H, 5.08%; N, 10.13%.

Example 6

2,4-Diphenyl-6-(4'-vinylbiphenyl-4-yl)-1,3,5-triazine (M6)

2-(4-Bromophenyl)-4,6-diphenyl-1,3,5-triazine

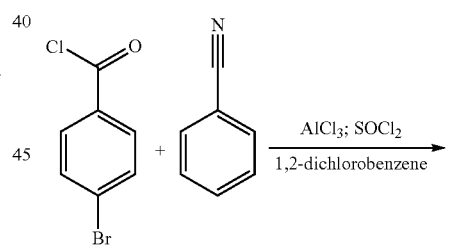

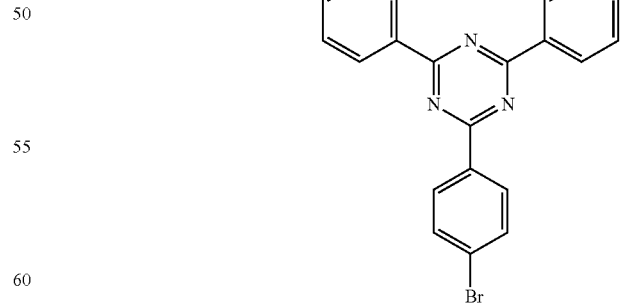

12.15 g (0.091 mol) of aluminium trichloride and 20.0 g (0.091 mol) of 4-bromobenzoyl chloride are initially introduced. The solids are dissolved in 200 ml of 1,2-dichlorobenzene. After addition of 2.20 ml (0.030 mol) of thionyl chloride and 19.90 ml (0.191 mol) of benzonitrile, the mixture is stirred at 100° C. for 20 h. After 1 h, 9.73 g (0.182 mol) of ammonium chloride are added.

The reaction solution is poured into 500 ml of methanol and stirred for 2 h. The solid is filtered off, and 250 ml of hot ethanol are added. The mixture is heated under reflux for a further 10 min with stirring, cooled to RT, and the product is filtered off. 7.6 g (21%) of clean substance are isolated.

2,4-Diphenyl-6-(4'-vinylbiphenyl-4-yl)-1,3,5-triazine

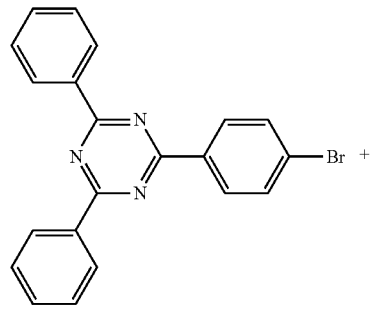

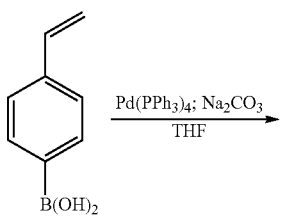

3.48 g (0.009 mol) of 3-bromophenyldiphenyltriazine, 2.22 g (0.015 mol) of 4-vinylphenylboronic acid and 0.069 g (0.06 mmol) of Pd(PPh$_3$)$_4$ are weighed out. After addition of 150 ml of THF (absolute) and 90 ml of a 1M sodium carbonate solution, the mixture is stirred under reflux for 24 h.

The mixture is filtered through Celite and taken up in ethyl acetate. After washing three times with water, the organic phase is evaporated to dryness in a rotary evaporator. The recrystallisation is carried out in a mixture of dichloromethane/hexane.

Column chromatography is carried out with hexane/ethyl acetate, which gives 1.0 g (26%) of clean substance.

Elemental Analysis:

C, 83.04%; H, 4.97%; N, 10.05%.

Example 7

2,4-Bisbiphenyl-4-yl-6-(4-bromophenyl)-1,3,5-triazine (M7)

2,4-Bisbiphenyl-4-yl-6-(4-bromophenyl)-1,3,5-triazine

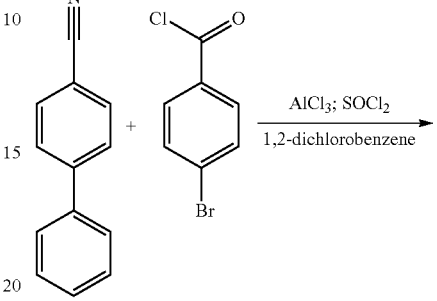

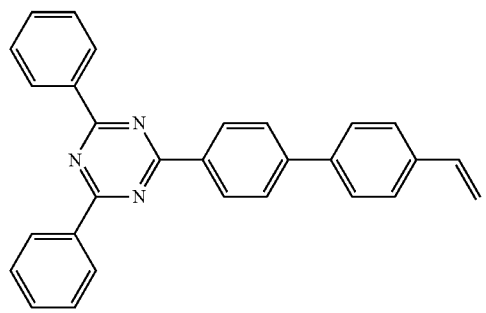

1.21 g (0.0091 mol) of aluminium chloride, 1.997 g (0.0091 mol) of 4-bromobenzoyl chloride and 3.42 g (0.01911 mol) of 4-cyanobiphenyl are initially introduced. The solids are dissolved in 80 ml of 1,2-dichlorobenzene. 0.2 ml (0.00274 mol) of thionyl chloride is added. The reaction is carried out at 120° C. for 24 h. After a reaction time of 1 h, 0.9736 g (0.00182 mol) of ammonium chloride is added. As work-up, the mixture is poured into 50 ml of methanol. The white solid is filtered off with suction and recrystallised in chloroform/ethanol. 1.7 g (34%) of clean substance are isolated.

2,4-Bisbiphenyl-4-yl-6-(4'-vinylbiphenyl-4-yl)-1,3,5-triazine

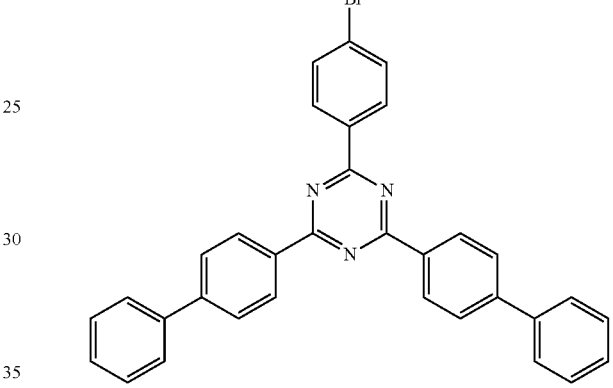

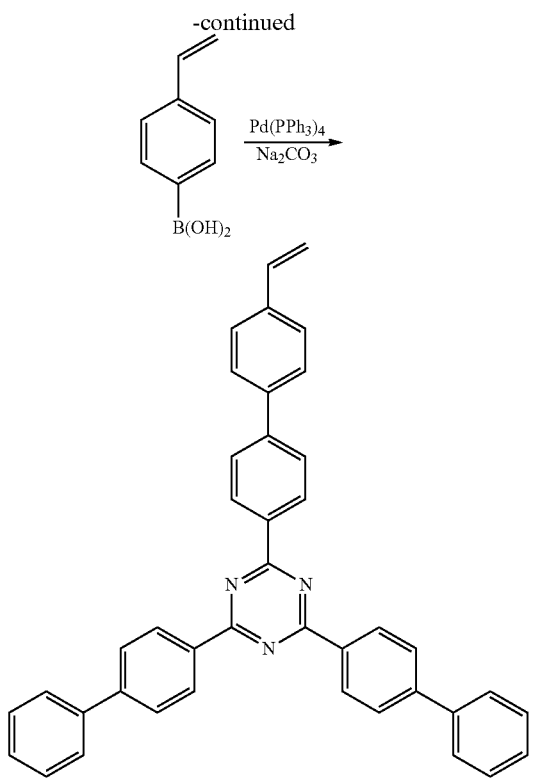

1.0 g (0.00185 mol) of 2,4-bisbiphenyl-4-yl-6-(4-bromophenyl)-1,3,5-triazine, 0.4106 g of 4-vinylphenylboronic acid and 0.02368 g of Pd(PPh₃)₄ are brought to reaction under reflux for 48 h with addition of 15 ml of 1M sodium carbonate solution and 30 ml of THF.

After filtration, the mother liquor is taken up in ethyl acetate. The organic phase is extracted three times with water. The solvent is removed completely, and a recrystallisation is carried out in chloroform/ethanol. 0.5 g (48%) of clean substance are isolated.

Elemental Analysis:

C, 87.25%; H, 5.15%; N, 7.42%.

Example 8

2,4-Bis(4-tert-butylphenyl)-6-(4'-vinylbiphenyl-4-yl)-1,3,5-triazine (M8)

2-(4-Bromophenyl)-4,6-bis(4-tert-butylphenyl)-1,3,5-triazine

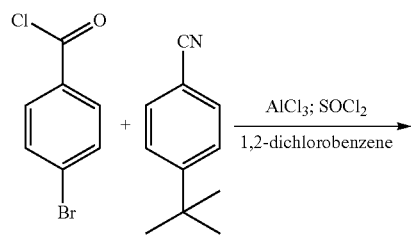

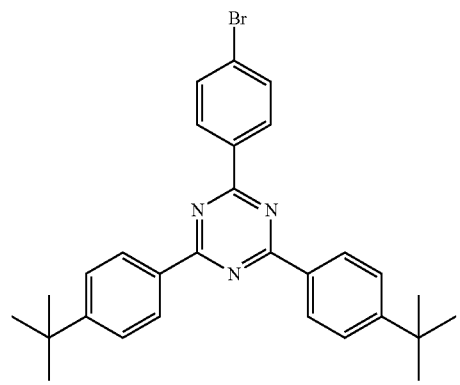

1.6747 g (0.01256 mol) of aluminium chloride are initially introduced. After addition of 5.32 ml (0.0314 mol) of 4-tert-butylbenzonitrile, 25 ml of 1,2-dichlorobenzene, 1.66 ml (0.01256 mol) of 3-bromobenzoyl chloride and 0.274 ml (0.003768 mol) of thionyl chloride, the mixture is brought to reaction at 130° C. for 24 h. After one hour, 1.344 g (0.02512 mol) of ammonium chloride are added. For work-up, the mixture is cooled and poured into 100 ml of methanol. The white precipitate is filtered off with suction. This precipitate shows 3.1 g (21%) of substance isolated in clean form.

2,4-Bis-(4-tert-butylphenyl)-6-(4'-vinylbiphenyl-4-yl)-1,3,5-triazine

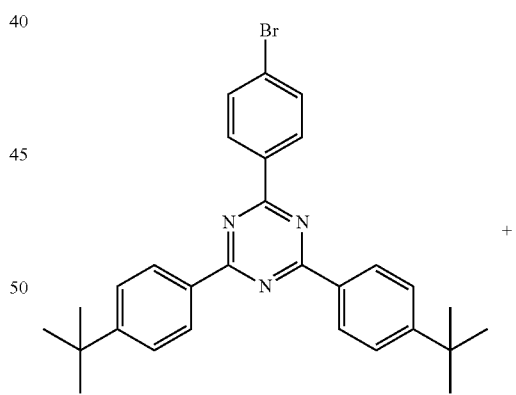

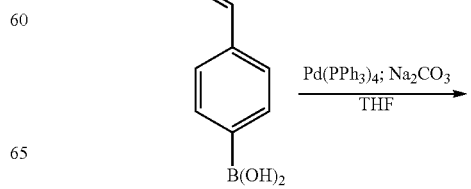

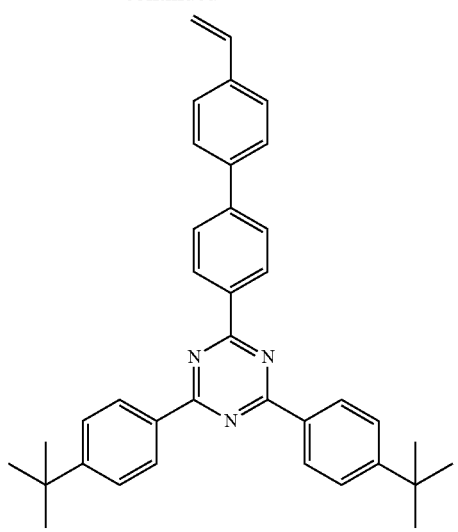

2.0 g (0.0040 mol) of 2-(4-bromophenyl)-4,6-bis-(4-tert-butylphenyl)-1,3,5-triazine and 0.8878 g (0.006 mol) of vinylphenylboronic acid and 0.050 g (0.0432 mmol) of Pd(PPh$_3$)$_4$ are initially introduced. After addition of 26 ml of sodium carbonate solution and 54 ml of THF, the mixture is brought to reaction under reflux for 24 h. For work-up, the mixture is filtered through Celite and taken up in ethyl acetate. The organic phase is extracted a number of times with water. The solvent of the combined organic phases is removed completely. A recrystallisation is carried out from chloroform/ethanol, and subsequent column chromatography is carried out with hexane:ethyl acetate. After the column chromatography, 1.6 g (76%) of clean substance are isolated.

Elemental Analysis:

C, 86.13%; H, 7.34%; N, 7.38%.

Example 9

[1,1';3',1'']Terphenyl-5'-yl-(4'-vinylbiphenyl-3-yl)methanone (M9)

(3-Bromophenyl)-[1,1';3',1'']terphenyl-5'-ylmethanone

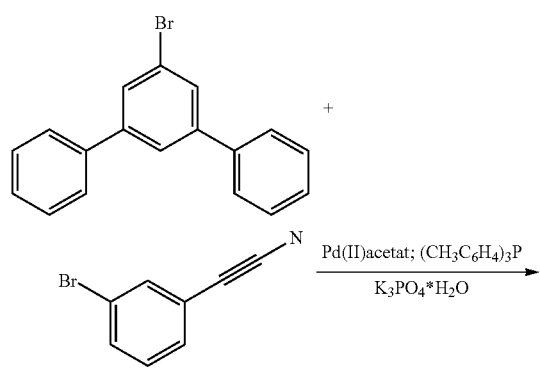

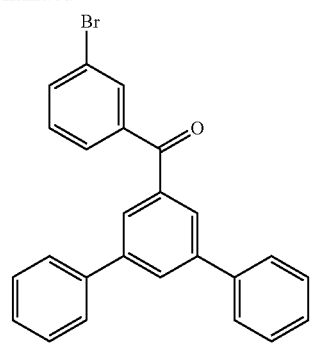

0.78 g (3.2*10$^{-2}$ mol) of magnesium is initially introduced. 9.00 g (2.91*10$^{-2}$ mol) of 5'-bromo-[1,1';3',1'']terphenyl are dissolved in 120 ml of dry THF and added via a dropping funnel. The mixture is stirred under reflux for 2 h. After cooling to −78° C., 5.30 g (2.91*10$^{-2}$ mol) of 3-bromobenzonitrile, dissolved in 100 ml of dry THF, are added dropwise. The mixture is stirred under reflux for 4 h. The reaction solution is added to saturated NH$_4$CL solution in ice-water. After dilution with ethyl acetate and washing with H$_2$O, the mixture is dried over Na$_2$SO$_4$, filtered and evaporated in a rotary evaporator.

The oil is dissolved in 60 ml of NMP, and 7.7 ml of H$_2$O and 0.67 ml of glacial acetic acid are added. The reaction mixture is stirred at 145° C. for 4 h and subsequently at room temperature overnight. The solution is taken up in ethyl acetate, washed three times with H$_2$O, dried over Na$_2$SO$_4$, filtered and evaporated to dryness. Column chromatography with toluene/hexane as eluent results in 5.69 g (55.1%) of clean product.

Elemental Analysis:

C, 72.55%; H, 4.10%.

[1,1';3',1'']Terphenyl-5'-yl-(4'-vinylbiphenyl-3-yl)methanone

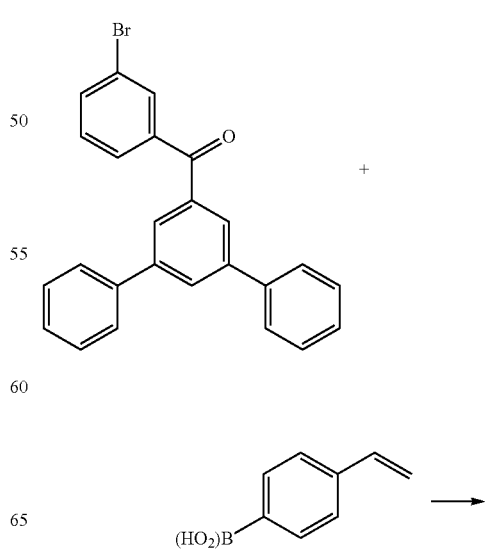

-continued

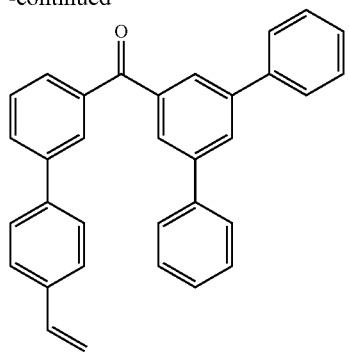

8.00 g (1.94*10⁻² mol) of 3-bromophenyl-[1,1;3',1"]-terphenyl-5'-ylmethanone; 5.73 g (3.87*10⁻² mol) of 4-vinylphenylboronic acid and 0.25 g (2.16*10⁻⁴ mol) of tetrakistripheylphosphine palladium (II) are initially introduced. After addition of 300 ml of dry THF and 200 ml of 2M sodium carbonate solution, the mixture is stirred at 60° C. overnight. The reaction solution is cooled, the organic phase is washed with saturated NaHCO₃ and H₂O, dried over Na₂SO₄, filtered and evaporated in a rotary evaporator. Column chromatography with toluene give 7.04 g (83%) of clean product.

Elemental analysis: C, 98.82%; H, 5.48%.

Example 10

9-(4'-Carbazol-9-ylbiphenyl-4-yl)-2-(4-vinylphenyl)-9H-carbazole (M10)

4-(9H-Carbazol-2-yl)benzaldehyde

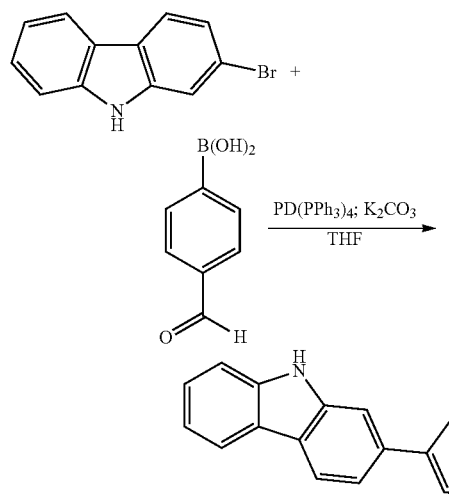

10.0 g of 2-bromo-9H-carbazole (4.06 10⁻² mol), 9.22 g of 4-formylphenylboronic acid (6.15 10⁻² mol), 0.63 g of tetrakistriphenylpalladium (5.5 10⁻⁴ mol), 42.0 g of potassium carbonate (3 10⁻¹ mol) are initially introduced. After flushing through 300 ml of water with argon, 400 ml of THF is added. The reaction mixture is stirred under reflux for 2 days. After filtration through Celite, the organic phase is separated, dried over Na₂CO₄, and the aqueous phase is washed 2× with CH₂Cl₂ and dried over Na₂SO₄. Column chromatography with toluene as eluent give 2.0 g (53%) of clean product.

9-(4'-Bromobiphenyl-4-yl)-9H-carbazole

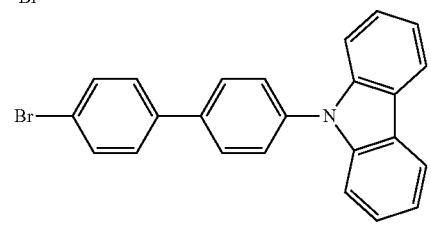

5.0 g of 9H-carbazole (3.0 10⁻² mol), 0.67 g of CuI (3.2 10⁻³ mol), 10.0 g of K₂CO₃ (7.2 10⁻² mol), 1.16 g of 1,10 phenanthroline (6.4 10⁻³ mol), and 9.36 g of 4,4'-dibromobiphenyl (3.0 10⁻² mol) are initially introduced. After addition of 200 ml of DMF, the reaction mixture is stirred under reflux for 12 h. After filtration through Celite with suction, it is precipitated using water and filtered off with suction. The solid is dissolved in hot THF and precipitated using ethanol, giving 7.7 g (64%) of clean substance.

4-[9-(4'-Carbazol-9-ylbiphenyl-4-yl)-9H-carbazol-2-yl]benzaldehyde

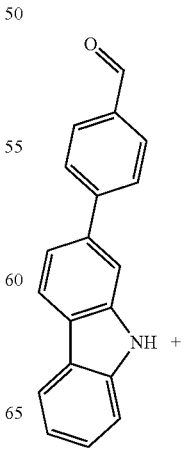

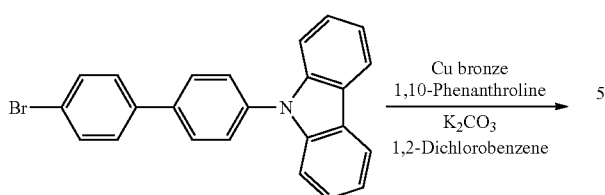

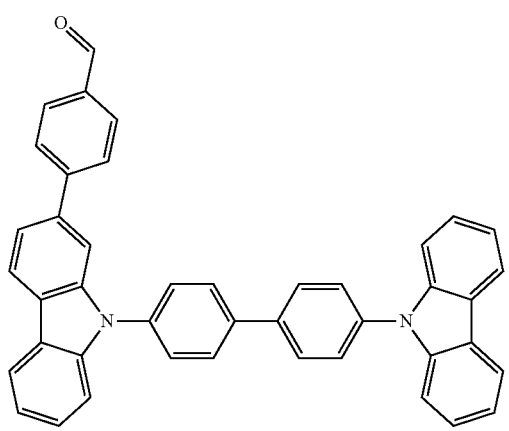

2.27 g (0.008367 mol) of 1-(9H-carbazol-2-yl)benzaldehyde, 4.0 g (0.010 mol) of 9-(4'-bromobiphenyl-4-yl)-9H-carbazole, 3.79 g of Cu bronze, 0.53 g (0.00294 mol) of 1,10-phenanthroline and 11.39 g (0.082 mol) of potassium carbonate are initially introduced. The solids are dissolved in 53 ml of 1,2-dichlorobenzene and stirred under reflux for 2 days. After filtration through Celite, the mixture is evaporated to dryness. Column chromatography with toluene/hexane as eluent give 2.4 g (49%) of clean product.

9-(4'-Carbazol-9-ylbiphenyl-4-yl)-2-(4-vinylphenyl)-9H-carbazole

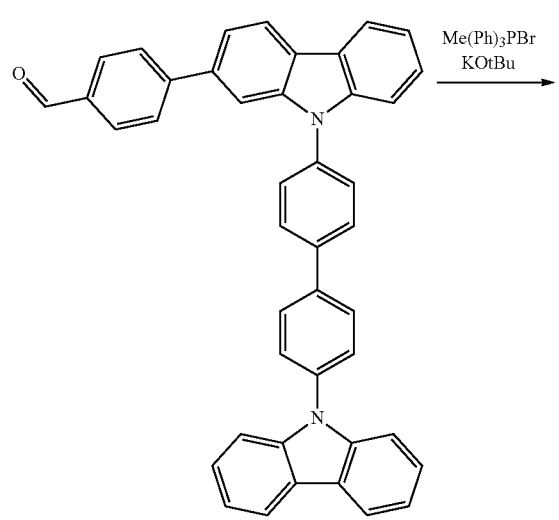

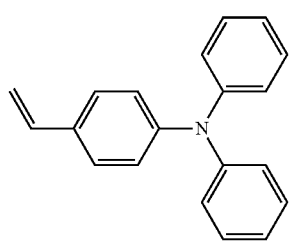 [SMILES: C=Cc1ccc(N(c2ccccc2)c2ccccc2)cc1]

0.86 g (0.00767 mol) of potassium tert-butoxylate and 2.55 g (0.00714 mol) of methyltriphenylphosphonium bromide are initially introduced. The apparatus is cooled to 0° C., and the solids are dissolved using 15 ml of THF (abs.). The mixture is stirred for 30 min, while, in a second apparatus, 2.31 g (0.0039 mol) of 4-[9-(4'-carbazol-9-ylbiphenyl-4-yl)-9H-carbazol-2-yl]benzaldehyde is weighed out and dissolved using 25 ml of THF. At 0° C., solution 2 is added to solution 1 and stirred for a further 1.5 h. The mixture is taken up in $CH_2Cl_2$ and washed by shaking three times with water. The combined organic phases are dried over magnesium sulfate, filtered off and evaporated to dryness. Column chromatography with toluene give 2.1 g (93%) of clean substance.

Elemental Analysis:
C, 89.42%; H, 5.31%; N, 4.57%.

Example 11

Preparation of a Comonomer

Diphenyl(4-vinylphenyl)amine 19 g of methylphosphonium bromide is suspended in dried THF under protective gas, and 6 g of potassium tert-butoxide are added in portions at 0° C. An immediate colour change to orange occurs. 14 g of N,N-diphenyl-p-aminobenzaldehyde are added to the reaction solution at 0° C. The mixture is warmed to room temperature and stirred for a further 20 hours. The solvent is stripped off in vacuo, the residue is taken up in dichloromethane, and the solution is extracted with water dried over magnesium sulfate, filtered, and the solvent is stripped off in vacuo.

The yellow oil obtained is chromatographed over silica gel, giving 12 g (86%) of a white solid having a purity of 99.5%.

Example 12

2,4-Bisbiphenyl-3-yl-6-{3-[2-(3-ethyloxetan-3-yl-methoxy)ethyl]phenyl}-1,3,5-triazine

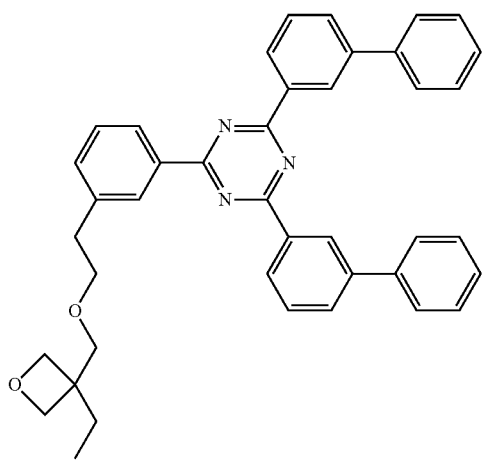 [SMILES: CCC1(COCCc2cccc(-c3nc(-c4cccc(-c5ccccc5)c4)nc(-c4cccc(-c5ccccc5)c4)n3)c2)COC1]

13.1 g of 3-ethyl-3-vinyloxymethyloxetane and 11.3 g of 9-BBN dimer (9-borabicyclo(3.3.1)nonane dimer) are dissolved in 200 ml of toluene at room temperature under protective gas and stirred for 20° C. During the reaction, the suspension of 9BBN slowly dissolves. 50 g of 2,4-bis-biphenyl-3-yl-6-(3-bromophenyl)-1,3,5-triazine and 50 ml of a 1M NaOH solution are subsequently added to the reaction solution. The reaction mixture is carefully degassed, and 200 mg of tetrakistriphenylphosphinepalladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from ethanol/toluene 3:1, giving 54 g (97%) of a white solid having a of purity 99.8%.

The structures of emitter T1 and of the small molecules used are depicted below for clarity.

Structure of Emitter T1:

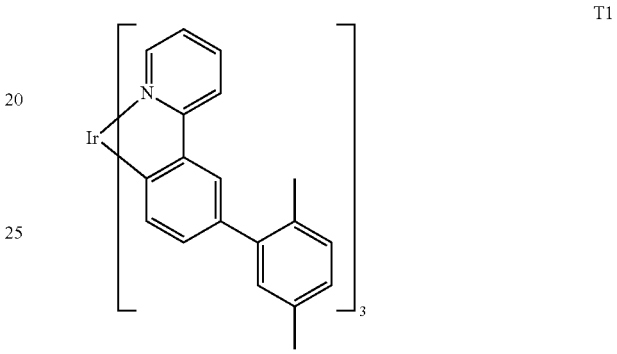

Structures of the Host Molecules Based on Small Molecules:

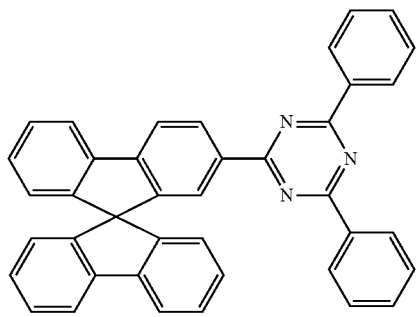

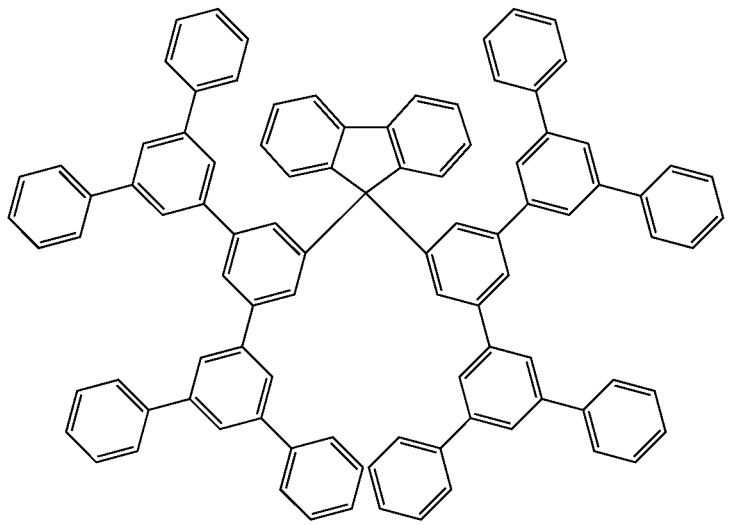

-continued
SM3
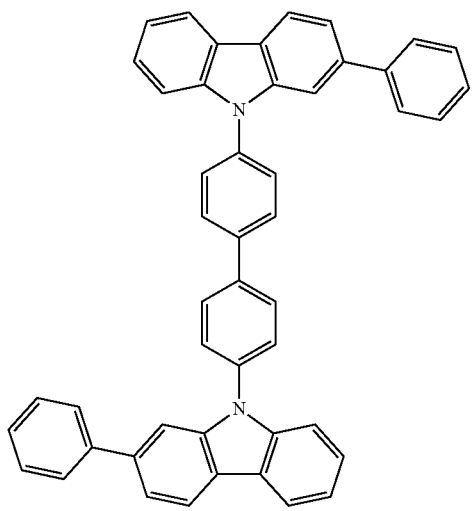
SM4
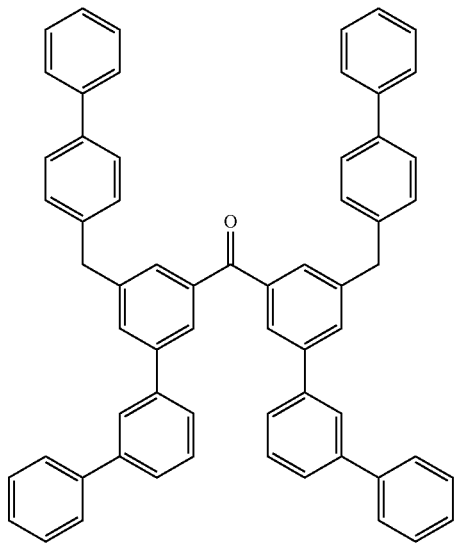
| Polymer | Elemental analysis | Device construction |
|---|---|---|
| 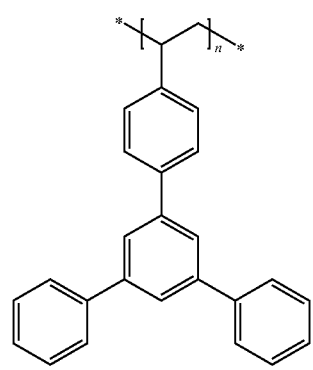<br>1.98 g (79%)<br>1 | C: 91.99%<br>H: 6.01%<br>N: 0.12%<br>Mw = 57862<br>Mn = 16710<br>Tg = 166° C. | SM1 + Polymer1 + T1<br>Polymer3 + Polymer1 + T1 |
| 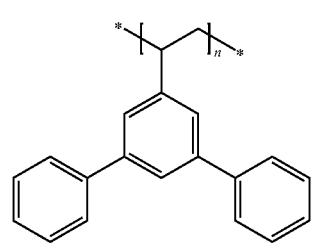<br>0.43 g (87%)<br>2 | C: 94.72%<br>H: 6.27%<br>N: 0.12%<br>Mw = 58423<br>Mn = 15661<br>Tg = 153° C. | SM1 + Polymer2 + T1 |

-continued
| Polymer | Elemental analysis | Device construction |
|---|---|---|
| 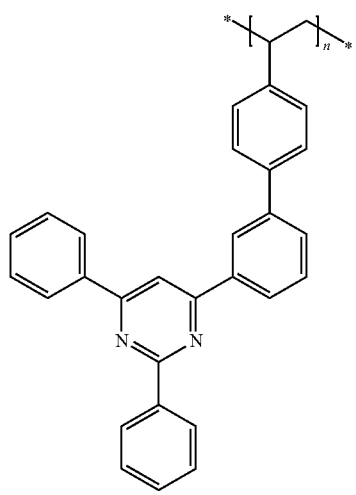<br>2.9 g (83%)<br>3 | C: 84.32%<br>H: 5.13%<br>N: 10.22%<br>Mw = 66288<br>Mn = 22908<br>Tg = 202° C. | Polymer3 + SM2 + T1<br>Polymer3 + Polymer1 + T1 |
| 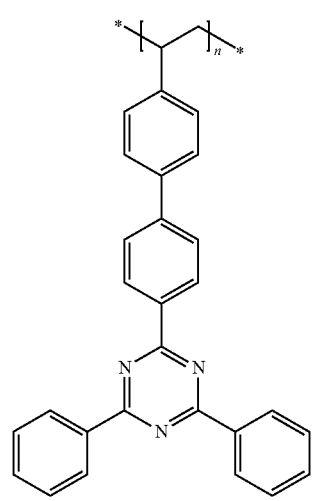<br>0.8 g (83%)<br>4 | C: 84.16%<br>H: 5.27%<br>N: 10.03%<br>Mw = 382949<br>Mn = 33213<br>Tg = 244° C. | Polymer4 + SM2 + T1 |

-continued
| Polymer | Elemental analysis | Device construction |
|---|---|---|
| 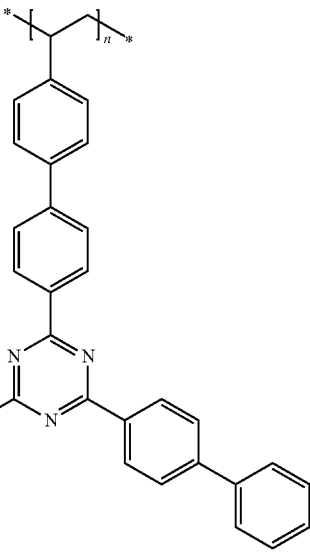  0.3 g (72%)  5 | C: 86.32% H: 5.13% N: 7.28% Mw: not measurable Mn: not measurable Tg = 294° C. | Device construction not possible |
| 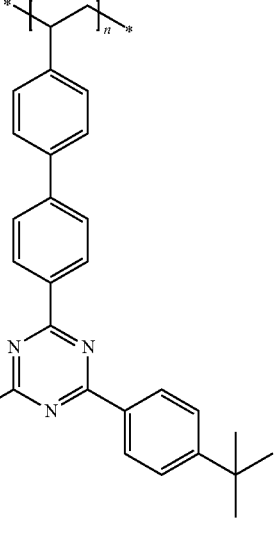  0.4 g (74%)  6 | C: 84.50% H: 7.13% N: 7.95% Mw = 100834 Mn = 34603 Tg = 277° C. | Polymer6 + SM2 + T1 |

| Polymer | Elemental analysis | Device construction |
|---|---|---|
| 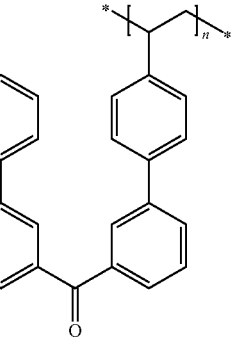  2.7 g (68%)  7 | C: 90.44% H: 5.61% N: 0.07% Mw = 100870 Mn = 48930 Tg = 154° C. | Polymer7 + SM2 + T1 Polymer7 + SM3 + T1 |
| 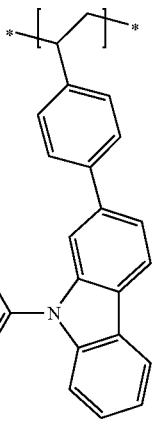  0.3 g (62%)  8 | C: 89.13% H: 5.08% N: 4.78% Mw = 208289 Mn = 82964 Tg = 267° C. | SM1 + Polymer8 + T1 SM4 + Polymer8 + T1 |

Device Results:

The PhPLED devices were each produced using the corresponding constituents (polymer/small molecule or small molecule/polymer) with mixing-in of the triplet emitter (Examples 1-5). For comparison, the polymer/polymer mixtures were then prepared using the triplet emitter (Example 6). The construction of the device structures is described below.

For the construction, use was made of ITO glass substrates having a surface resistance of 10 to 15 ohm/square which have in total four identical pixel structures of 4 mm². The following construction is carried out by way of example: the ITO substrates are cleaned by wet-chemical methods and exposed to an oxygen plasma. Immediately thereafter, the substrates are introduced into a glove box, where the PEDOT: PSS layer (Clevios®) (CH8000 or Al4083) is applied and conditioning is carried out at 180° C. for 60 min, which resulted in a dry-layer thickness of about 60 to 80 nm. A further hole-injection layer (HIL1: arylamine polymer) is then applied. This material is applied from a 0.5% solution of toluene. After conditioning of 180° C. and 60 min, a final layer thickness of about 20 nm is obtained. The polymer/small molecule and the polymer/polymer mixtures can be dissolved both in chlorobenzene and also toluene with a 2.5% solution concentration, depending on the solubility of the individual components, with addition of the triplet emitter. The spin-coating process of the finished solutions results in layer thicknesses between 50 and 110 nm. The solvent is evaporated at up to 180° C. in 15 min. The cathode structure is subsequently applied by vapour deposition under high-vacuum conditions with barium (3 nm) and aluminium (150 nm). Edge encapsulation with a CaO absorber fixed in the cover glass is then carried out. The LIV measurements are carried out using a source measure unit from Keithley 237 and a Minolta CS-2000 camera. The lifetime is determined by an accelerated lifetime test at initial luminances of 9000, 6000, 5000, 4000 cd/m².

EXAMPLES

Small Molecule/Polymer

Example 1

Small molecule SM1 is mixed with polymer 1 in the ratio 2:1 and 16.6% of triplet emitter T1. The hole-injection layer is CH8000.

| Device properties | SM1 + Polymer1 + T1 2:1 (CH8000) |
|---|---|
| Voltage/V @ 100 cd/m² | 4.0 |
| Voltage/V @ 1000 cd/m² | 5.75 |
| Voltage/V @ 5000 cd/m² | 7.3 |
| Voltage/V @ 10 mA/cm² | 7.1 |
| Luminosity/cd/A⁺ | 43 @ 6 V |
| Lifetime | 20306 h |

Example 2

Small molecule SM1 is mixed with polymer 2 in the ratio 2:1 and 16.6% of triplet emitter. The hole-injection layer was produced using CH8000.

| Device properties | SM1 + Polymer2 (2:1) + T1 (CH8000) |
|---|---|
| Voltage/V @ 100 cd/m² | 3.9 |
| Voltage/V @ 1000 cd/m² | 5.3 |
| Voltage/V @ 5000 cd/m² | 7.0 |
| Voltage/V @ 10 mA/cm² | 6.0 |
| Luminosity/cd/A⁺ | 22 @ 6.5 V |
| Lifetime | 749 h |

Example 3

Polymer 3 is mixed with small molecule SM2 in the ratio 1:2 and 16.6% of triplet emitter. The hole-injection layer was produced using CH8000.

| Device properties | Polymer3 + SM2 (1:2) + T1 (CH8000) |
|---|---|
| Voltage/V @ 100 cd/m² | 3.6 |
| Voltage/V @ 1000 cd/m² | 4.85 |
| Voltage/V @ 5000 cd/m² | 6.1 |
| Voltage/V @ 10 mA/cm² | 5.6 |
| Luminosity/cd/A⁺ | 28.6 @ 5 V |
| Lifetime | 27508 h |

Example 4

Polymer 4 is mixed with small molecule SM2 in the ratio 1:2 and 16.6% of triplet emitter. The hole-injection layer was produced using CH8000.

| Device properties | Polymer4 + SM2 (1:2) + T1 (CH8000) |
|---|---|
| Voltage/V @ 100 cd/m² | 4.2 |
| Voltage/V @ 1000 cd/m² | 6.0 |
| Voltage/V @ 5000 cd/m² | 7.7 |
| Voltage/V @ 10 mA/cm² | 7.1 |
| Luminosity/cd/A⁺ | 35 @ 5.3 V |
| Lifetime | 940 h |

Example 5

Polymer 6 is mixed with small molecule SM2 in the ratio 1:2 and 16.6% of triplet emitter. The hole-injection layer was produced using CH8000.

| Device properties | Polymer6 + SM2 (1:2) + T1 (CH8000) |
|---|---|
| Voltage/V @ 100 cd/m² | 7.3 |
| Voltage/V @ 1000 cd/m² | 10 |
| Voltage/V @ 5000 cd/m² | >10 |
| Voltage/V @ 10 mA/cm² | >10 |
| Luminosity/cd/A⁺ | 17.4 @ 10 V |
| Lifetime | 957 h |

Reference Example Polymer/Polymer

Example 6

This example shows the mixture of two polymers in the ratio 1:2 with 16.7% of triplet emitter. Here too, CH8000 was again employed for comparison.

| Device properties | Polymer3 + Polymer1 + T1 (1:2) (CH8000) |
|---|---|
| Voltage/V @ 100 cd/m² | 7.8 |
| Voltage/V @ 1000 cd/m² | >10 |
| Voltage/V @ 5000 cd/m² | >10 |
| Voltage/V @ 10 mA/cm² | >10 |
| Luminosity/cd/A⁺ | 6 @ 10 V |
| Lifetime | 152 h |

Comparison of Examples 1 to 5 with Example 6 clearly shows the advantage of the mixtures of small molecule/corresponding polymer compared with the polymer/polymer mixtures. The mixtures of small molecule/polymer are preferred, irrespective of the polymer structures employed, not only in the performance (for example luminosity at the corresponding voltages), but also, in particular, in the lifetime. Particular preference is given to polymers 1 and 3 with the corresponding small molecules.

The invention claimed is:
1. A blend comprising:
a) at least one polymer or copolymer or a mixture of a plurality of polymers and/or copolymers, where the at least one polymer or copolymer contains at least one structural unit of the following formula (I) in the side chains

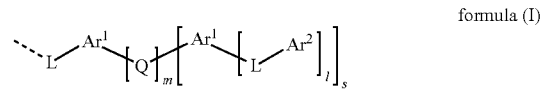

formula (I)

where the dashed line represents the connection to the polymer or copolymer backbone, and the other symbols and indices used have the following meanings:

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$;

Ar¹ is on each occurrence, identically or differently, a divalent, mono- or polycyclic, aromatic or heteroaromatic ring system having 5 to 60 aromatic ring atoms, which is optionally substituted by one or more radicals R¹;

Ar² is on each occurrence, identically or differently, a mono- or polycyclic, aromatic or heteroaromatic ring system having 5 to 60 aromatic ring atoms, which is optionally substituted by one or more radicals R¹;

Q is a unit selected from the group consisting of a group —X(=A)-, where A=O, S, Se or Te, and mono- or polycyclic aromatic ring systems having 6 to 60 aromatic carbon atoms or mono- or polycyclic heteroaromatic ring systems having 2 to 50 aromatic carbon atoms;

m is 0, 1, 2 or 3;

l is 0, 1, 2 or 3;

s is 1 in the case of Q=—X(=A)-; is 1 to 5, in the case where Q is selected from the group consisting of mono- or polycyclic aromatic ring systems having 6 to 60 aromatic carbon atoms or mono- or polycyclic heteroaromatic ring systems having 2 to 50 aromatic carbon atoms; and is 1 or 2 in the case m=0;

R¹ is on each occurrence, identically or differently, D, F, Cl, Br, I, N(Ar³)$_2$, CN, NO$_2$, Si(R²)$_3$, B(OR²)$_2$, C(=O)Ar³, P(=O)(Ar³)$_2$, S(=O)Ar³, S(=O)$_2$Ar³, —CR²=CR²(Ar³), a mono- or polycyclic, aromatic or heteroaromatic ring system having 5 to 60 aromatic ring atoms, tosylate, triflate, OSO$_2$R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH$_2$ groups is optionally replaced by R²C=CR², C≡C, Si(R²)$_2$, Ge(R²)$_2$, Sn(R²)$_2$, C=O, C=S, C=Se, C=NR², P(=O)(R²), SO, SO$_2$, NR², O, S or CONR² and where one or more H atoms is optionally replaced by F, Cl, Br, I, CN or NO$_2$, or a combination of these systems; where two or more adjacent substituents R¹ may also be linked to one another via a single covalent bond or a divalent group Z;

X is selected from the group consisting of C, P(Ar⁴), S and SO;

R² is on each occurrence, identically or differently, a straight-chain alkyl group having 1 to 20 C atoms or a branched or cyclic alkyl group having 3 to 20 C atoms, where one or more non-adjacent CH$_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH$_2$ groups is optionally replaced by NH, O or S and where one or more H atoms is optionally replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which is optionally substituted by one or more radicals R³;

Z represents a divalent group —(CR⁴$_2$)$_q$—;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent CH$_2$ groups is optionally replaced by NH, O or S and where one or more H atoms is optionally replaced by F;

b) at least one host molecule which has electron- or hole-transporting functionality, and c) at least one emitter molecule.

2. The blend according to claim 1, wherein

Q is selected from the group consisting of —X(=O)—; 1,3,5-triazylene and/or radicals derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, where the 1,3,5-triazylene or the radicals may each be substituted at any position by one or more radicals R¹, R² and/or R³ and/or is optionally linked to the aromatic or heteroaromatic ring system via any positions; and s is 1 in the case of Q=—X(=O)—; is 1 or 2 in the case Q=1,3,5-triazylene; or is 1, 2, 3, 4 or 5 in the case where Q is selected from the radicals indicated above.

3. The blend according to claim 1, wherein Ar¹ or Ar² or Ar¹ and Ar² are selected on each occurrence, independently of one another, from the group consisting of radicals derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6- quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, each of which is optionally substituted at any position by one or more radicals $R^1$, $R^2$ and/or $R^3$ and/or is optionally linked to the aromatic or heteroaromatic ring system via any positions.

4. The blend according to claim 1, wherein the structural unit of the formula (I) is selected from the group consisting of a) structural units having electron-transporting substituents, of the following general formulae (II) and/or (III)

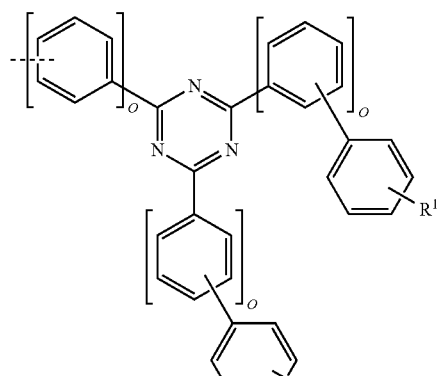

formula (II)

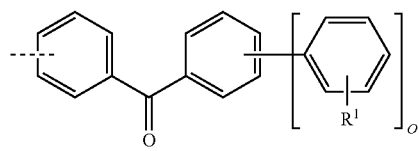

formula (III)

b) and/or structural units having hole-transporting substituents, of the general formulae (IV) and/or (V)

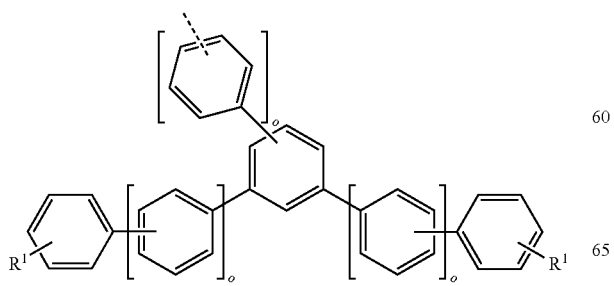

formula (IV)

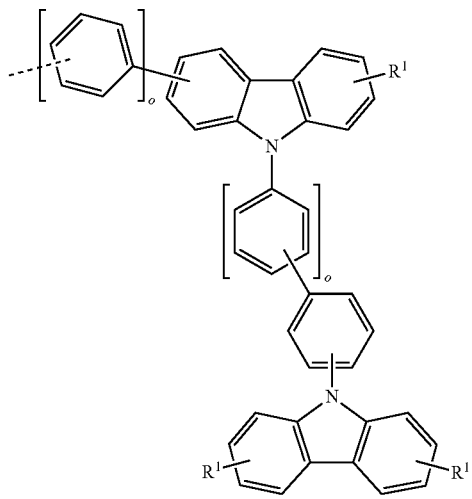

formula (V)

where the dashed line represents the connection to the polymer or copolymer backbone, $R^1$ has the meaning given above, and in each case, independently of one another, o=0 or 1 to 10.

5. The blend according to claim 1, wherein a) the structural unit having electron-transporting substituents is selected from the group consisting of the following structural units:

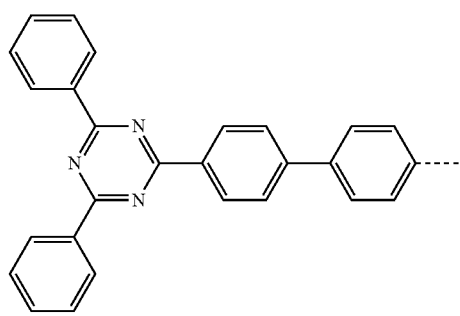

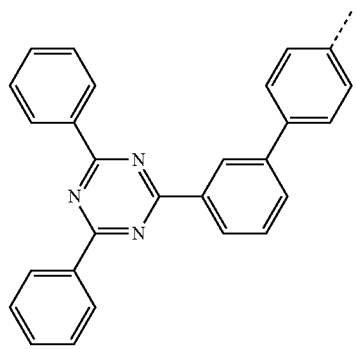

-continued

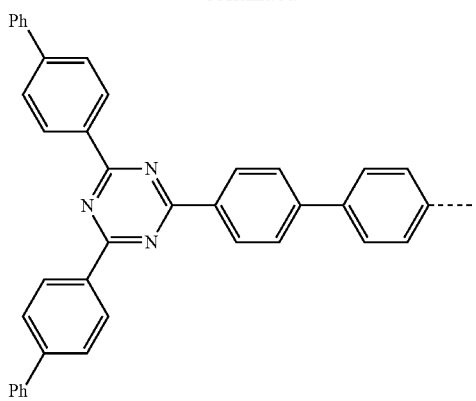

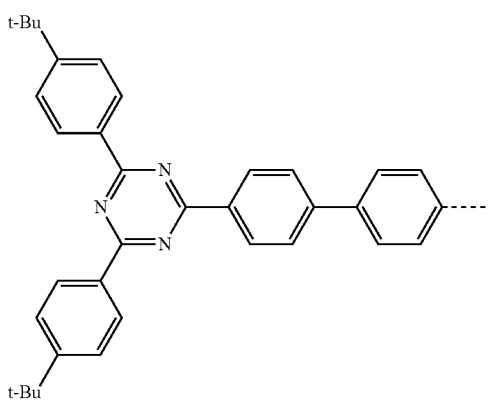

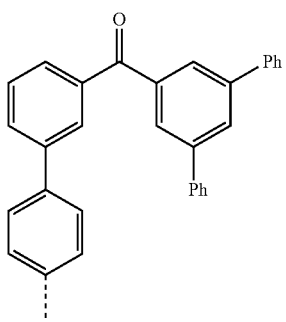

b) and/or the structural unit having hole-transporting substituents is selected from the group consisting of the following structural units:

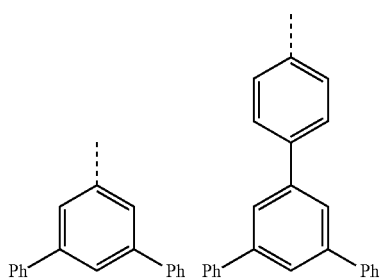

-continued

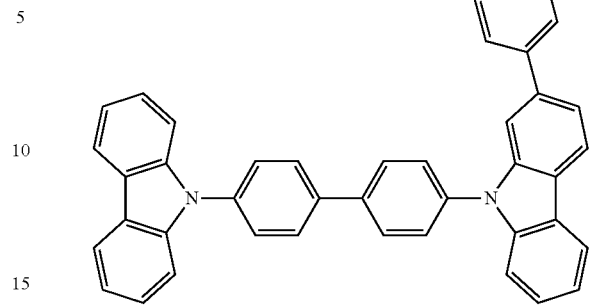

where the dashed line in each case represents the connection to the polymer or copolymer backbone.

6. The blend according to claim 1, wherein, besides the side chain containing the structural unit of the formula (I), the blend includes at least one further side chain which contains a further structural unit.

7. The blend according to claim 6, in which the further structural unit is a unit of the following formula (VI)

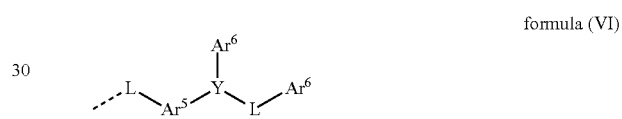

formula (VI)

where the dashed line represents the connection to the polymer backbone, and the symbol L has the same meanings as the preceding claims, and the other symbols used have the following meanings:

Y is a trivalent unit which is selected from the group consisting of N, B, Si(Ar$^4$), SiR$^5$, Ge(Ar$^4$), GeR$^5$, P and As;

Ar$^5$ is a divalent, mono- or polycyclic, aromatic or heteroaromatic ring system having 5 to 60 aromatic ring atoms, which is optionally substituted by one or more radicals R$^1$;

Ar$^6$ is a mono- or polycyclic, aromatic or heteroaromatic ring system having 5 to 60 aromatic ring atoms, which is optionally substituted by one or more radicals R$^1$;

R$^5$ is on each occurrence, identically or differently, H, D, F, Cl, Br, I, N(Ar$^3$)$_2$, CN, NO$_2$, Si(R$^2$)$_3$, B(OR$^2$)$_2$, C(=O)Ar$^3$, P(=O)(Ar$^3$)$_2$, S(=O)Ar$^3$, S(=O)$_2$Ar$^3$, —CR$^2$=CR$^2$(Ar$^3$), tosylate, triflate, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aryloxy or heteroaryloxy group having 5 to 60 aromatic ring atoms, which is optionally substituted by one or more radicals R$^2$, or a combination of these systems; where two or more adjacent substituents R$^5$ may also be linked to one another via a single covalent bond or a divalent group Z;

R$^1$ is on each occurrence, identically or differently, D, F, Cl, Br, I, N(Ar$^3$)$_2$, CN, NO$_2$, Si(R$^2$)$_3$, B(OR$^2$)$_2$, C(=O)Ar³, P(=O)(Ar³)₂, S(=O)Ar³, S(=O)₂Ar³, —CR²=CR²(Ar³), a mono- or polycyclic, aromatic or heteroaromatic ring system having 5 to 60 aromatic ring atoms, tosylate, triflate, OSO₂R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or a combination of these systems; where two or more adjacent substituents R¹ may also be linked to one another via a single covalent bond or a divalent group Z;

X is selected from the group consisting of C, P(Ar⁴), S and SO;

R² is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F, or a mono- or polycylic, aromatic or heteroaromatic ring system having 5 to 20 aromatic ring atoms, which may in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which is optionally substituted by one or more radicals R³;

Z represents a divalent group —(CR⁴₂)_q—; and

R⁴ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F.

8. The blend according to claim 7, wherein the further structural unit is a unit of the following formula (VII)

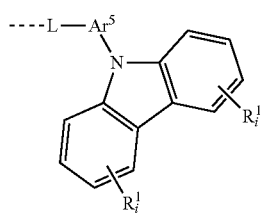

formula (VII)

where the dashed line represents the connection to the polymer backbone, the non-specific bonds which end in the centre of the aromatic rings indicate that the radical R¹ may sit at each of positions 1 to 8 of the carbazole, the symbols L, R¹ and Ar⁵ have the same meanings as in claim 7, and the index i is equal to 0, 1, 2, 3 or 4.

9. The blend according to claim 7, wherein the further structural unit is a unit of the following formula (VIII)

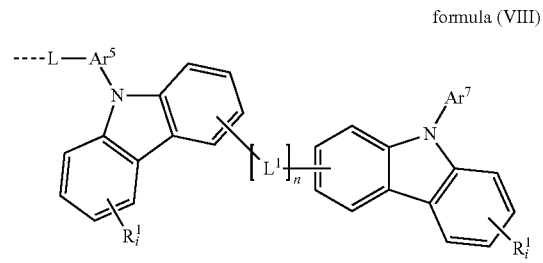

formula (VIII)

where the dashed line represents the connection to the polymer backbone, the non-specific bonds which end in the centre of the aromatic rings indicate that the symbols R¹ and L¹ may each sit at each of the corresponding positions 1 to 8 of the carbazole, the symbols L, R¹ and Ar⁵ and the index i have the same meanings as in claim 7, and the other symbols and indices used have the following meanings:

L¹ is on each occurrence, identically or differently, a single covalent bond or a straight-chain alkylene group having 1 to 20 C atoms or a branched or cyclic alkylene group having 3 to 20 C atoms, each of which is optionally substituted by one or more radicals R¹, where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂;

n is equal to 0, 1, 2 or 3, with the proviso that, if n>1, a maximum of one L¹ is optionally an aromatic or heteroaromatic ring system;

Ar⁷ is a mono- or polycyclic, aromatic or heteroaromatic ring system having 5 to 60 aromatic ring atoms, which is optionally substituted by one or more radicals R¹.

10. The blend according to claim 7, wherein the further structural unit is a unit of the following formula (IX)

formula (IX)

where the dashed line represents a connection to the polymer backbone, and the symbols and indices used have the following meanings:

L² and L³ are, independently of one another, on each occurrence, identically or differently, a mono- or polydentate ligand;

M is a transition metal, a main-group metal, a lanthanoid or an actinoid;

r is equal to 0, 1, 2, 3, 4, 5, 6 or 7, depending on the denticity of the ligands L² and L³ and the coordination number of the metal M.

11. The blend according to claim 7, wherein the further structural unit is a unit of the following formula (XI)

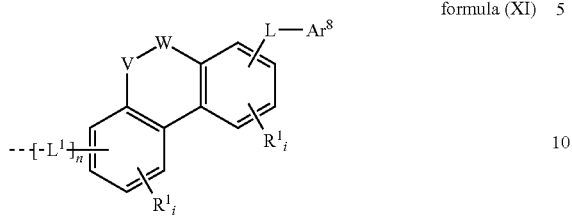

formula (XI)

where the dashed line represents the connection to the polymer backbone, the non-specific bonds which end in the centre of the aromatic rings indicate that the symbols $R^1$, L and $L^1$ may each sit at each of the free positions of the aromatic rings, the symbols $R^1$, L and $L^1$ and the indices i and n have the same meanings as in the above claims, and the other symbols used have the following meanings:

V and W are selected, independently of one another, from the group from $C(Ar^3)_2$, $C(R^5)_2$, $Si(Ar^3)_2$, $Si(R^5)_2$, $Ge(Ar^3)_2$, $Ge(R^5)_2$, C=O, O, S, Se, $N(Ar^4)$, $N(R^5)$, $P(Ar^4)$, $P(R^5)$, P=O($Ar^3$), P=O($R^5$), B and $(R^5)_2CO$;

$Ar^8$ is a mono- or polycyclic, aromatic or heteroaromatic ring system having 5 to 60 aromatic ring atoms, which is optionally substituted by one or more radicals $R^1$;

where the symbols $R^5$, $Ar^3$ and $Ar^4$ have the same meanings as defined in the above claims.

12. The blend according to claim 1, wherein the at least one host molecule is selected from the group consisting of a) carbazole compounds of the general formula (XIII)

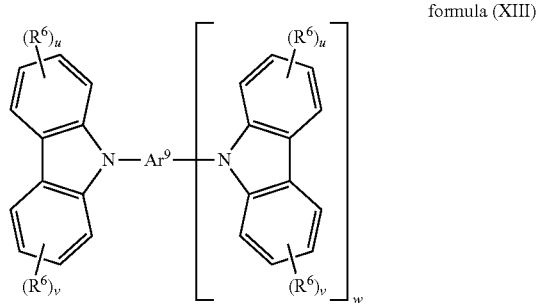

formula (XIII)

where the following applies to the symbols and indices used;

$Ar^9$ is on each occurrence an aromatic or heteroaromatic ring system having 5 to 60 aromatic ring atoms, which is optionally substituted by one or more radicals $R^6$;

$R^6$ is on each occurrence, identically or differently, H, D, F, Cl, Br, I, $N(Ar^{10})_2$, CN, $NO_2$, $Si(R^7)_3$, $B(OR^7)_2$, C(=O)$Ar^{10}$, P(=O)$(Ar^{10})_2$, S(=O)$Ar^{10}$, $S(=O)_2Ar^{10}$, —$CR^7$=$CR^7(Ar^{10})$, $OSO_2R^7$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^7$, where one or more non-adjacent $CH_2$ groups is optionally replaced by $R^7C$=$CR^7$, C≡C, $Si(R^7)_2$, $Ge(R^7)_2$, $Sn(R^7)_2$, C=O, C=S, C=Se, C=$NR^7$, P(=O)($R^7$), SO, $SO_2$, $NR^7$, O, S or $CONR^7$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^7$, or an aryloxy or heteroaryloxy group having 5 to 60 aromatic ring atoms, which is optionally substituted by one or more radicals $R^7$, or a combination of these systems; two or more substituents $R^6$ and/or $R^7$ here may also form a mono or polycyclic aliphatic or aromatic ring system with one another;

$Ar^{10}$ is on each occurrence, identically or differently, an aromatic or heteroaromatic ring system having 5 to 60 aromatic ring atoms, which is optionally substituted by one or more radicals $R^7$;

$R^7$ is on each occurrence, identically or differently, H, D or an aliphatic, aromatic and/or heteroaromatic hydrocarbon radical having 1 to 20 C atoms; or an aromatic or heteroaromatic ring system having 5 to 60 aromatic ring atoms, which is optionally substituted by one or more radicals R;

R is on each occurrence, identically or differently, H, D, $N(Ar^{10})_2$, a straight-chain alkyl group having 1 to 5 C atoms or branched alkyl group having 3 to 5 C atoms, where in each case one or more non-adjacent $CH_2$ groups is optionally replaced by —$R^8C$=$CR^8$—, where $R^8$ is as defined below, or —O— and where one or more H atoms is optionally replaced by F, or an aryl group having 6 to 16 C atoms or heteroaryl group having 2 to 16 C atoms or a spirobifluorene group, each of which is optionally substituted by one or more radicals $R^7$, or a combination of two of these systems; two or more substituents $R^7$ here may also form a mono- or polycyclic, aliphatic, aromatic or heteroaromatic ring system with one another;

u is on each occurrence, identically or differently, 0, 1, 2, 3 or 4;

v is on each occurrence, identically or differently, 0, 1, 2, 3 or 4; and w is 1, 2, 3, 4 or 5; and/or b) neutral compounds of the general formulae (XIV) or (XV)

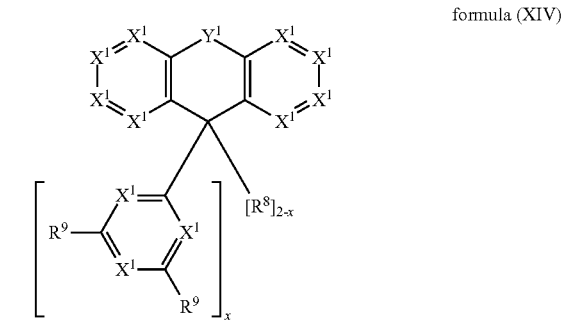

formula (XIV)

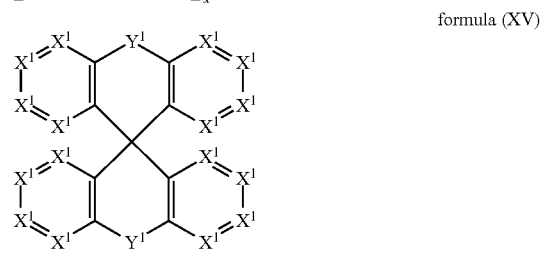

formula (XV)

where the following applies to the symbols and indices used:

$X^1$ is on each occurrence, identically or differently, $CR^8$; or two directly adjacent groups $X^1$ stand for a unit of the following formula (XVI),

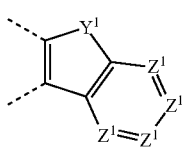

formula (XVI)

where the dashed bonds indicates the linking of the unit to the adjacent C atoms;

$Y^1$ is on each occurrence, identically or differently, a single bond or a group selected from $C(R^8)_2$, $C(=C(R^8)_2)$, $Si(R^8)_2$, $C(R^8)_2-C(R^8)_2$, or $CR^8=CR^8$;

$Z^1$ is on each occurrence, identically or differently, $CR^8$;

$R^8$ is on each occurrence, identically or differently, H, D, a straight-chain alkyl, alkenyl or alkynyl group having 1 to 40 C atoms or a branched or cyclic alkyl, alkenyl or alkynyl group having 3 to 40 C atoms, each of which is optionally substituted by one or more radicals $R^{10}$, or an aromatic or heteroaromatic ring system having 5 to 60 aromatic ring atoms, which may in each case be substituted by one or more radicals $R^9$, or a combination of these systems; two or more adjacent substituents $R^8$ here may also form a mono- or polycyclic, aliphatic or aromatic ring system with one another; or a unit of the general formula (XVII)

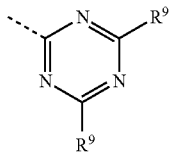

formula (XVII)

where the dashed bonds indicate the linking of the unit to the adjacent C atoms;

$R^9$ is on each occurrence, identically or differently, H, D or an aromatic or heteroaromatic ring system having 5 to 60 aromatic ring atoms, which is optionally substituted by one or more radicals $R^8$;

$R^{10}$ is on each occurrence, identically or differently, H, D or an aliphatic, aromatic and/or heteroaromatic hydrocarbon radical having 1 to 20 C atoms, in which, in addition, H atoms is optionally replaced by F; two or more adjacent substituents $R^{10}$ here may also form a mono- or polycyclic, aliphatic or aromatic ring system with one another; and x is 1 or 2; and/or c) neutral compounds of the general formula (XXX)

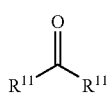

formula (XXX)

where $R^{11}$ an aromatic or heteroaromatic ring system having 5 to 60 aromatic ring atoms, which may in each case be substituted by one or more radicals $R^9$, or a combination of these systems; two or more adjacent substituents $R^{10}$ here may also form a mono- or polycyclic, aliphatic or aromatic ring system with one another; or a unit of the general formula (XXXI)

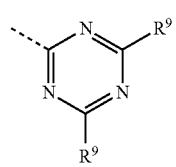

formula (XXXI)

where the dashed bonds indicate the linking of the unit to the C atom of the keto group.

13. The blend according to claim 1, wherein
a) the at least one host molecule has electron-transporting functionality and is selected from the group consisting of the compounds depicted below

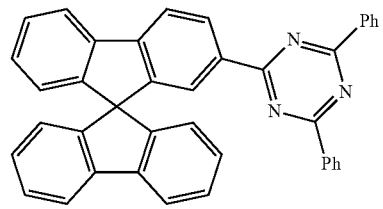

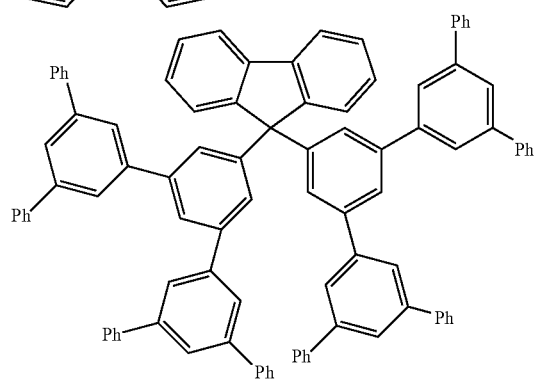

b) and/or the at least one host molecule has hole-transporting functionality and is selected from the group consisting of the compounds depicted below

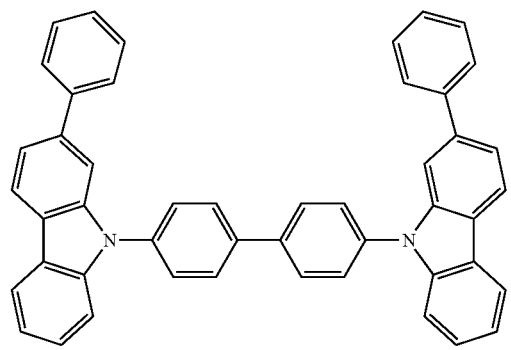

-continued

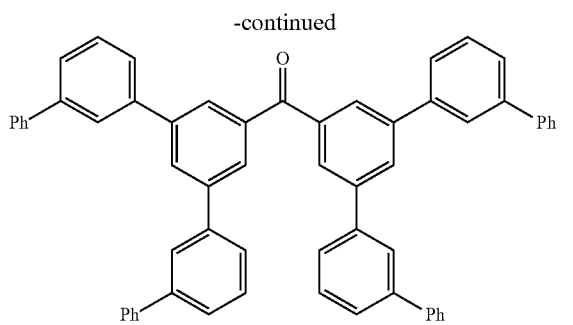

14. The blend according to claim 1, wherein the emitter molecule is a compound of the formulae (21) to (24),

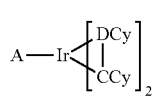  formula (21)

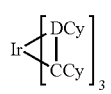  formula (22)

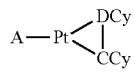  formula (23)

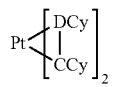  formula (24)

where the following applies to the symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents selected from the group consisting of $R^{12}$ or CN, borane radicals or silyl radicals, where $R^{12}$ is selected from the group consisting of H, D or an aliphatic or aromatic hydrocarbon radical having 1 to 20 C atoms; the groups DCy and CCy are connected to one another via a covalent bond;

CCy is, identically or differently on each occurrence, a cyclic group which contains a carbon atom via which the cyclic group is bonded to the metal and which may in turn carry one or more substituents selected from the group consisting of H, D, F, CN, secondary or tertiary amines, a straight-chain, branched or cyclic alkyl, alkoxy or thioalkoxy group having 1 to 40 C atoms, or an aromatic or heteroaromatic ring system having 1 to 60 C atoms;

A is, identically or differently on each occurrence, a monoanionic, bidentate-chelating ligand, preferably a diketonate ligand; and $R^{12}$ is on each occurrence, identically or differently, H, D, F, CN, $N(R^{13})_2$, a straight-chain, branched or cyclic alkyl, alkoxy or thioalkoxy group having 1 to 40 C atoms, which is optionally substituted by $R^{14}$ or may also be unsubstituted, where one or more non-adjacent $CH_2$ groups is optionally replaced by $—R^{15}C=CR^{15}—$, $—C\equiv C—$, $Si(R^{15})_2$, $Ge(R^{15})_2$, $Sn(R^{15})_2$, $C=O$, $C=S$, $C=Se$, $C=NR^{15}$, $—O—$, $—S—$, $—NR^{15}$ or $—CONR^{15}—$ and where one or more H atoms is optionally replaced by F, Cl, Br, I, CN or $NO_2$, or an aromatic or heteroaromatic ring system having 1 to 60 C atoms, which is optionally substituted by one or more radicals $R^{14}$, where two or more substituents $R^{12}$ may also, together with the atoms to which they are bonded, form a mono- or polycyclic, aliphatic or aromatic ring system with one another; where at least one group $R^{12}$ has a bond to a further structural unit of the polymer;

$R^{13}$ is on each occurrence, identically or differently, a straight-chain, branched or cyclic alkyl or alkoxy group having 1 to 22 C atoms, in which, in addition, one or more non-adjacent C atoms is optionally replaced by $—R^{15}C=CR^{15}—$, $—C\equiv C—$, $Si(R^{15})_2$, $Ge(R^{15})_2$, $Sn(R^{15})_2$, $—NR^{15}—$, $—O—$, $—S—$, $—CO—O—$, $—O—CO—O—$, where, in addition, one or more H atoms is optionally replaced by fluorine, an aryl, heteroaryl or aryloxy group having 1 to 40 C atoms, which may also be substituted by one or more radicals $R^{14}$, or OH or $N(R^{14})_2$;

$R^{14}$ is on each occurrence, identically or differently, $R^{15}$ or CN, $B(R^{15})_2$ or $Si(R^{15})_3$;

$R^{15}$ is on each occurrence, identically or differently, H, D or an aliphatic or aromatic hydrocarbon radical having 1 to 20 C atoms.

15. The blend according to claim 1, wherein the proportion of the emitter molecule in the mixture is 0.1 to 40% by weight.

16. The blend according to claim 1, wherein
a) the structural unit in the side chains of the at least one polymer or copolymer has electron-transporting functionality and the at least one host molecule has hole-trans-porting functionality, or
b) the structural unit in the side chains of the at least one polymer or copolymer has hole-transporting functionality and the at least one host molecule has electron-transporting functionality.

17. The blend according to claim 1, wherein the polymer backbone is a polyethylene structure.

18. A formulation comprising the blend according to claim 1, and at least one further component.

19. The formulation according to claim 18, wherein the at least one further component is selected from the group consisting of solvents, where the formulation in is in the form of a solution, dispersion, suspension or slurry; light stabilisers; UV stabilisers; flameproofing agents; fillers or combinations thereof.

20. An electronic device comprising an anode, a cathode and a layer, arranged between anode and cathode, comprising the blend according to claim 1.

21. The electronic device according to claim 20, comprising a layer, arranged between the cathode and the layer comprising the blend, comprising a conductive polymer.

22. The electronic device according to claim 21, comprising a hole-injection layer comprising an arylamine polymer, arranged between the conductive polymer and the layer comprising the blend.

23. The electronic device according to claim 21, wherein
a) the cathode is formed from a semiconducting mixed oxide, and/or
b) the anode is formed from metals.

24. The electronic device according to claim 21, wherein
a) the anode is applied to a a glass or plastic substrate, which is arranged on the side of the anode facing away from the layer comprising the blend, and/or
b) the cathode is provided with a cover glass or a transparent plastic, which is arranged on the side of the cathode facing away from the layer comprising the blend.

25. The electronic device according to claim 21, wherein the layer thickness
   a) of the layer comprising the blend is from 10 to 1000 nm,
   b) of the cathode is from 3 to 300 nm,
   c) of the layer comprising the conductive polymer is from 10 to 500 nm, and/or
   d) of the hole-injection layer is from 5 to 500 nm.

26. The electronic device according to claim 21, wherein the electronic device is selected from the group consisting of organic electroluminescent device, organic integrated circuit, organic field-effect transistor, organic thin-film transistor, organic light-emitting transistor, organic solar cell, organic optical detector, organic photoreceptor, organic field-quench device, organic light-emitting electrochemical cell or organic laser diode.

27. The electronic device according to claim 20, comprising a layer, arranged between the cathode and the layer comprising the blend, comprising PEDOT:PSS.

28. A compound of the following formula (Ia)

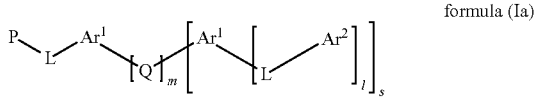

formula (Ia)

wherein
   L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$;
   $Ar^1$ is on each occurrence, identically or differently, a divalent, mono- or polycyclic, aromatic or heteroaromatic ring system having 5 to 60 aromatic ring atoms, which is optionally substituted by one or more radicals $R^1$;
   $Ar^2$ is on each occurrence, identically or differently, a mono- or polycyclic, aromatic or heteroaromatic ring system having 5 to 60 aromatic ring atoms, which is optionally substituted by one or more radicals $R^1$;
   Q is a unit selected from the group consisting of a group —X(=A)-, where A=O, S, Se or Te, and mono- or polycyclic aromatic ring systems having 6 to 60 aromatic carbon atoms or mono- or polycyclic heteroaromatic ring systems having 2 to 50 aromatic carbon atoms;
   m is 0, 1, 2 or 3;
   l is 0, 1, 2 or 3;
   s is 1 in the case of Q=—X(=A)-; is 1 to 5, in the case where Q is selected from the group consisting of mono- or polycyclic aromatic ring systems having 6 to 60 aromatic carbon atoms or mono- or polycyclic heteroaromatic ring systems having 2 to 50 aromatic carbon atoms; and is 1 or 2 in the case m=0;
   $R^1$ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, —$CR^2=CR^2(Ar^3)$, a mono- or polycyclic, aromatic or heteroaromatic ring system having 5 to 60 aromatic ring atoms, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or a combination of these systems; where two or more adjacent substituents $R^1$ may also be linked to one another via a single covalent bond or a divalent group Z;
   X is selected from the group consisting of C, $P(Ar^4)$, S and SO;
   $R^2$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals $R^3$; where two or more substituents $R^2$ may also be linked to one another via a single covalent bond or a divalent group Z;
   $R^3$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F; where two or more substituents $R^3$ may also be linked to one another via a single covalent bond or a divalent group Z;
   $Ar^3$ and $Ar^4$ are on each occurrence, identically or differently, a mono- or polycyclic, aromatic or heteroaromatic ring system having 5 to 60 aromatic ring atoms, which is optionally substituted by one or more radicals $R^3$;
   Z represents a divalent group —$(CR^4_2)_q$—;
   q is equal to 1, 2, 3, 4 or 5;
   $R^4$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F,
   and the symbol P is a polymerisable group.

* * * * *

UNITED STATES PATENT AND TRADEMARK OFFICE
CERTIFICATE OF CORRECTION

PATENT NO. : 8,786,181 B2  
APPLICATION NO. : 13/879081  
DATED : July 22, 2014  
INVENTOR(S) : Thomas Eberle et al.

Page 1 of 1

It is certified that error appears in the above-identified patent and that said Letters Patent is hereby corrected as shown below:

In the Specification

Col. 1 line 12 insert new paragraph as follows

--This Patent is subject to a Joint Research Agreement under 35 U.S.C. § 103(c)(2)(c). The names of the Parties to the Joint Research Agreement are as follows:

DELO Industrie Klebstoffe GmbH & Co. KGaA, Windach, Germany;  
HC Starck Clevios GmbH, Goslar, Germany;  
Merck KGaA, Darmstadt, Germany;  
Ormecon GmbH, Ammersbeck, Germany;  
Fraunhofer-Gesellschaft zur Förderung der angewandten Forschung e.V., Munchen, Germany;  
Fraunhofer Institut Angewandte Polymerforschung, Potsdam-Golm, Germany;  
Humboldt-Universität zu Berlin, Berlin Germany;  
Universität Potsdam, Potsdam, Germany;  
Universität Regensburg, Regensburg, Germany; and  
Universität Tübingen, Tübingen, Germany.--

Signed and Sealed this  
First Day of September, 2015

Michelle K. Lee  
*Director of the United States Patent and Trademark Office*